United States Patent
Walker

(10) Patent No.: US 12,544,685 B2
(45) Date of Patent: Feb. 10, 2026

(54) MOLTEN EUTECTIC SALTS THERMAL ENERGY STORAGE (MESTES) SYSTEM

(71) Applicant: John D. Walker, Socorro, NM (US)

(72) Inventor: John D. Walker, Socorro, NM (US)

( * ) Notice: Subject to any disclaimer, the term of this patent is extended or adjusted under 35 U.S.C. 154(b) by 623 days.

(21) Appl. No.: 16/951,435

(22) Filed: Nov. 18, 2020

(65) Prior Publication Data
US 2021/0260497 A1  Aug. 26, 2021

Related U.S. Application Data

(62) Division of application No. 16/272,768, filed on Feb. 11, 2019, now Pat. No. 10,987,609.

(60) Provisional application No. 62/629,087, filed on Feb. 11, 2018.

(51) Int. Cl.
C02F 1/14 (2023.01)
B01D 1/00 (2006.01)
(Continued)

(52) U.S. Cl.
CPC ............ *B01D 3/065* (2013.01); *B01D 1/0035* (2013.01); *C02F 1/14* (2013.01); *F03G 6/065* (2013.01); *F03G 6/071* (2021.08); *F03G 6/114* (2021.08); *F04C 2/18* (2013.01); *F24S 10/70* (2018.05); *F24S 20/00* (2018.05); *F24S 23/31* (2018.05); *F24S 23/74* (2018.05); *F24S 23/77* (2018.05); *F24S 23/79* (2018.05); *F24S 25/00* (2018.05); *F24S 30/425* (2018.05); *F24S 70/16* (2018.05); *F28D 20/00* (2013.01); *H02S 20/32* (2014.12); *H02S 40/22* (2014.12); *H02S 40/44* (2014.12);
(Continued)

(58) Field of Classification Search
CPC ......... B01D 1/0035; B01D 3/065; C02F 1/14; F03G 6/065; F03G 6/071; F03G 6/108; F03G 6/111; F03G 6/114; F03G 6/117
See application file for complete search history.

(56) References Cited

U.S. PATENT DOCUMENTS 2,933,885 A  *  4/1960  Vago ........................ F01K 3/00
                                                         126/646
4,200,148 A  *  4/1980  Friefeld ................ F28D 20/021
                                                          60/659
(Continued)

FOREIGN PATENT DOCUMENTS

AT                510279 A4  *  3/2012  ........... B01D 1/0035

OTHER PUBLICATIONS

PE2E translation of AT 510279 A4.*

*Primary Examiner* — Jonathan Luke Pilcher
(74) *Attorney, Agent, or Firm* — Scott D. Swanson; Shaver & Swanson

(57) ABSTRACT

The various embodiments described herein include devices and systems for thermal energy storage. A single-temperature-thermal-energy storage (SITTES) system for desalinating seawater and/or producing electrical power is described. The SITTES system includes insulated tanks, a molten eutectic salt media arranged within the insulated tanks, heat exchangers arranged within the insulated tanks, and an outlet. In the SITTES system the heat exchangers are coupled to one another and configured to transfer heat between the salt media and a seawater media, and the outlet is configured to output a steam portion of the seawater media, thereby providing desalination of the portion of the seawater media and steam for electrical power generation.

20 Claims, 21 Drawing Sheets

(51) Int. Cl.
*B01D 3/06* (2006.01)
*F03G 6/00* (2006.01)
*F03G 6/06* (2006.01)
*F04C 2/18* (2006.01)
*F24S 10/70* (2018.01)
*F24S 20/00* (2018.01)
*F24S 23/30* (2018.01)
*F24S 23/74* (2018.01)
*F24S 23/77* (2018.01)
*F24S 23/79* (2018.01)
*F24S 25/00* (2018.01)
*F24S 30/425* (2018.01)
*F24S 70/16* (2018.01)
*F28D 20/00* (2006.01)
*H02S 20/32* (2014.01)
*H02S 40/22* (2014.01)
*H02S 40/44* (2014.01)
*C02F 103/08* (2006.01)
*F24S 60/30* (2018.01)

(52) U.S. Cl.
CPC ............ *C02F 2103/08* (2013.01); *F24S 60/30* (2018.05); *F28D 2020/0047* (2013.01); *F28D 2020/0078* (2013.01); *F28D 2020/0082* (2013.01)

(56) References Cited

U.S. PATENT DOCUMENTS

| | | | | |
|---|---|---|---|---|
| 4,524,756 A * | 6/1985 | Laverman | ............ | F28D 20/0056 126/400 |
| 7,296,410 B2 * | 11/2007 | Litwin | ............ | F03G 6/065 60/641.15 |
| 7,726,127 B2 * | 6/2010 | Litwin | ............ | F24S 90/00 60/641.11 |
| 8,246,787 B2 * | 8/2012 | Cap | ............ | B01D 61/04 203/DIG. 1 |
| 9,702,541 B2 * | 7/2017 | Shinozaki | ............ | F01K 3/002 |
| 9,816,491 B2 * | 11/2017 | Perry | ............ | F03G 6/005 |
| 10,053,374 B2 * | 8/2018 | Li | ............ | B01D 3/146 |
| 10,532,936 B2 * | 1/2020 | Al-Azazmeh | ............ | B01D 5/006 |
| 2008/0289793 A1 * | 11/2008 | Geiken | ............ | F24S 80/20 165/10 |
| 2011/0017196 A1 * | 1/2011 | Bell | ............ | F24H 1/208 126/400 |
| 2011/0048921 A1 * | 3/2011 | Cap | ............ | F22B 1/006 202/180 |
| 2012/0255300 A1 * | 10/2012 | Birnbaum | ............ | F03G 6/065 60/641.8 |
| 2013/0052072 A1 * | 2/2013 | Smith | ............ | F01C 1/16 418/201.1 |
| 2013/0081394 A1 * | 4/2013 | Perry | ............ | F22B 1/028 126/610 |
| 2013/0307273 A1 * | 11/2013 | Afremov | ............ | F03G 6/02 290/52 |
| 2014/0060771 A1 * | 3/2014 | Bell | ............ | B21D 53/02 126/400 |
| 2014/0290247 A1 * | 10/2014 | Mishima | ............ | F03G 6/067 60/641.9 |
| 2015/0144304 A1 * | 5/2015 | Schneider | ............ | B22D 41/01 165/104.17 |
| 2015/0251924 A1 * | 9/2015 | Li | ............ | B01D 3/146 203/10 |
| 2016/0195340 A1 * | 7/2016 | Bissell | ............ | F28D 20/021 165/10 |
| 2017/0038156 A1 * | 2/2017 | Tenzek | ............ | F28D 20/0034 |
| 2019/0161366 A1 * | 5/2019 | Al-Azazmeh | ............ | B01D 3/007 |

* cited by examiner

MOLTEN EUTECTIC SALTS THERMAL ENERGY STORAGE (MESTES) SYSTEM

CROSS REFERENCE TO RELATED APPLICATIONS

This application is a divisional of U.S. application Ser. No. 16/272,768, filed Feb. 11, 2019, entitled "Polar-Linear-Fresnel-Concentrating Solar-Thermal Power and Desalination Plant," which claims priority to U.S. Provisional Application Ser. No. 62/629,087, filed Feb. 11, 2018, entitled "Polar-Linear-Fresnel-Concentrating-Solar-Thermal Power and Desalination Plant", which is hereby incorporated by reference in its entirety.

TECHNICAL FIELD

This relates generally to systems of concentrating solar-power and desalinating seawater, including but not limited to, a thermal-energy-storage system having a single-temperature molten eutectic-salts media as battery composition.

PRIOR ART

Despite advances in concentrated solar power systems, the application of heat to convert water to steam, thence electric power, falls primarily within three categories: The Power-Tower system, the Parabolic-Trough Concentrator, and the Linear Fresnel system. Since the latter two systems are in concept similar to each-other, comparison of attributes of the Power-Tower to the PLFC invention is not further explored here.

The Parabolic-Trough system, having a geometric concentration ratio (CRg) range to 100:1 or higher, is a linear, single-rotation-axis assembly, which cross-sectional curve when extended on either an east-west or north-south axis from 0 m up to "infinity" is a parabolic-cylinder, at which focal plane-axis, and secured in parallel manner at same focal plane-axis is a singular central linear receiving tube, through which a working fluid is pumped; gaining thermal energy as said working-fluid flows through conduit towards a heat-exchanger plant and power block at the far-end of the parabolic trough system. An advantage of a Parabolic-Trough system is the physical coupling of the linear receiving tube to the primary mirror assembly (said Parabolic-Trough), negating the requirement of a secondary concentrator in said system. Furthermore the entire unit is rotated as one element; therefore the mechanics and software in tracking the sun's position through a solar collection cycle is simplified. In most applications the working-fluid utilized for heat transfer through system is a high-grade organic lubricant, which properties include resistance to physical alteration or decomposition at wide-temperature ranges of several hundred degrees. Said working fluid is introduced by pumps into the receiving tube through a flexible end-tube which properties of high-strength, high-temperature resistance, allow said end-tube to flex and bend during the day, during which the height and orientation angles of the linear receiving tube are continually changing with the sun's position. As working fluid is pumped into the receiving tube, the infrared radiation concentrated at the receiver causes the temperature within the conduit to heat up rapidly, wherein typical CRg is at, or approximate to 100:1 at noon, the working temperature of the organic fluid within reaches up to 600° C. at the far end of the trough-axis, where after passing through a similar flexible end-tube and thence into a heat-exchanger plant wherein a secondary fluid: filtered, clean freshwater is pumped through the core elements and which thermal energy transfer to the water to undergo phase change at saturation temperatures to a dry steam, up to point of critical temperature of water at 374° C., which being working media at the power-block, turning one or more turbines at high rotation velocity, which coupled to rotating shafts turn one or several generators to produce electric power. The Parabolic-trough-system, is closed-system; designed to recycle this water utilized as dry steam by the turbines in the power block; accordingly, condensers and cooling tower are critical infrastructure in the system-process to recover/reuse this secondary-working fluid.

Several features of the Parabolic-Trough system are problematic for a CSP design serving bi-functions of generating electric power and seawater desalination: (1) the use of a heat exchangers adds another 'loop' into the process, which is better suited to those facilities where virtually all the water used is recycled (as applicable in inland deserts lacking nearby substantial groundwater, geothermal, or seawater sources); (2) relatively small diameter of the linear absorbers, in a collection-field of hundreds of individual linear concentrators present unaddressed design-issues wherein direct-injection of seawater into system, thereby bypassing the heat-exchanger process, due to scale-deposition throughout collection-field plumbing-infrastructure; (3) mechanical assemblage of the parabolic primary and flexible plumbing to the linear absorber tube through which the oil media is pumped is of concern: numerous "widget-arms", linkages, and the flexible tubing connectors through which the oil media flows itself, may be compromised over extended periods under variable pressures in the system; a failure of such may pose some environmental issues.

Linear-Fresnel-Systems of today typically fall into two conventional categories, both of which are single-axis, and which CRg typically range from 30:1 to 60:1. The first category of design, as prescribed by Solarmundo and other planners in Spain and North Africa, is a raised system of one or- more horizontal structures of parallel sets of flat or slightly-curved, long-rectangular mirror elements assembled atop of single-axis rotation framework which orientation is north-south, and which said rows/mirror elements track the sun from east to west and in accordance to row position reflect incidental beam irradiance to one or more centrally-located multi-element tower structures, upon which a parallel inverted, secondary linear-trapezoidal or linear-parabolic-cylinder concentrator within-which focal-plane is a singular or multiple linear receiver tube, and through which said receiver tube(s), water (Media), pumped from a nearby ground-water-source or reservoir, is forced, and as flowing therein under pressure through said receiver-tube(s) this concentration of infrared radiation directed upon said receiver tube(s), typically raises the temperature at focal plane of said central-receiving tubes to >500 C, at mid-day, and wherein temperatures of said water Media pumped are raised accordingly to ranges of in excess of 150° C. to over 350° C. This provides a dry saturated water vapor under pressures of up to 8 MPa, or greater, to rotate turbines, and coupled by one or more rotating-shafts to a single, or a plurality of generators, produce electric power.

A second Fresnel-System type is the Compact-Linear-Fresnel Reflector (CLFR), of Polar-design, or site-latitude-based system. Mills and Morrison (1991), describe the advantages of constructing inclined linear Fresnel reflector arrays at site-latitude over horizontally installed systems, illustrating that in model tests over four locations in Australia ranging from 23° S to 35° S, the average annual delivered thermal energy per sq. meter ranged from 9.65

MJ/m^2 d to 11.3 MJ/m^2 d, for 48-element (mirror) and 24-element inclined arrays, an increase in performance of about 20% over their similar-dimensioned horizontal counterparts. On this basis these inventors designed an inclined polar array whereby the mirror elements (up to 48 per linear receiver) are attached to the aperture frame in a north-south orientation, whereby the tracking of the sun, as in the aforementioned horizontal-array-designs runs from east to west (FIG. 1). Their polar design of the Compact Linear Fresnel Reflector, CLFR™ is a closed system, designed to recycle scarce freshwater resources in arid or semiarid regions; thence is augmented with a cogeneration source of conventional fossil fuel or renewable power source Several features of both of these systems have unaddressed design-issues in serving either singular power-plant, or bi-functions of generating electric power and seawater desalination: (1) alternating mirror directions (FIG. 1) over middle-third of the aperture rack set-width, are mechanically more elaborate than a set of singular-rotation-direction primaries which basis is isosceles geometry; (2) tight packing of cells in the remainder of the array causes interference, thence lost energy recovery, due to mutual shading/blocking of adjacent mirrors at low solar incidence angles; (3) distance ratio of outlying cells with respect to those nearest to central secondary absorber-tube-assembly is typically >3:1, and invariably leads to increased "leakage" (lost infrared energy recovery), or "ray-scatter", due to optical flaws inherent in all such mass-produced mirror elements, and normal stresses associated with the mirror assemblies, which vary widely under natural daily temperature fluctuations; (4) the vertical and horizontal 'Dewar™' evacuated receiver-tube system in the polar-CLFR™ linear absorber is too elaborate for a combined-system, which primary function of seawater distillation, is incompatible due to potential scale buildup in the CLFR plumbing; (5) stationary reflector on North-side (N. hemisphere) of polar-CLFR array-sets cause blockage, thence lost-recovery of, quantifiable amounts of incident solar flux during summer solar cycles (FIG. 1), during early am/or late pm hours; (6) plumbing of the source-water feed loop into/through the CLFR is complicated, (aside from item (4)) in that there are minimum of two 90°-angle turns in the linear absorber tubes assembly for every polar-array-set installed, presenting unnecessary head-losses due to friction and minor losses in the conduits- and connections, respectively; (7) a system-in-common to many secondary concentrator assemblies in similar Fresnel plants, world-wide, is an assemblage of a "trapezoidal-box" of three or more glass mirror-planes which cross-section conforms roughly to a parabolic curve; the whole assembly effectively is enclosed under a cover glass pane to optimize absorptance of I.R radiation, directed to one, or plurality of absorber-tubes within. This design, whilst the least costly in capital is performance-limited, in comparison to a Cassegrain-like optical solution, which more effectively concentrate the reflected line-focused solar rays from the primary mirror elements to intended spatial-position of the linear absorber tube within the secondary mirror assembly.

BACKGROUND

In the arid and semi-arid regions of the Developed-World, and Third-World nations, lack of sustainable energy programs and potable water resources for human consumption and agricultural sustenance is at a critical state, which consequences affecting human health, agriculture production, economic independence, wildlife habitats, and political stability, are a major detriment to survival of economically stable, and natural-resource-poor nations, and respective infrastructures therein. In fact, the lack of, and access to, fresh water safe for human consumptions is the leading cause of famine and conflict in today's world. These situations are entirely preventable, as is presented and discussed in these essays. A sustainable energy plan based on combining, and harnessing of the vast potential of hydropower from Earth's oceans and seas, as well as the power of the sun, combined with the utilization of conventional and other renewable energy sources, form the core arguments for these inventions.

In two widely-separated geographic regions of interest, selected on the premises of commonality of: latitude on earth, arid- and semi-arid vegetation zones, similar topographies, proximity to a nearby ocean/sea, or gulf, and a substantial natural sink below sea-level, and regional conflicts and social instability, the author presents sustainable solutions using current technologies, in the energy and water resources sector, to avoid conflict and promote economic growth, habitat and wildlife restoration, and social stability faced in the Middle East (Levant Nations) and Southwest United States-Northern Mexico. The basis for these investigations are preceding studies compiled by same author entitled MEECAPP Part 1 (Middle-East-Economic-Cooperative-Action-Plan-(for)-Peace 1: (Levant) and MEECAPP Part 2 (Macro-Energy-(and)-Economic-Cooperative-Action-Plan-(for)-Peace 2: (USA-Mexico). Resulting from, and in combination with these initial two studies, the author undertakes a plan: MEECAPP Part 3: A Polar-Linear Fresnel Concentrating Solar-Thermal Power and Desalination Plant, which attributes of seawater-based-hydropower-systems combined with solar energy are examined, and which consequences are applicable to scores of nations world-wide, or regions with similar climates, and geography.

In MEECAPP Part 1 and MEECAPP Part 2, gravity-flow and pumped-storage hydropower by utilizing seawater media, wherein engineering of and boring of large-diameter tunnels through which said media is pumped from nearby ocean to "battery-storage" in coastal ranges, wherein large pumped-storage-capacity-(PSH) reservoirs, constructed for the function of electric power production during peak-demand cycles, are analyzed as a means of providing clean, safe energy and facilitate agricultural/mariculture development in the Middle East (Israel, Jordan, Egypt, the Free Palestinian State, Lebanon, Syria), and in Southern California to Baja, Mexico (Salton Sea and Laguna Salada), respectively, and restore wildlife habitat in the respective regions. In the final 'equation' of gravity-fed or pumped-storage hydropower, yet another problem needs to be addressed: how to apply the surplus potential energy from the reservoirs that will invariably be in place due to known quantities (expected weather patterns, mechanical availability, off-peak power demands) and unplanned events (weather extremes, labor strikes, regional political issues, major mechanical rebuilds, powerline or waterline repairs, etc.).

The principle innovation is a 'once-through" Polar Fresnel Linear Concentrating (PLFC) solar-thermal power plant that is designed to generate electric power and provide energy to desalinate seawater. The PLFC concept initially conceived is an auxiliary power/desalination plant operating at arid localities below sea level; the Arava & Dead Sea (0 m to −400 m MSL) whereby seawater from the Mediterranean and associated storage capacity dams in the Arava, are gravity-fed and/or pumped into solar-thermal plants, thereby augmenting hydropower production whilst producing freshwater by multi-effect-distillation (MED) method.

BRIEF SUMMARY OF THE INVENTIONS

Accordingly, there is a need for concentrated solar power plants which use the most readily available liquid media on this planet (e.g. seawater) in a once-through system, where dry or wet steam is the working media at the power-block; eliminating the utilization of heat exchangers in the Rankine-Steam-Cycle process at said power-block. Such systems, when combined with a one- or two stage rotary expander, similar in design to invention of same by Richard Langson, are robust in comparison to conventional turbine-engines which are subject to destruction in a variable dry-wet-steam system, wherein water-droplets in the steam cause severe damage by impact of said water-droplets, to turbine-blade assemblies rotating at typically, 14,000 rpm.

FIG. 3A is a flow-diagram-schematic illustrating a regional power-plan utilizing pumped-storage-hydropower (PSH) from a nearby sea or ocean, integrated with alternative cogeneration systems, including concentrated solar power (CSP), geothermal power, and conventional fossil-fuels, biomass, and nuclear power; whereby waste heat from said systems and molten-salts battery-storage of thermal energy, are further utilized independently or in combination, wherein functions of both electric-power and fresh water are produced 24/7.

Additionally, the waste heat from the recycle-loop in a seawater-media-driven design is recovered for further functions: a low-medium thermal-energy Organic-Rankine-Cycle (ORC) plant; a make-up water storage-tank for input-media into a Multi-Effect-Distillation (MED) plant (FIG. 4A), including conduits for flow-path of said lower-temperature media through a Single-Temperature-Thermal-Energy-Storage-System (SITTES) (FIG. 5).

The Polar-Linear-Fresnel-Concentrator (PLFC) solar plant described in FIGS. 2A, 2B, 2C, 2D, 2E, 2F, 2G, and 2H is a once-through System, designed to move as much seawater per Standard Unit Area (1 SUA=1 km^2) as feasible under site-dependent seasonal/weather-dependent conditions and accordingly, generate electric power and produce distilled water, and like the polar CLFR™ by Mills & Morrison (FIG. 1) is a single axis polar assembly. Unlike the CLFR™, the PLFC primary cell rows are aligned on an east-west axis, whereby during the N. Hemisphere winter, the mirror cells arranged on said rows are rotated independently in accordance to row-position by mechanical actuators in a S-N direction such that the winter sun's position is tracked as it rises in the southeast at sunrise to its 12:00 noon zenith angle, then reversing direction at that point, as the sun is followed to sunset at the southwest horizon FIG. 2A. Likewise, during the northern hemisphere summer, the sun is tracked by the cells N-S from sunrise in the northeast to its noon zenith angle before reversing the direction of rotation in the afternoon, as it follows the solar position until sunset in the northwest; the net resultant effect throughout all four seasons being that solar beam irradiance is reflected precisely to a secondary singular hyperbolic-cylinder mirror-concentrator, which focuses the collected solar flux to concentration ratios of, but not limited to nominal-ranges of 30:1 to 60:1.

In the PLFC model described, the receiver tube is fixed in place, and consists of, but not limited-to, a single 198.5 mm (8-in nominal) ID pipe, or one or plurality of like or unlike-sized conduits secured within a hyperbolic-cylinder secondary receiver mirror assembly (FIGS. 6A, 6B, 6C), by limited restraining supports (rings or rollers), and assembled using bolts washers and nuts, form a virtually seamless assembly by identical external-flange-joint-couples (FJCX) in FIG. 7, wherein providing allowance for thermal expansion of the absorber tube of >5 m per 1000 m, without the encumbrances of bellows, elaborate thrust-blocks or expansion joints. By direct solar concentration the PLFC-heated seawater temperature ranges typically, but not limited to, 70° C.<T<300° C., and the straight-line nature of the assembly facilitates simple plumbing solutions therein (typically, four 90° elbow couples of radius: r=2d) per >1000 m-long array), accordingly reducing fluid head-losses due to friction, and minor losses incurred through plumbing-fittings respectively; resultant adverse consequences illustrated in inclined east-west tracking systems such as the polar-CLFR (FIG. 1). Moreover, the location of the receiver tube within a glass-covered and insulated secondary mirror housing, which cross-section-form being a hyperbolic-cylinder, mitigates much of the inevitable radiative heat losses associated with increasing temperatures.

As the principle working media of choice in The PLFC design is seawater, a natural consequence of this CSP is to desalinate said media by using waste heat from a number of alternative ("cogenerated power") sources, augmented with a Single-Temperature liquid-salt-battery for night-time thermal energy storage; herein referred to as a SITTES (FIG. 5). A most effective means to this end is a low-thermal-energy process called "Multi-Effect-Distillation" (MED) FIG. 4A, of which a described innovation herein is a Modified Multi-Effect-Distillation process: MEDX. (FIG. 4B).

BRIEF DESCRIPTION OF DRAWINGS

For better understanding the various described devices and methods, in concentrating solar energy to generate electrical power and desalinate seawater, reference should be made to the Detailed Description below, in conjunction with the following drawings and maps, in which same reference numbers, and their respective locations in text, refer to corresponding items throughout said figures and maps.

LIST OF FIGURES

Figure 1:
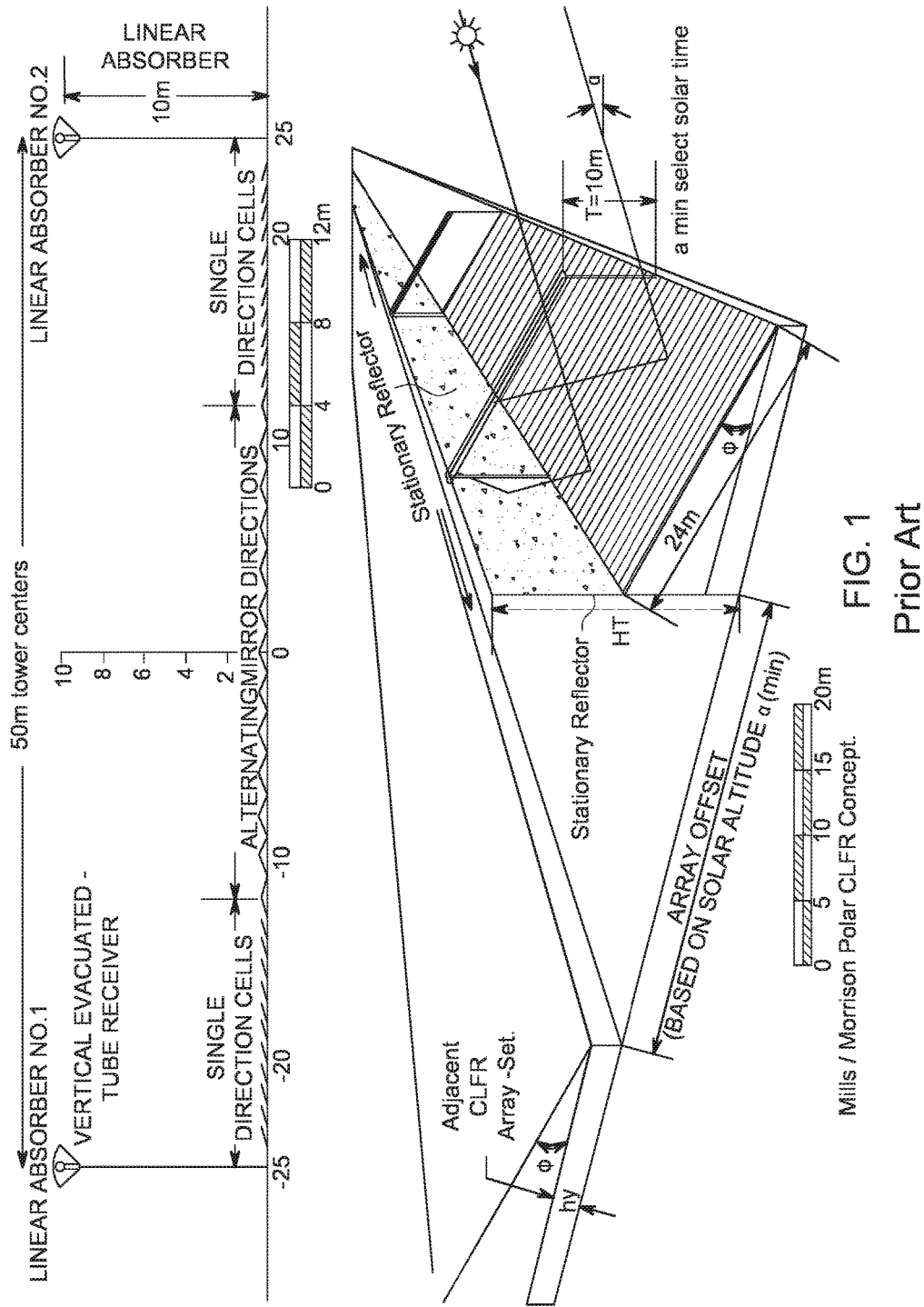

FIG. 1 is a conceptual drawing (this author's rendition) of a Compact Linear Fresnel Reflector system (CLFR) by Mills/Morrison; University of Sydney, NSW.

Figure 2A:
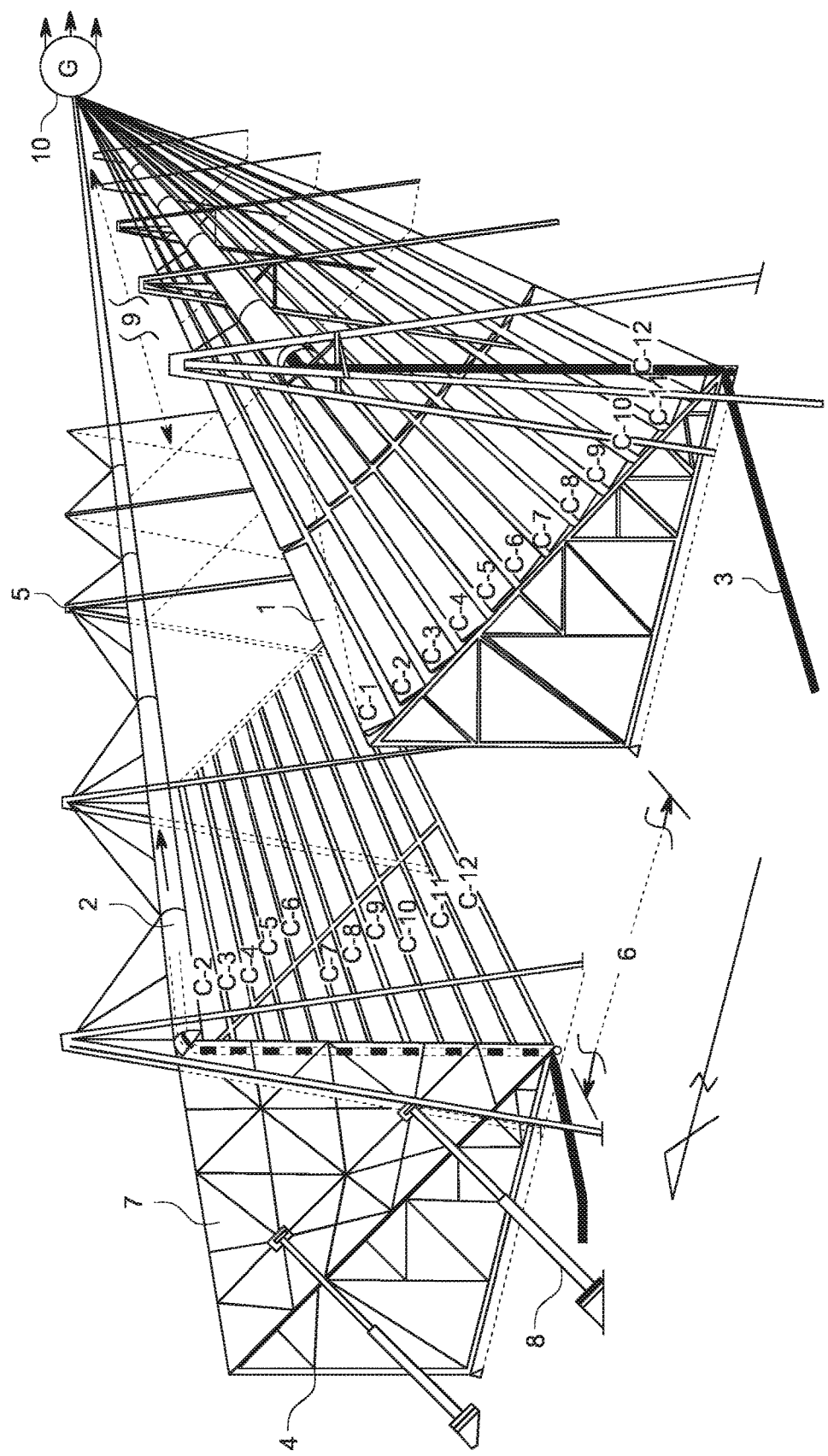

FIG. 2A is a conceptual drawing of a Polar-Linear-Fresnel-Concentrator, PLFC, reflector-system wherein embodiment shown is a 24 m-effective-aperture, array-assembly comprised of 12-rows-of rectangular primary reflectors; each of which dimensions are, but not limited to: 2 m in width by 15 m in length, at site latitude of: 33° N.

FIG. 2A: Polar Linear Fresnel Concentrator (PLFC) System Perspective View of PLFC System Detailing Two Adjacent Fresnel Solar Collectors

| Item | System/Function | Description |
| --- | --- | --- |
| 1 | Primary Mirror cell | Flat, slightly-curved, or optically-figured spherical-cylinder reflector |
| 2 | Secondary Concentrator assy. | Hyperbolic-cylinder concave reflector and back-shell |
| 3 | Seawater feed-line | Seawater feed, ambient temperature into Secondary Concentrator |

-continued

| Item | System/Function | Description |
|------|-----------------|-------------|
| 4 | Aperture-Rack structure | Truss assy.; inclination-angle to south at site latitude ($\varphi$) |
| 5 | Secondary-support structure | 'A'-Frame tower assy. with single (shown) or paired-tension cables |
| 6 | Array-Offset | Min. offset: primary collectors; avoid mutual shading by structures |
| 7 | End-of-Array Reflector (EARX) | Rotatable (E-W axis) optically-flat mirror (reverse-side shown) |
| 8 | Hydraulic Actuator | Hydraulic-cylinder(s) raise-lower EARX commensurate to am or pm |
| 9 | Expanded CSP Collector Field | Direction and attitude of primary-cell collectors shown to "infinity" |
| 10 | Power-Block (G) | Rotary-Expanders, generators, transformers & line-power to grid |

Figure 2B:
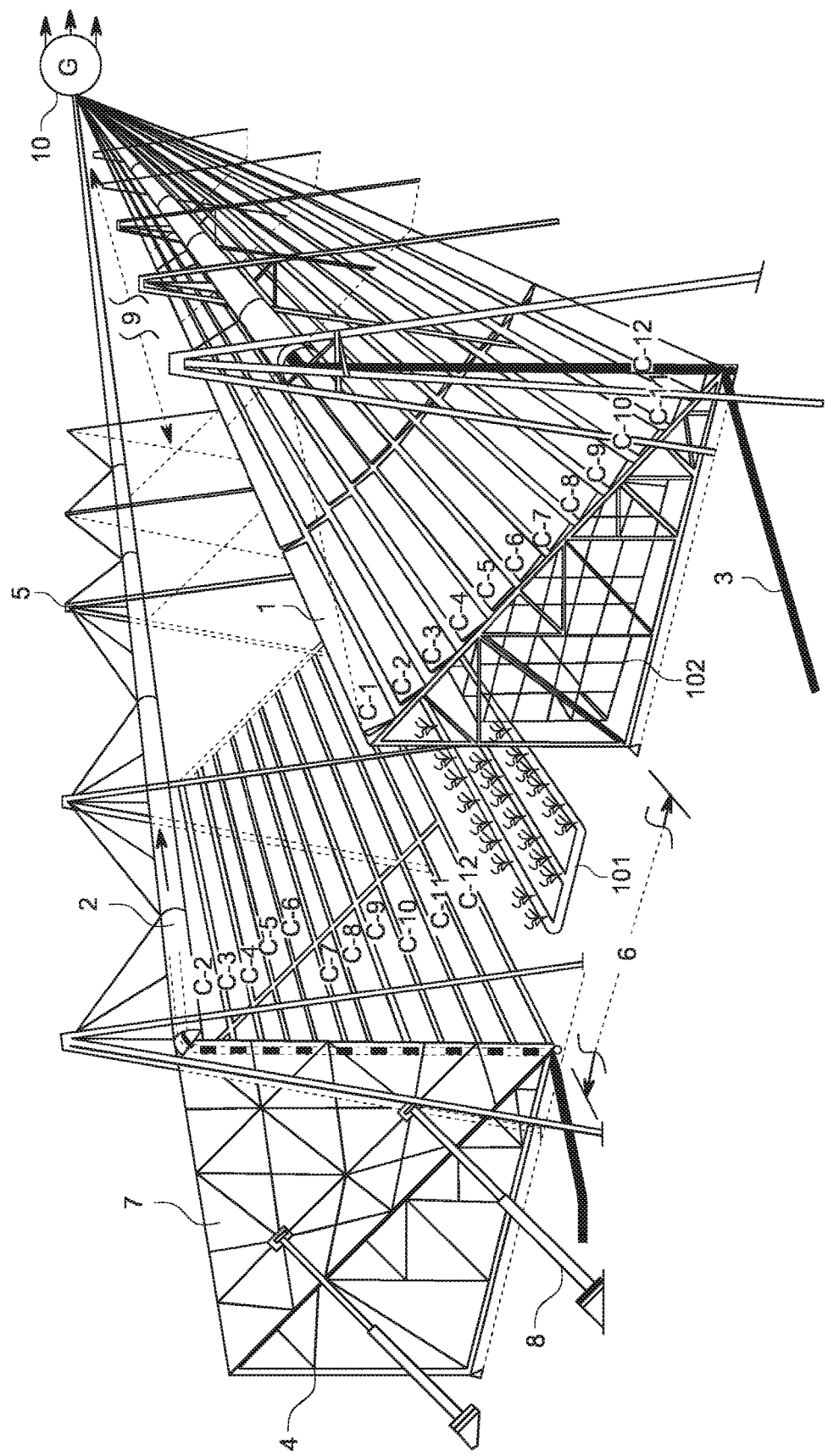

In both FIG. 2A and FIG. 2B, (left-hand-image) are shown embodiment of hydraulically-actuated End of Array optically-flat Reflector (EARX) attachment, in raised position wherein function is to collect reflected solar rays off the primary-array cells (mirrors) during a.m. hours, up to noon local time, at west end of the solar-collection primary cell array-structures, and concentrating said rays to secondary linear absorber tube, thence recover solar energy otherwise lost to space. Correspondingly, at east end of the solar-collection primary cell array-structures, is attached a same EARX device, which operation, being raised vertically or lowered horizontally, is equal to and opposite the west-end device, all being with respect to solar position east or west of noon local time.

FIG. 2B is a conceptual drawing of a PLFC-system, as reproduced from FIG. 2A, with high-density agriculture interface including vertical farms. Typical offset width for economic Ag.-zone: 60 m-100 m; depending on site latitude, and acceptable shade-factors from highest structural components (secondary concentrator/tube assy., towers, etc.). Agricultural infrastructure includes buffers (roads) for PLFC-array maintenance, and irrigation lines from MEDX plant FIG. 2B: PLFC with Plant Integrated High-Density Agriculture Interface Perspective View of PLFC System Comprised of Two Adjacent Fresnel Solar Collectors

| Item | System/Function | Description |
|------|-----------------|-------------|
| 1-10 | Elements (FIG. 2A) | Same as per FIG. 2A above |
| 101 | Inter-CSP-Field Ag.-Zone | High density perennial (i.e. fruit-trees) or annuals (vegetables) |
| 102 | Vertical Farm-Structures | Shelves & dividers: hydroponic-gardens, irrigation internal to (4) |

Figure 2C:
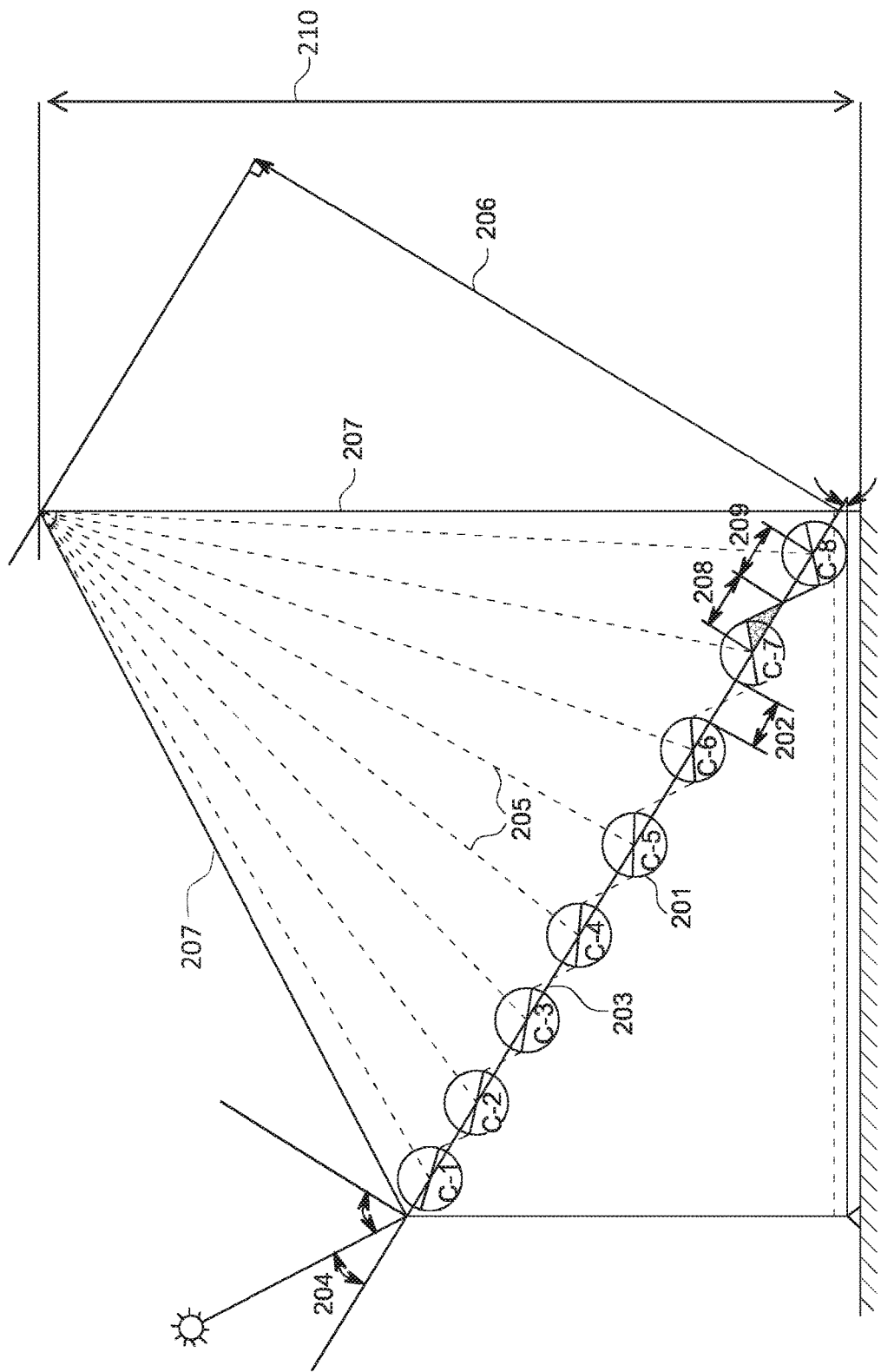
Figure 2D:
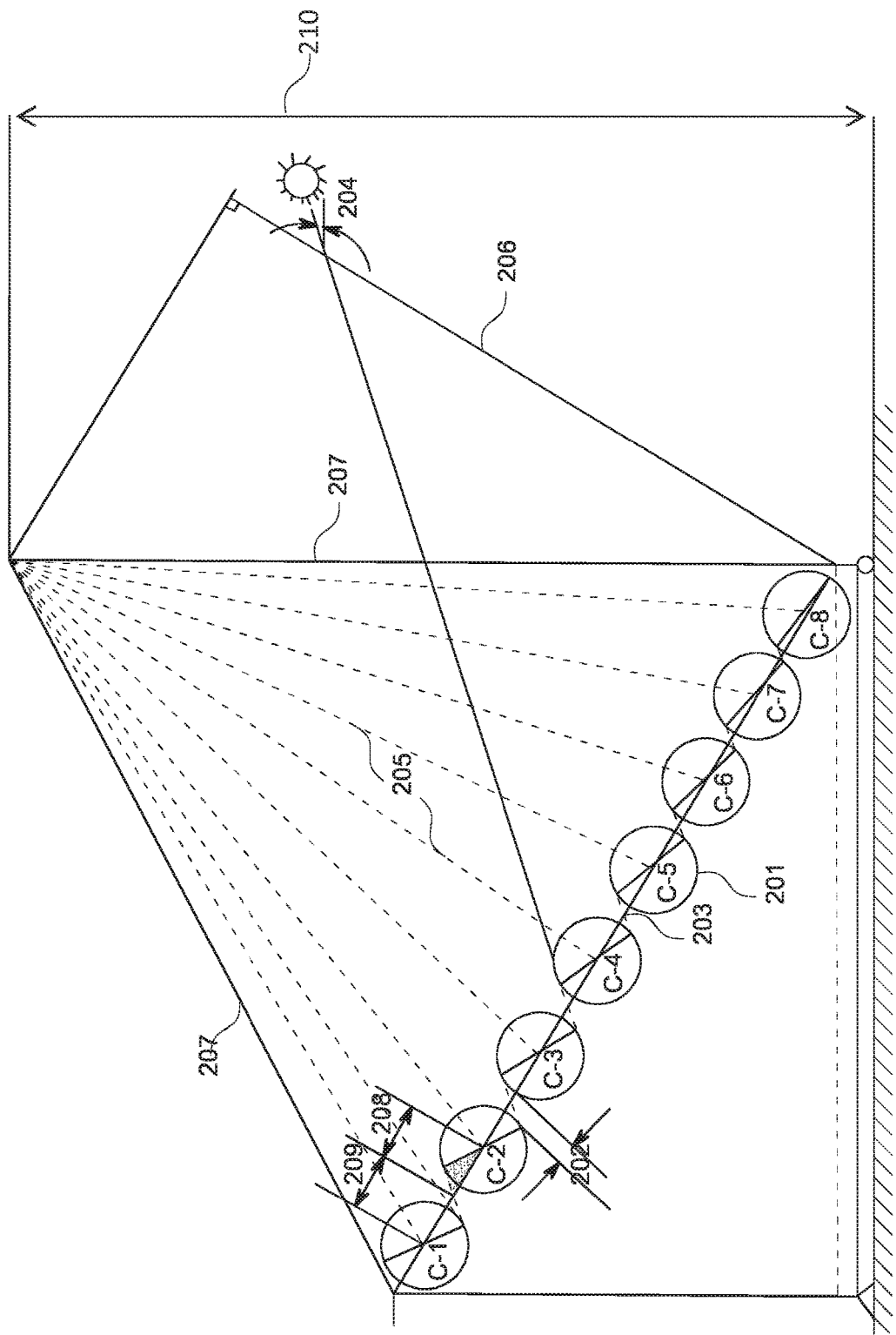

FIG. 2C and FIG. 2D are graphical cross-section representation-comparisons for a PLFC assembly, at site-latitude of 31.15° N, wherein embodiment shown is comprised of 8-rows×3 m-wide (or alternative dimension, by proportional reduction/expansion) cells, wherein final positions of each cell-row, are such that there is zero-mutual shading by said adjacent rows, is determined in accordance to summer solar-position data at 07:00 h, and corresponding winter solar-position-data at 08:00 h, respectively; illustrating effect of just one (1)-hour time difference on overall-dimensions of a hypothetical PLFC array-structure, separation of cell-rows, and height of secondary concentrator.

FIG. 2C: PLFC Summer-Justified Primary Cells Positions; Minimum Offsets; Zero Mutual Shading PLFC Primary Cells positions; 8 primary-mirror rows, 10-hour solar collection: $\varphi=31.15°$ N; TS=07:00 h (17:00 h)

| Item | Ref. | System/Function | Description |
|------|------|-----------------|-------------|
| 201 | C-5 | Primary-Cell I.D. | Primary flat or spherical mirror cell position in 8-Cell arrangement |
| 202 | gx | Primary Cell-offset | Minimum offset-gap; position basis summer justified alt angles |
| 203 | RA | Aperture-Rack plane | Position of inclined Primary-Cell structure at PLFC-site latitude $\varphi$ |
| 204 | $\rho Y: S$ | Solar altitude angle: summer | Summer angle of incidence $\Theta i$ (N-S ref.); min. economic. TS = 07:00 h |
| 205 | $\Theta r$ | Angle of reflectance: summer | Reflected solar ray-angles: C-1 to C-8 to C.L. linear Absorber tube |
| 206 | Hn | Tangent Normal | Min. dist.: Plane of RA to C.L. equiv. plane thru linear absorber tube |
| 207 | Hx. | EARX-outer Dim | Likely outermost dimension of End-of-Array Reflector EARX |
| 208 | S1 | Shade-length RA | Length of shadow cast on RA plane: (@ TS = 07:00 h shown) |
| 209 | S2 | Offset distance: Cell n + 1 | Min. offset on RA for (Cell-n + 1) position to avoid shading by (Cell-n) |
| 210 | T" | C.L. height linear absorber | Height of linear absorber tube from ground |

FIG. 2D: PLFC Winter-Justified Primary Cells Positions; Minimum Offsets; Zero Mutual Shading PLFC Primary Cells positions: 8-hour solar collection cycle from FIG. 2D: $\varphi=31.15°$ N; TS=08:00 h (16:00 h)

| Item | Ref. | System/Function | Description |
|---|---|---|---|
| 201 | C-5 | Primary-Cell I.D. | Primary flat or spherical mirror cell position in 8-Cell arrangement |
| 202 | gx | Primary Cell-offset | Minimum offset-gap; position basis winter-justified altitude angles |
| 203 | RA | Aperture-Rack plane | Position of inclined Primary-Cell structure at PLFC-site latitude $\varphi$ |
| 204 | $\rho$Y: W | Solar altitude angle: winter | Winter angle of incidence $\Theta i$ (N-S ref.); min. economic. TS = 08:00 h |
| 205 | $\Theta r$ | Angle of reflectance: winter | Reflected solar ray-angles: C-1 to C-8 to C.L. linear Absorber tube |
| 206 | Hn | Tangent Normal | Min. dist.: Plane of RA to C.L. equiv. plane thru linear absorber tube |
| 207 | Hx. | EARX-outer Dim | Likely outermost dimension of End-of-Array Reflector EARX |
| 208 | S1 | Shade-length RA | Length of shadow cast on RA plane: (@ TS = 08:00 h shown) |
| 209 | S2 | Offset distance: Cell n + 1 | Min. offset on RA for (Cell-n + 1) position to avoid shading by (Cell-n) |
| 210 | T" | C.L. height linear absorber | Height of linear absorber tube from ground |

Figure 2E:
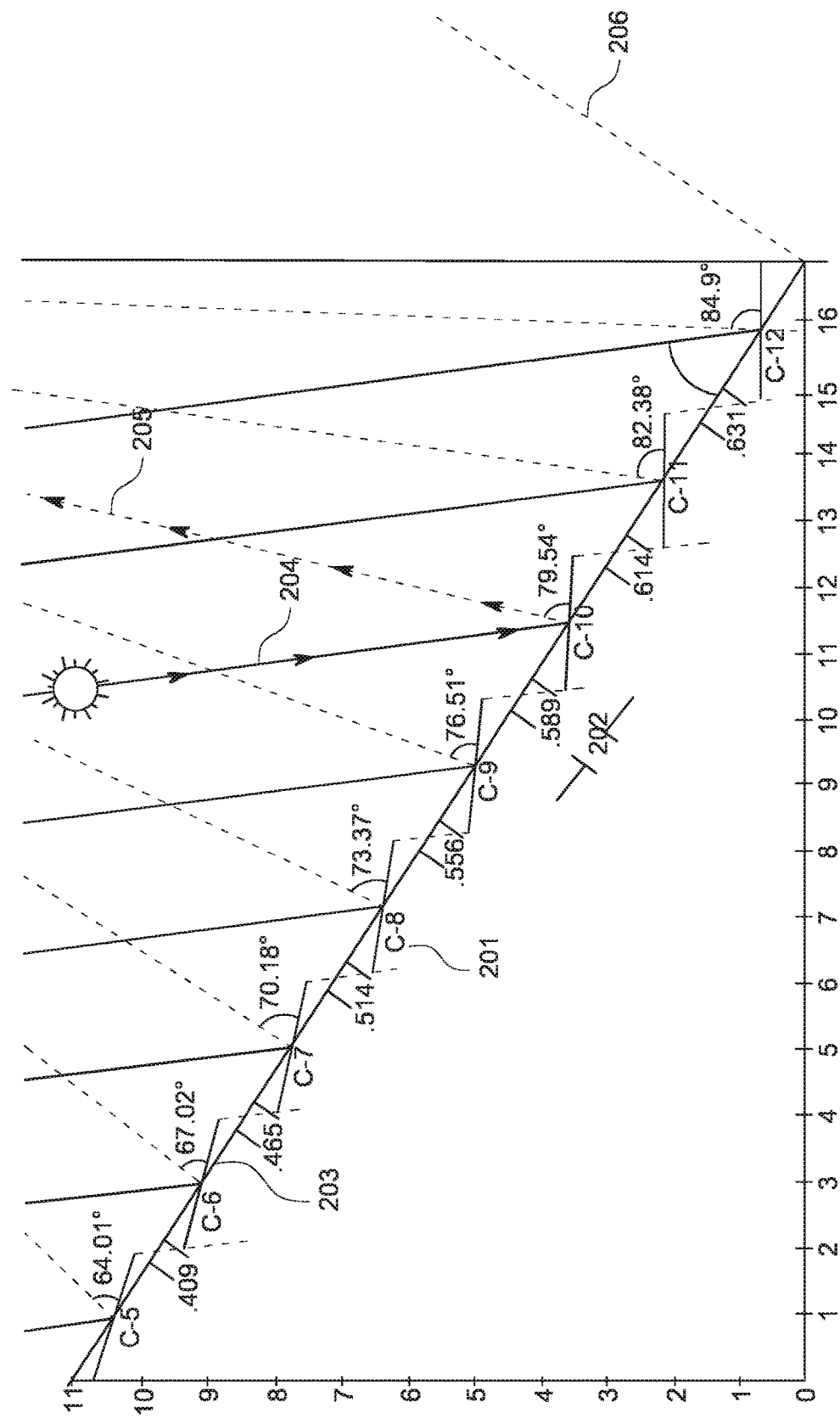
Figure 2F:
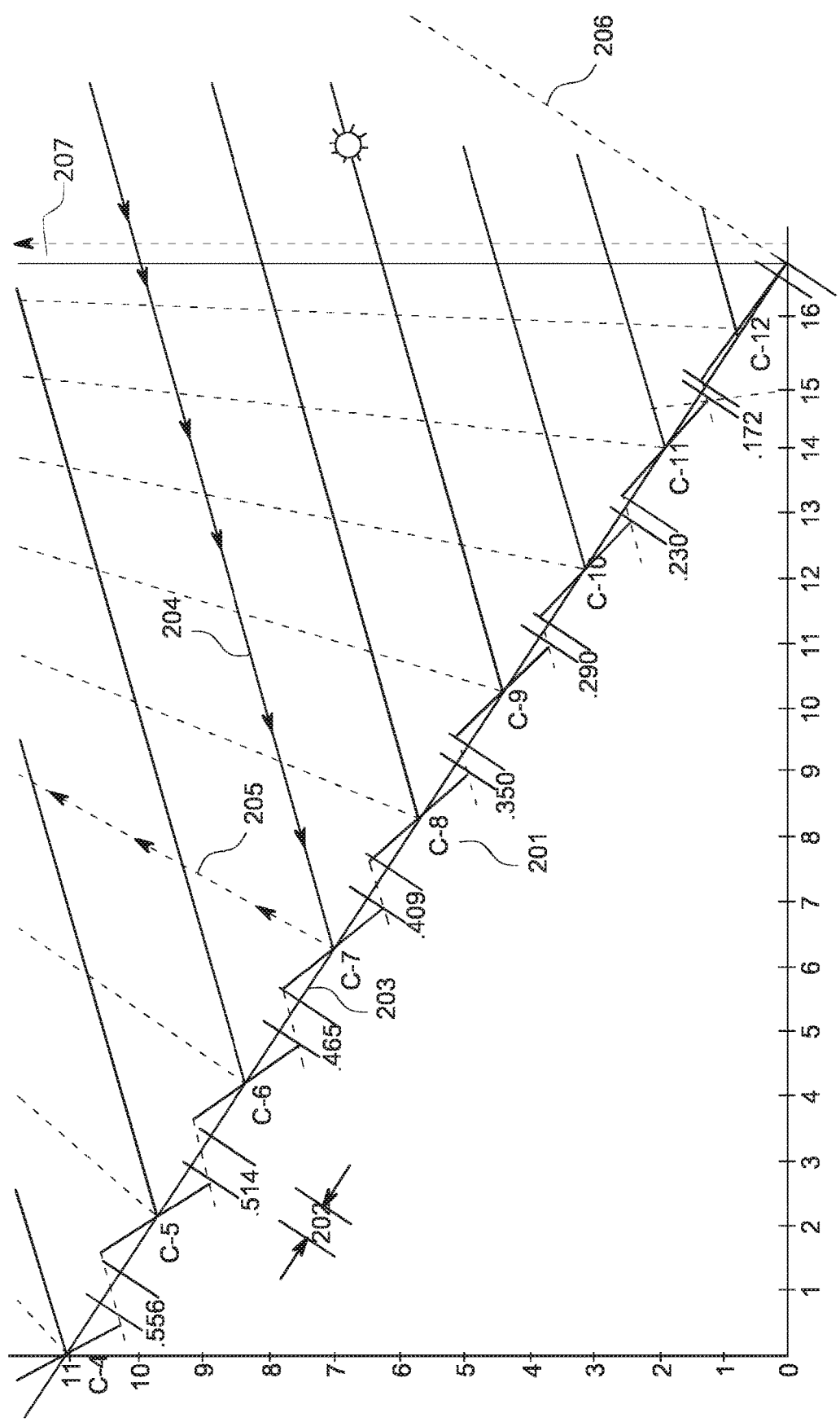

FIG. 2E and FIG. 2F are expanded cross-sections of lower 2/3 of a 12-row PLFC array-system, at site latitude of 33.20° N, showing the rotation angles for each primary cell based on common local solar-time of 08:00-hours during summer-solstice and corresponding solar time of 08:00 hours, winter-solstice, respectfully, such that beam solar irradiance is reflected by each mirror-cell towards center line of east-west axis of a secondary concentrator, and linear absorber tube within. Noting that incident solar rays are of equal and opposite angles during these solar-position extremes at equivalent hours during summer and winter solstices, and opposing tilt-angles therein, combining the two results becomes a merged assembly which resultant properties are utilized in construction of primary-array-structures wherein there is zero mutual shading/blocking by adjacent cells in said-array-structures throughout the year.

FIG. 2E: PLFC Summer-Justified Primary Cells Positions; Minimum Offsets; Zero Mutual Shading PLFC Primary Cells arrangement basis, lower-2/3 assy.: summer solstice assumed min. economic solar altitude angles

| Item | Ref. | System/Function | Description |
|---|---|---|---|
| 201 | 'C-8' | Primary-Cell I.D. | Primary flat or spherical mirror cell position in 12-Cell arrangement |
| 202 | gx | Primary Cell-offset | Minimum offset-gap; position basis summer justified alt angles |
| 203 | RA | Aperture-Rack plane | Position of inclined Primary-Cell structure at PLFC-site latitude $\varphi$ |
| 204 | $\rho$Y: S | Solar altitude angle: summer | Summer angle of incidence $\Theta i$ (N-S ref.); min. economic. TS = 08:00 h |
| 205 | $\Theta r$ | Angle of reflectance: summer | Reflected solar ray-angles: C-1 to C-12 to C.L. linear Absorber tube |
| 206 | Hn | Tangent Normal | Min. dist: Plane of RA to C.L. equiv. plane thru linear absorber tube |

FIG. 2F: PLFC Winter-Justified Primary Cells Positions; Minimum Offsets; Zero Mutual Shading PLFC Primary Cells arrangement basis, lower-2/3 assy.: winter solstice assumed min. economic solar altitude angles

| Item | Ref. | System/Function | Description |
|---|---|---|---|
| 201 | 'C-8' | Primary-Cell I.D. | Primary flat or spherical mirror cell position in 12-Cell arrangement |
| 202 | gx | Primary Cell-offset | Minimum offset-gap; position basis winter justified altitude angles |
| 203 | RA | Aperture-Rack plane | Position of inclined Primary-Cell structure at PLFC-site latitude $\varphi$ |
| 204 | $\rho$Y: S | Solar altitude angle: winter | Winter angle of incidence $\Theta i$ (N-S ref.); min. economic. TS = 08:00 h |

-continued

| Item | Ref. | System/Function | Description |
|---|---|---|---|
| 205 | Θr | Angle of reflectance: winter | Reflected solar ray-angles: C-1 to C-12 to C.L. linear Absorber tube |
| 206 | Hn | Tangent Normal | Min. dist: Plane of RA to C.L. equiv. plane thru linear absorber tube |

Figure 2G:
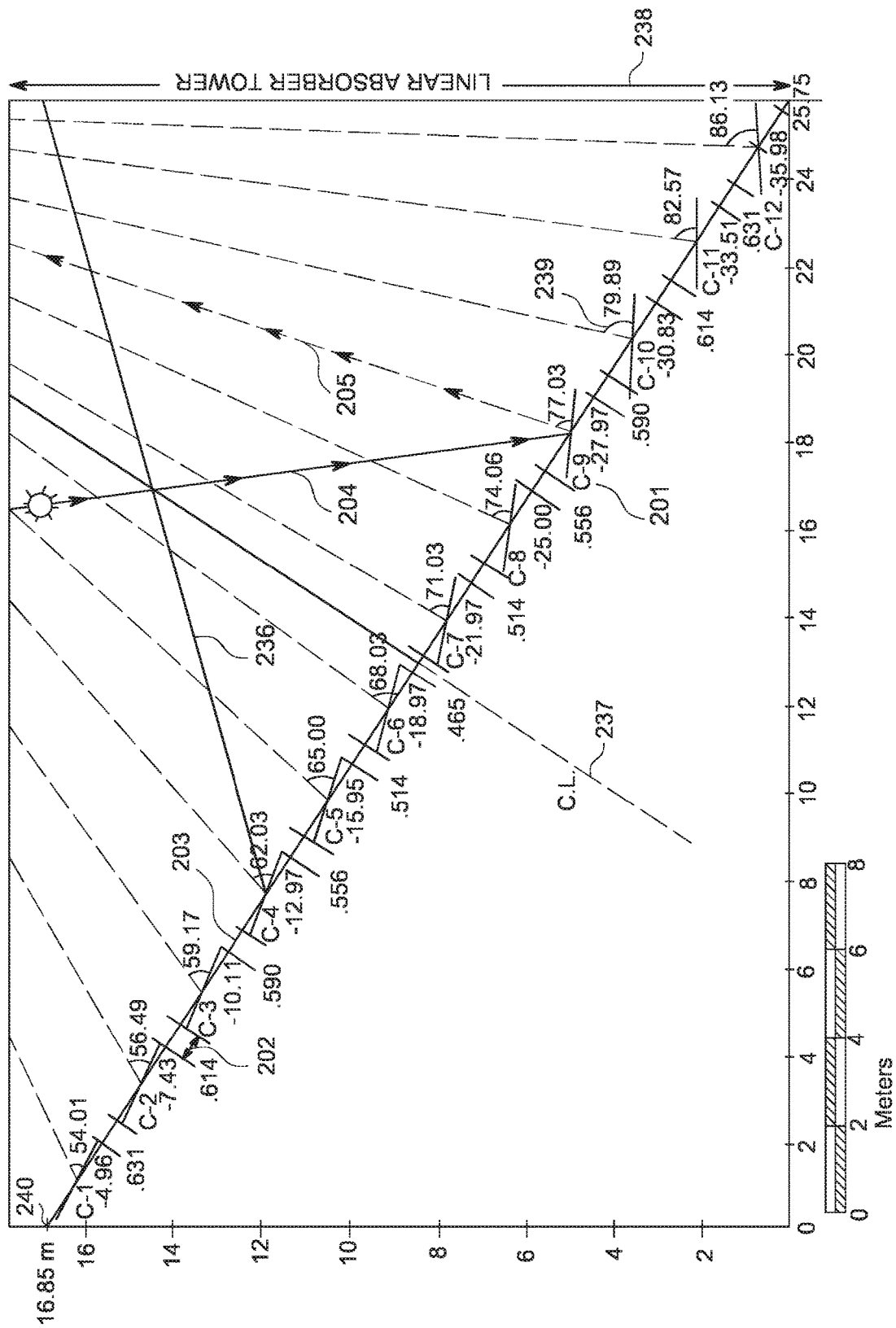

FIG. 2G is a merged Equatorial-Analogue assembly of a 24 m effective-aperture primary-cell arrangement defined by the summer and winter-solstice cell-positions based on common selected minimum solar-times of 08:00 (and 16:00-h), respectively, such that there is zero-mutual-shading or blocking by adjacent cells during any such 8-hour solar-collection-cycle, between said minimum-solar-times, during a full-calendar (365 days)/year. Cell tilt-angles shown in FIG. 2G are summer-solstice-justified.

FIG. 2G: PLFC Merged Primary Cells Assembly for Minimum Offsets; Zero Mutual Shading PLFC Primary Cells arrangement basis on winter and summer solstice minimum economic solar altitude angles

| Item | Ref. | System/Function | Description |
|---|---|---|---|
| 201 | 'C-9' | Primary-Cell I.D. | Primary flat or spherical mirror cell position in 12-Cell arrangement |
| 202 | gx | Primary Cell-offset | Min. offset-gap; complimentary summer and winter altitude angles |
| 203 | RA | Aperture-Rack plane | Position of inclined Primary-Cell structure at PLFC-site latitude φ |
| 204 | ρY: S | Solar altitude angle: summer | Summer angle of incidence Θi (N-S ref.); min. TS = 08:00 h (16:00 h) |
| 205 | Θr | Angle of reflectance: summer | Reflected solar ray-angles: C-1 to C-12 to C.L. linear Absorber tube |
| 236 | ρY: W | Equiv. Sol.alt. angle: winter | Winter (ref.) angle of incidence Θi (on equatorial-analogue plane) |
| 237 | C.L. | Centerline of PLFC structure | C.L.: primary Cells, Aperture Rack, and 2ndary Concentrator assy. |
| 238 | T''' | Tower structure | Approx. C.L. position of support-structure for 2ndary Conc. assy. |
| 239 | ΘrC | Reflectance angle; 08:00 h | Summer solar ray angle: cell center line to C.L. Linear absorber tube |
| 240 | OP | Aperture-Rack min. ht. | Min. height: aperture-rack overall structure at site latitude φ |

FIG. 2D (Item 7) show likely outer-dimensions of an EARX device in deployed-position, on an eight-primary-mirror-cell aperture rack system.

Figure 2H:
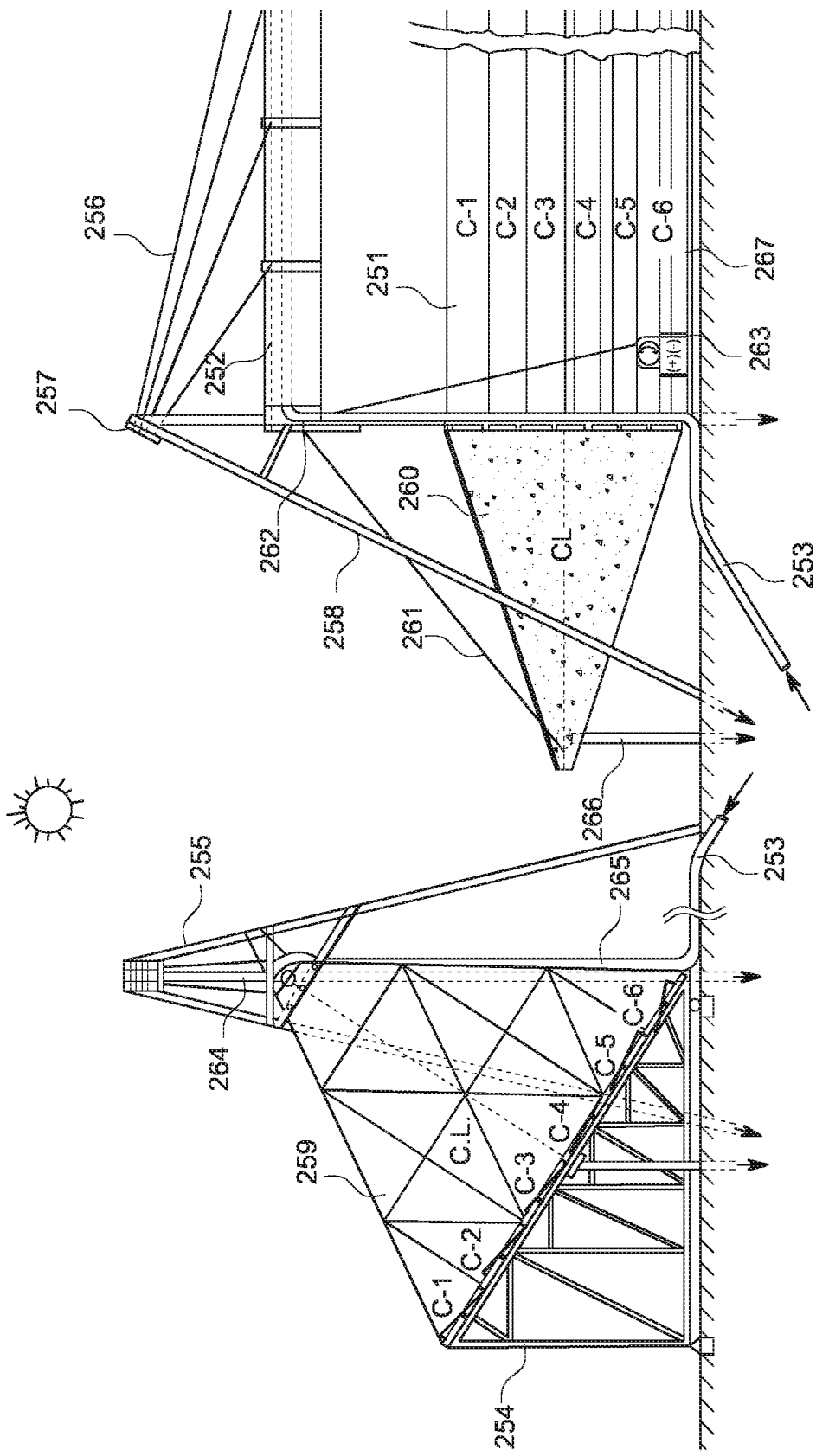

FIG. 2H is a an End of Array Reflector (EARX), concept device attached by hinges to end-frame of a polar-type linear-Fresnel reflector designed to collect incidental and reflected solar rays at east and western extremities of the solar-array primary-cell collectors attached to a PLFC-Array-System shown at profile and elevation-perspectives, utilizing an electric-motor-driven mechanical cable-type actuator (winch), wherein mechanical-leverage is of simple (illustrated-here) or compound-pulley-driven system; depending on nominal power requirement.

FIG. 2H

PLFC Primary Cells arrangement basis on winter and summer solstice minimum economic solar altitude angles

| Item | Ref. | System/Function | Description |
|---|---|---|---|
| 251 | 'C-1' | Primary-Cell I.D. | Primary flat or spherical mirror cell position in 6-Cell arrangement |
| 252 | 2C | Secondary Concentrator | Secondary mirror, back-shell and linear absorber tube assembly |
| 253 | SW1 | Seawater Feed Line | Inlet conduit: cold seawater-media to 2ndary Conc. & absorber tube |
| 254 | RA-Y | Aperture Rack: PLFC | PLFC structural primary-mirror frame. Of ht. OP; inclined at site lat. |
| 255 | T180 | End-tower-leg (S) | South-member of 4-element tower-support for 2ndary concentrator |
| 256 | CS | Tension-Cable | Paired cable-span 2ndary-concentrator supports; tower-center |

-continued

| Item | Ref. | System/Function | Description |
|---|---|---|---|
| 257 | EB | End-Block | End-plate fasteners; secure cable-end-loops by bolts and wire-nuts |
| 258 | T270 | End-tower-anchor (West) | End-anchor, 4-leg tower; secure to ground by bolts, wire, concrete |
| 259 | EARX | End-Array-Reflector (W) | Flat reflector-mirror: reverse-side shown; vertical position: a.m. hrs. |
| 260 | EARX | End of Array Reflector (W) | Flat reflector-mirror: face-side up; horizontal (neutral) position: p.m. |
| 261 | CW | Wire Cable | Rope of strength necessary to raise/lower EARX device by actuator |
| 262 | p1 | Hawsehole | Hole/idler bearings in upper-tower brace: feeds cable to actuator |
| 263 | (+−) | Actuator | Electric motor/winch: raise/lower EARX; location behind RA assy. |
| 264 | T-0 | Center-tower-leg | Center-vertical-member: tower assy.; brace for SW feed-vert. pipe |
| 265 | SW2 | Conduit riser | Transfer SW feed media: Y-m vertical height to linear absorber tube |
| 266 | p2 | Stationary Post | End-stop: position EARX-mirror in stowed (neutral) attitude |
| 267 | Rax | PLFC Frame-base; E-W | East-west PLFC frame-base at minimum ground clearance |

Figure 3A:
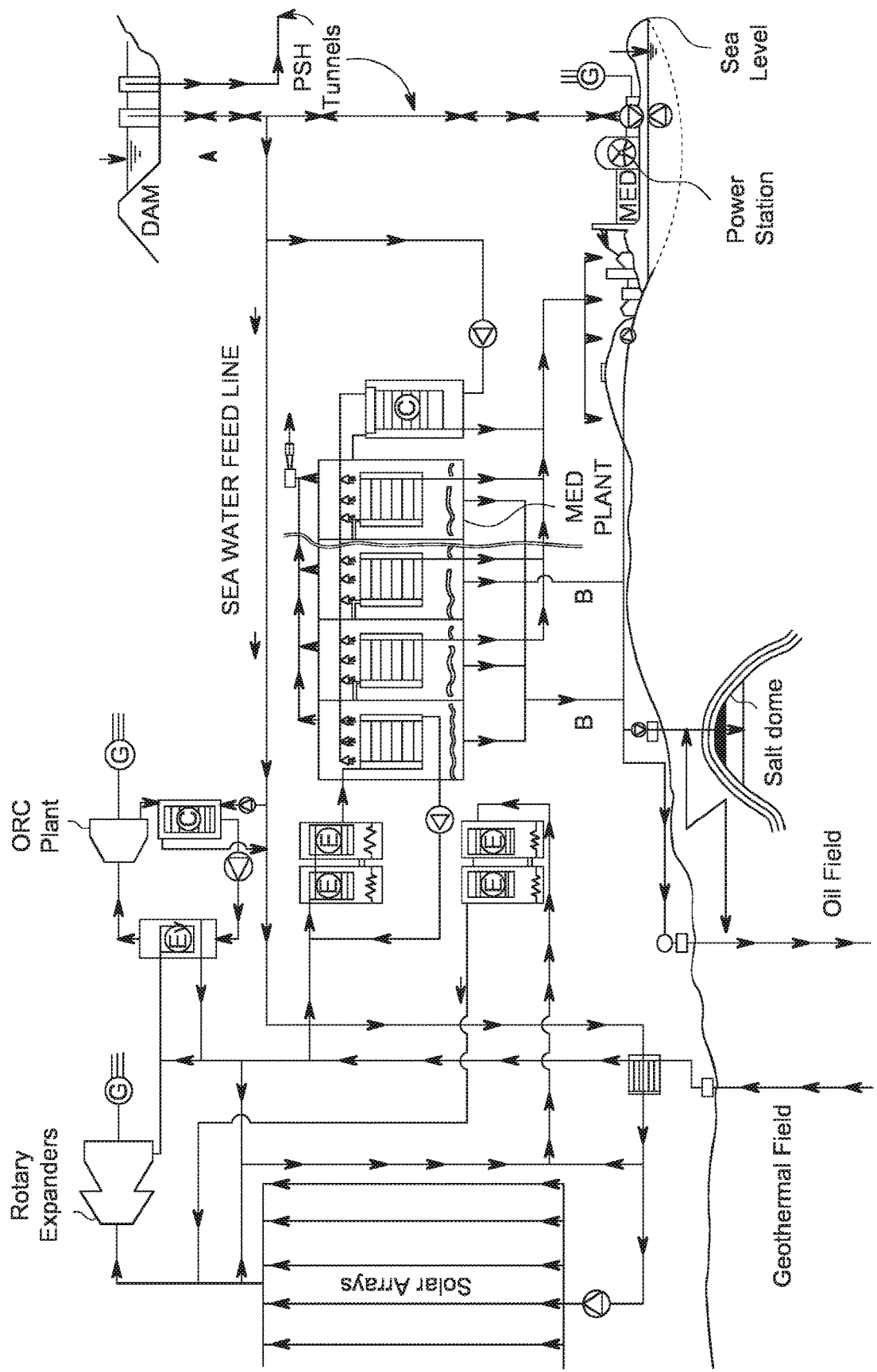

FIG. 3A is a flow-diagram illustrating a power-plan based on pumped-storage-hydropower from a sea or ocean, with cogeneration, utilizing renewable and conventional energy, into a MED desalination process.

Figure 3B:
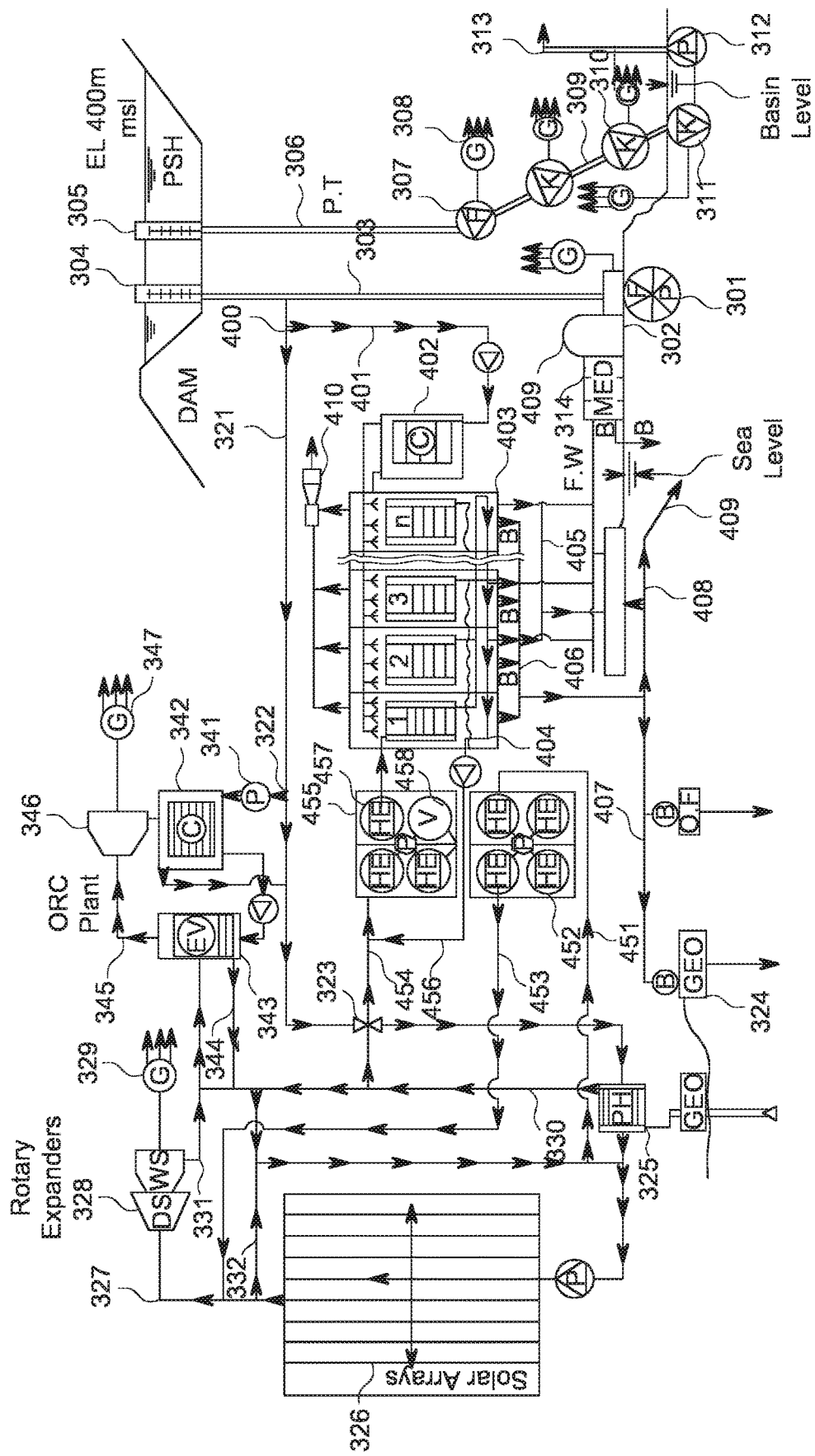

FIG. 3B is a block-diagram illustrating power and desalination infrastructure-elements of FIG. 3A. Physical features and geography are descriptive of one example and not applied rigorously to the scope of innovations herein.

FIG. 3B: Overview/Block Diagram
Pumped-Storage-Power/Gravity-Flow/Open-Channel-Power Systems (301-314)

| Item | elev. (MSL) | Location | Description |
|---|---|---|---|
| 301 | 0 m | Pacific-Ocean | Reversible-reaction (Francis) pump/turbines |
| 302 | 0 m | Pacific-Ocean | Conventional (continuous-demand) power plant |
| 303 | 25 m | Pacific-tunnels | Reversible power-tunnels to vertical shaft system (PSH) |
| 304 | 400 m | PSH dam | Discharge-tower/vertical-shaft-system-PSH reservoir |
| 305 | 400 m | PSH dam | Inlet-tower on PSH reservoir to vertical-shaft system |
| 306 | 30 m | Transition shaft/tunnels | Once-through outflow power-tunnels system |
| 307 | 20 m | Fish Creek Mountains (E) | Discharge thru Francis turbines-to open-channel-system |
| 308 | 20 m--70 m | Fish Ck Mtn-Salton Sea | Generators/transformers/line power-to grid |
| 309 | 20 m--70 m | Power-canals | Open-channel outflow systems; to GFH dams |
| 310 | 20 m-70 m | Kaplan turbines | Turbines/generators, etc; line power to grid |
| 311 | −70 m | Salton Sea turbines | Salton- discharge elevation and power station |
| 312 | −70 m-+5 m | Salton Sea-South pumps | Salton-Mexicali: open-channel/outflow-system |
| 313 | 5 m-0 m | Mexicali-Mar de Cortes | Open channel paths: Laguna Salada/Sea of Cortez |
| 314 | 0 m | Waste-heat recovery | MEDX desalination off power plant (i.e. NGNP nuclear) |

Polar-Linear-Fresnel Concentrating (PLFC) Solar Power System (321-332)

| Item | elev.(MSL) | System/Function | Description |
|---|---|---|---|
| 321 | O < P < 400 m | PSH dam & SW pipeline | Feed seawater diversion and pipeline |
| 322 | | Tee: location nonspecific | Cold-seawater media feed to ORC plant condensers |
| 323 | | 4-way flow-control | Make-up water and low-med. temp systems to SITTES |
| 324 | | Geothermal field | Heat-source and external power to system functions |
| 325 | | Geothermal field | Preheater for seawater-inflow systems |
| 326 | | PLFC CSP system | Polar-linear-Fresnel-Concentrator collection field |
| 327 | | High-temp sat.-steam line | Feed-media to rotary-screw expanders (150° < T < 300°) |
| 328 | | DS/WS rotary expanders | Single-or two-stage rotary screw expanders |
| 329 | | Generators | Generators, transformers; line-power to grid |
| 330 | | Geothermal production line | Low-med temp line to ORC and MED systems |
| 331 | | Low-temp output DS/WS DS/WS expanders to | Lo.-temp. media from ORC evaporator |

-continued

| Item | elev.(MSL) | System/Function | Description |
|---|---|---|---|
| 332 | | Low-temp. PLFC bypass | Low temp. media from PLFC-field to MED system |

Organic-Rankine-Cycle (ORC) System (341-347)

| Item | System/Function | Description |
|---|---|---|
| 341 | Pump: seawater feed-line | Pump S.W. feed from main inflow-conduit |
| 342 | Condenser for ORC process | Seawater-in at ambient for liquefying organic media |
| 343 | Evaporator: organic media | Phase-change: liquid to gas; heat from DS/WS |
| 344 | L. temp recycle from expanders | Recycle L-temp media (T ~75° C.) to evaporator |
| 345 | Feed gas line: ORC rotary expander | Organic-gas-feed, at pressure, to power-block |
| 346 | Rotary-Expander | Organic-gas-driven rotary expander |
| 347 | Generators | Generators, transformers; line-power-out |

Multi Effect Distillation System with Extended-Liquid-Recycle-Loop: MEDX (400-410)

| Item | System/Function | Description |
|---|---|---|
| 400 | Tee: location nonspecific | Cold-seawater media feed to MED plant system |
| 401 | Feed seawater line | Seawater at ambient temp to MED Condenser |
| 402 | MED condenser | Condenser at last-stage of MED-system |
| 403 | MEDX plant (general) | MEDX; as described in text |
| 404 | Extended-recycle-loop | Recycle-loop extended thru $1^{st}$-nth stages |
| 405 | Fresh water recovery | Fresh-water outflow from MEDX plant |
| 406 | Brine (B)-reject media | Flow-paths of brine-reject solution to: |
| 407 | Brine well-injection | to geothermal and oil fields |
| 408 | Brine recovery | to domestic/industrial/agriculture/SITTES |
| 409 | Brine rejection | Pipelines to sea-return |
| 410 | Ejector | Reject steam from system |

Single-Temperature-Thermal-Energy-Storage-System: SITTES (451-458)

| Item | System/Function | Description |
|---|---|---|
| 451 | SITTES seawater (SW)-feed-line | SW feed-line: ambient & PLFC low-temp; T ~30° C. |
| 452 | Liquid-salts TES tanks (T = 450° C.) | Pump seawater thru two-or more exchangers |
| 453 | Seawater media-output: T = 150° | T-out = 150° C: to rotary expanders (108). |
| 454 | Make-up SW feed-line to TES | T-in (30° C.< T < 73° C.) |
| 455 | Liquid-salts TES tanks (T = 450° C.) | Pump SW thru one-or more exchangers |
| 456 | Seawater media-output: T = 73° C.) | T-out: MEDX $1^{st}$ stage & extended recycle-loop. |
| 457 | Heat exchanger (HE) core element | Removable core; heat-transfer liq. salt to SW |
| 458 | Vacant tank (V): SITTES process | Vacant-tank-rotation-cycle; /maintenance plan |

Figure 4A:
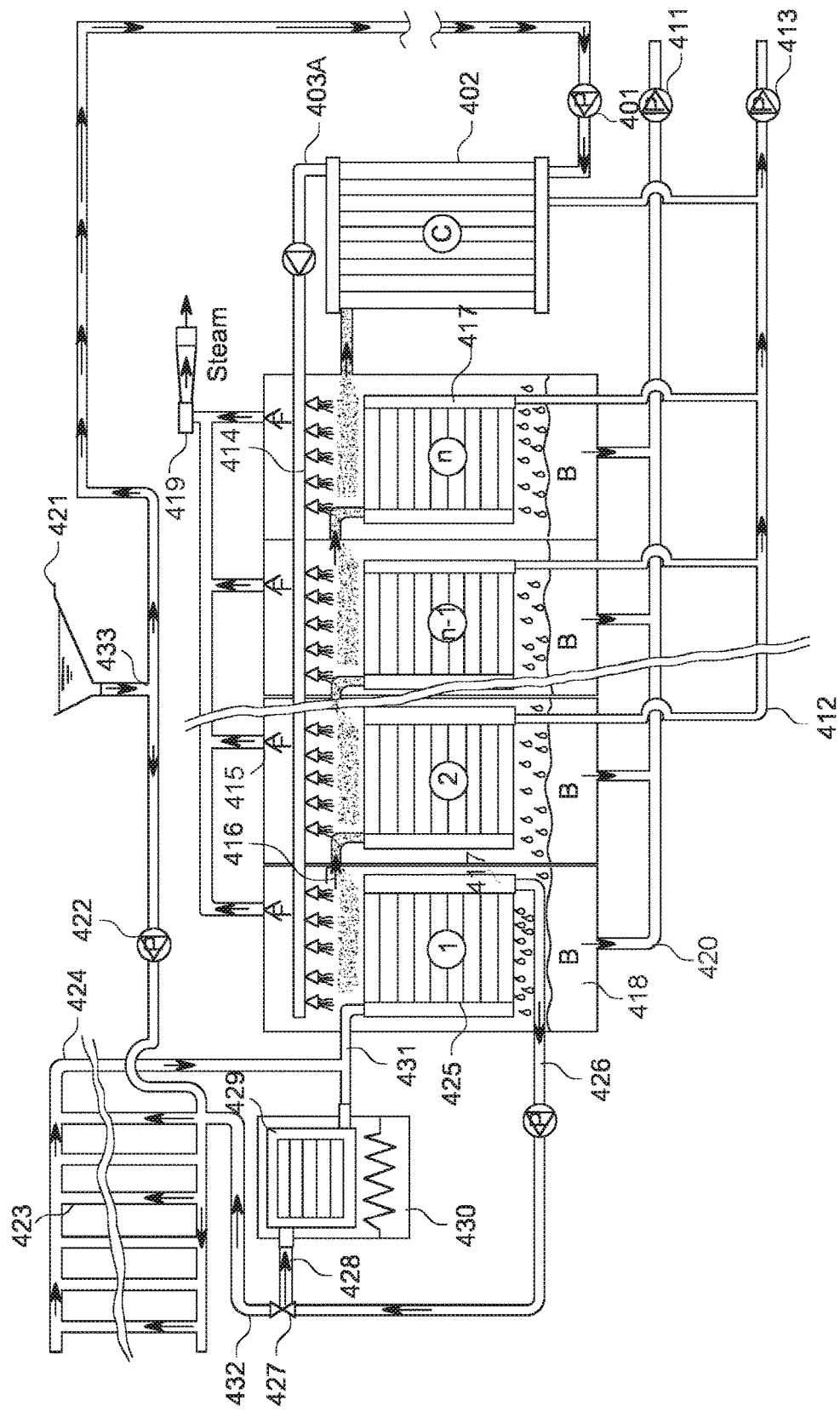

FIG. 4A is a schematic illustration of a 12-stage, or "n", "n+1"-stage, MED desalination process, wherein heat generated through thermal-energy storage and waste heat/or low-temperature seawater media pumped from the CSP field is the principle energy source in the MED system.
FIG. 4A Multi-Effect-Distillation System Concept (Med)
MED-Feed Seawater: Recycle thru First Stage at continuous rate; control temperature T=~73° C.

| Item | System/Function | Description |
|---|---|---|
| 401 | Pump seawater Feed line (P) | Transfers seawater from PSH reservoir to MED |
| 402 | Condenser (C) | SW media thru C; distillate recov. from final stage |
| 403A | Seawater (SW) feed line: MED plant | Seawater supply to all "n"-stages of MED plant |
| 414 | Seawater distribution sprinklers | Shower seawater atop core elements "n"-stages, Steam produced stage sat. temp to distillate recov. |
| 415 | Exhaust (decompression) fans | Reduce air pressure consecutively at each stage, Provides phase-change to steam recov.; each effect |
| 416 | Energy/steam transfer conduit | Route steam/thermal energy to adjacent effect, Latent heat trans.; next stage at lower air pressure |
| 417 | Fresh water recovery system | Distillate recovery conduits: 2nd thru "n"th Stage |
| 418 | Brine separation system | Brine recov. tanks; maintain thermal energy control |
| 419 | Ejector: air & steam | MED system exhaust all stages; |
| 420 | Brine outflow conduit | Remove brine-reject media to offsite locations |
| 411 | Brine reject pump | Recycle brine to industrial, agriculture, domestic, |
| 412 | Distillate outflow conduits | Fresh water collected for storage; consumption |
| 413 | Distillate outflow pumps | Offsite distribution: cities and farms |
| 421 | PSH seawater reservoir | PSH (hydropower) storage at elevated dam-site, gravity-flow seawater for power and desalination |
| 422 | Seawater feed pump | External energy input to PLFC solar fields and power plant functions |
| 423 | PLFC solar collection arrays | Raise temp., SW to either saturated, or wet steam, power generation by rotary screw-expanders. |
| 424 | PLFC Return-Feed line | Waste-heat or low-end heat recovery at solar plant, SW media recycled to MED First stage and SITTES or diversion conduits route to ORC plant (not shown) |
| 425 | MED First Stage | Seawater continuously supplied thru core element Seawater feed temperature constant: T = ~73° C. |
| 426 | Seawater Return-Line | Recycle First-Stage SW output to PLFC solar field, or Route to MED via SITTES (Thermal Energy Storage) |
| 427 | Tee | Control return-flow to SITTES or to PLFC solar field |
| 428 | SITTES Seawater Feed-Line | Return SW media to MED desalination plant or to Power generation by Rankine Steam Cycle or ORC. |
| 429 | SITTES heat exchanger Core | Pump seawater thru core immersed in molten salt, Night time/adverse weather; external power req. |
| 430 | SITTES Molten Salt Storage | Molten salts tank (~450° C); external power input |
| 431 | Tee and feed line MED First stage | Supply make-up water to MED at control temp |
| 432 | Return SW feed line to PLFC | System overflow to solar field: ambient temp = 30° C. |
| 433 | Tee: Main, from PSH Reservoir | Branch to either PLFC solar or to MED system feed |

Figure 4B:
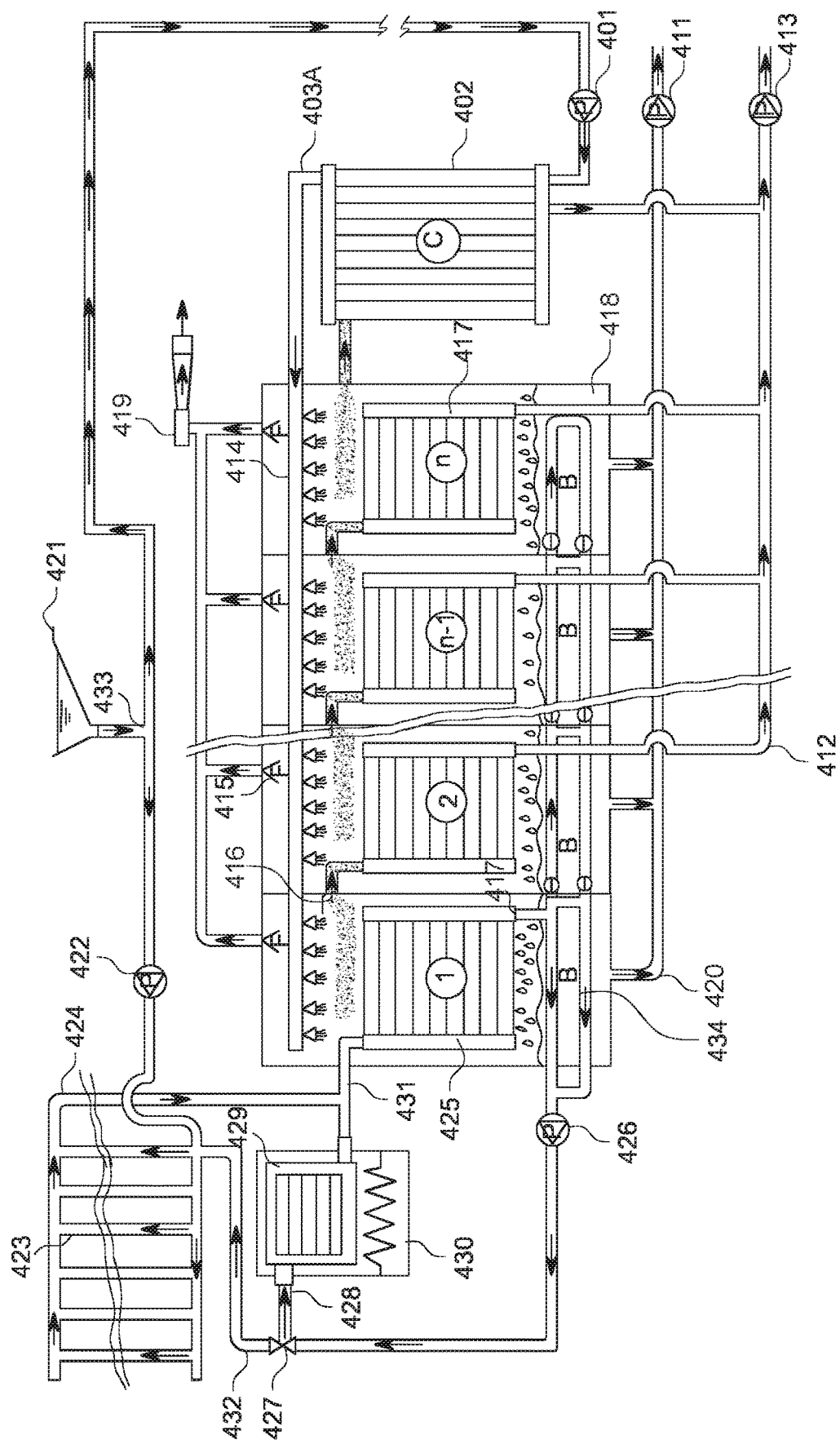

FIG. 4B is a schematic illustration of a MED desalination process coupled with an extended liquid-media recycle loop; herein described as MEDX.

FIG. 4B MEDX: MED-Extended System Recycle Free-Flow-Through Process for Thermal-Energy Transfer

| Item | System/Function | Description |
| --- | --- | --- |
| 401 | Pump seawater Feed line (P) | Transfers seawater from PSH reservoir to MED |
| 402 | Condenser (C) | S.W. media thru C; distillate recov. from final stage |
| 403A | Seawater feed line: MED plant | Seawater supply to all "n"-stages of MED plant |
| 414 | Seawater distribution sprinklers | Shower seawater atop core elements "n"-stages, Steam produced stage sat.-temp to distillate recov. |
| 415 | Exhaust (decompression) fans | Reduce air pressure consecutively at each stage, Provides phase-change to steam recov.; each effect |
| 416 | Energy/steam transfer conduit | Route steam/thermal energy to adjacent effect; Latent heat trans.; next stage at lower air pressure |
| 417 | Fresh water recovery system | Distillate recovery conduits: 2nd thru "n"th Stage |
| 418 | Brine separation system | Brine recov. tanks; maintain thermal energy control |
| 419 | Ejector: air & steam | MED system exhaust all stages |
| 420 | Brine outlet conduits | Remove brine-reject media to offsite locations |
| 411 | Brine reject pump | Recycle brine to industrial, agriculture, domestic, energy, and sea/ocean return |
| 412 | Distillate collection conduits | Fresh water recovery: storage; human consumption |
| 413 | Distillate outflow pumps | Offsite distribution: cities and farms |
| 421 | PSH seawater reservoir | PSH (hydropower) storage at elevated dam-site, Gravity-flow seawater for power and desalination |
| 422 | Seawater feed pump | External energy input to PLFC solar fields and power, Plant functions |
| 423 | PLFC solar collection arrays | Raise temp., SW to either saturated, or wet steam, Power generation by rotary screw-expanders. |
| 424 | PLFC Return-Feed line | Waste-heat or low-end heat recovery at solar plant, SW media recycled to MED First stage and SITTES or Diversion conduits route to ORC plant (not shown) |
| 425 | MED First Stage | Seawater continuously supplied thru core element, Seawater feed temperature constant: T= ~73° C. |
| 426 | Seawater Return-Line | Recycle First-Stage SW output to PLFC solar field, or Route to MED via SITTES (Thermal Energy Storage) |
| 427 | Tee | Control return-flow to SITTES or to PLFC solar field |
| 428 | SITTES Seawater Feed-Line | Return SW media to MED desalination plant or to Power generation by Rankine Steam Cycle or ORC. |
| 429 | SITTES heat exchanger Core | Pump seawater thru core immersed in molten salt, Night time/adverse weather; external power req. |
| 430 | SITTES Molten Salt Storage | Molten salts tank (~450° C.); external power input |
| 431 | Tee and feed line MED First stage | Supply make-up water to MED at control temp |
| 432 | Return SW feed line to PLFC | System overflow to solar field: ambient temp = 30° C. |
| 433 | Tee: Main, from PSH Reservoir | Branch to either PLFC solar or to MED feed. Lines |
| 434 | MED-Extended SW Recycle | Heat transfer system thru seawater recycle loop via conduits in brine tanks; route Cell 1-Cell"n" |

Figure 5:
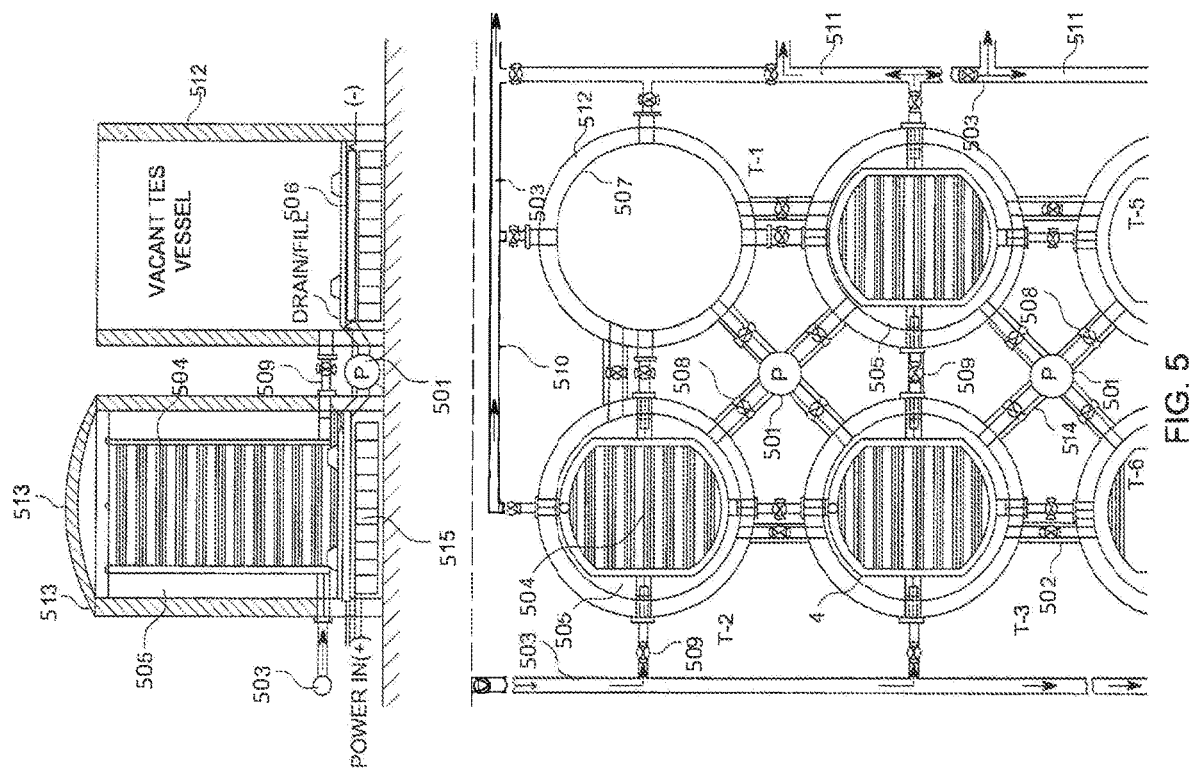

FIG. 5 is a conceptual drawing of a Single-Temperature-Thermal-Energy-Storage (SITTES) battery (system).

FIG. 5 Single-Temperature-Thermal-Energy-Storage Concept (SITTES)

SITTES: Two-Temperature Series/Parallel Arrangement: T-amb=30° C.; T-out=72.5° C. &/or 150° C.

| Item | System/Function | Description |
| --- | --- | --- |
| 501 | Pump: Four-Way Centrifugal | Transfer liquid salt media between adjacent TES tanks |
| 502 | Bypass-Flow conduit | Free flow, liquid salts to active tanks; Constant temp. |
| 503 | Conduit: seawater feed line | Seawater in (T amb = 30° C); Working Media to TES output |
| 504 | Heat-Exchanger Core, removable | Ceramic/metal tubing provides passage of seawater thruTES molten-salt tank; raising temp of Working-Media |
| 505 | Liquid Eutectic Salt (T = 450° C.) | Liquid nitrate shown (60% NaNO3; 40% KNO3); provide thermal energy transfer thru exchangers to Working Media. |
| 506 | TES-Tank Heater-elements | External power-in thru resistance coils; maintain TES fluid at constant temp (i.e. 450° C.) 24/7. |
| 507 | TES-Tank, Vacant | Required: 1 or >1 TES tanks in system is empty; permittingplanned maintenance-rotations/ unplanned shutdowns |
| 508 | Conduit and valves: Liquid salts | Transfer mechanism to/from adjacent TES tanks |
| 509 | Conduit and valves: seawater media | Transfer mechanism: Working Media thru 1 or >1 TES tanks; raising output temp to T = 72.5 C. or T = 150 C. |
| 510 | Pipes: W. Media Output (T = 72.5° C.) | Low-temp. Seawater feed-lines to MED-plant |
| 511 | Pipes: W. Media Output (T = 150° C.) | Hi-temp. Seawater feed-lines to Power-Block |
| 512 | Insulation/Outer Walls TES tanks | Thickness indeterminate, all TES tanks |
| 513 | TES removable lid, insulated | Thickness indeterminate, all TES tanks; with lift-hooks. |
| 514 | Insulation, molten-salt conduits | Thickness indeterminate, all liq. Salt transfer pipes; Prevent freezing of liquid-salt media during down-times |
| 515 | Substrate: SiO2 sand & conduits | Thermal barrier to/from ground; conduits move seawater for supplemental heat transfer media/plant safety. |

Figure 6A:
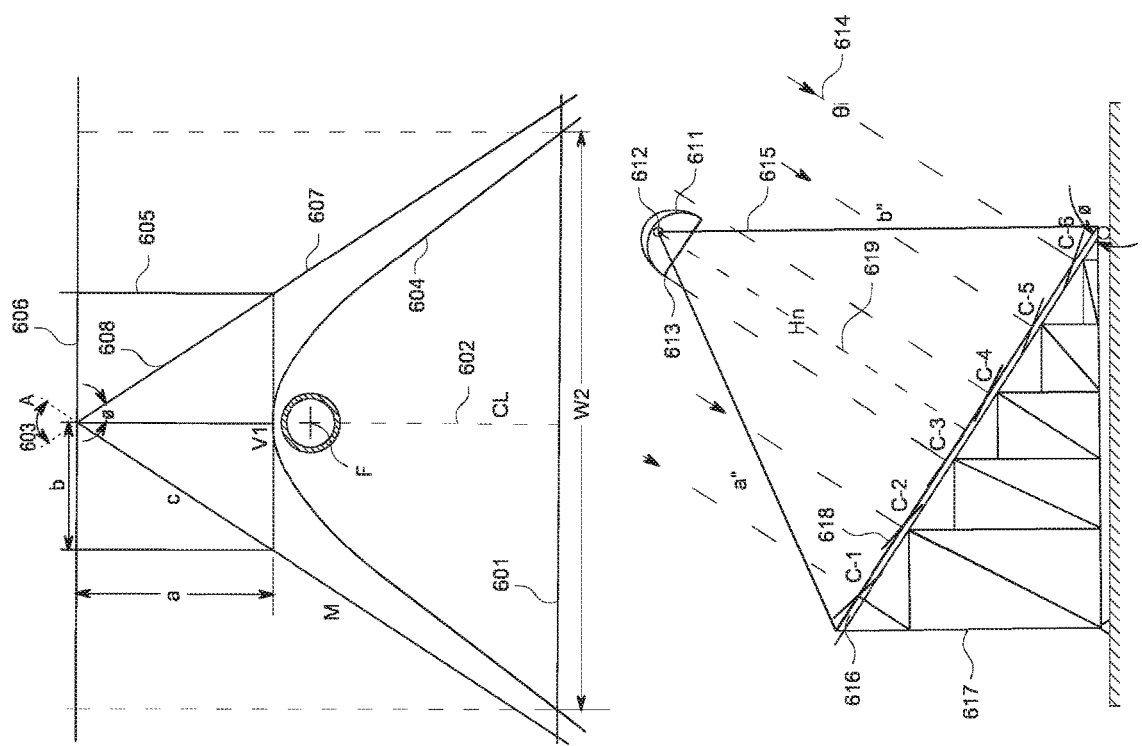

FIG. 6A is a conceptual cross-section diagram, showing elements of a Hyperbolic-Cylinder-2ndary-mirror: HYPO-CYL.

FIG. 6A: Elements of the Hyperbolic-Cylinder Secondary Concentrator

Hyperbolic-Cylinder Secondary Concentrator (HYPO-CYL): Image Detail; Top-Half

| Item | Ref. | System/Function | Description |
| --- | --- | --- | --- |
| 601 | W2 | Glass Pane position | Mitigate thermal energy losses of concentrated IR radiation |
| 602 | CL | Center Line | CL ref.: PLFC array-set to center point, linear absorber tube |
| 603 | A | Acceptance Angle | 2ndary Conc. Asymptotes; idealized outer limits: reflected solar flux |
| 604 | 4 | HYPOCYL mirror | hyperbola-figured cylinder mirror surface of 2ndary Concentrator |
| 605 | a | Vertex (−V1) | Vertex of hyperbola (III, IV quadrant) measure from h.k = (0, 0) |

-continued

| Item | Ref. | System/Function | Description |
|------|------|-----------------|-------------|
| 606 | b | Transverse Axis | line-length (b) from origin h, k at distance (a): from h, k to −V1 |
| 607 | M | Slope of Asymptotes | M = a/b; defines curve boundaries; Asymptotes |
| 608 | c | Focus of hyperbolic cylinder | c = F; c = SQRT (a^2 + b^2) |

HYPOCYL Position With Respect To Primary Mirrors: Image Detail; Bottom-Half

| Item | Ref. | System/Function | Description |
|------|------|-----------------|-------------|
| 611 | 2C | Secondary Concentrator | Spatial position of HYPOCYL concentrator in PLFC array-scheme |
| 612 | F1 | Linear Absorber Tube | Position (x-sect.) of Absorber Tube within HYPOCYL concentrator |
| 613 | W2 | Glass Pane | Relative fixed position of Glass pane in PLFC array-scheme |
| 614 | Θi | Angle of incidence | Beam-irradiance angle of incidence; shown noon (TS = 12:00 h) |
| 615 | a" | Side a"; Side b" | Max. reflected (normal) ray-distance: Primary Cell to Absorber Tube |
| 616 | RA | Aperture Rack | Upper Frame Assembly: Primary Cells, bearings and actuators |
| 617 | F" | PLFC Primary Structure | Frame assembly main structure; inclination angle φ = site latitude |
| 618 | C-"n" | Primary Mirror (Cell) | Primary Cell; set position on RA for zero mutual shading 365 d/y |
| 619 | Hn. | "Tangent-Normal" | CL length: PLFC Array-Set to center-point linear absorber tube |

Figure 6B:
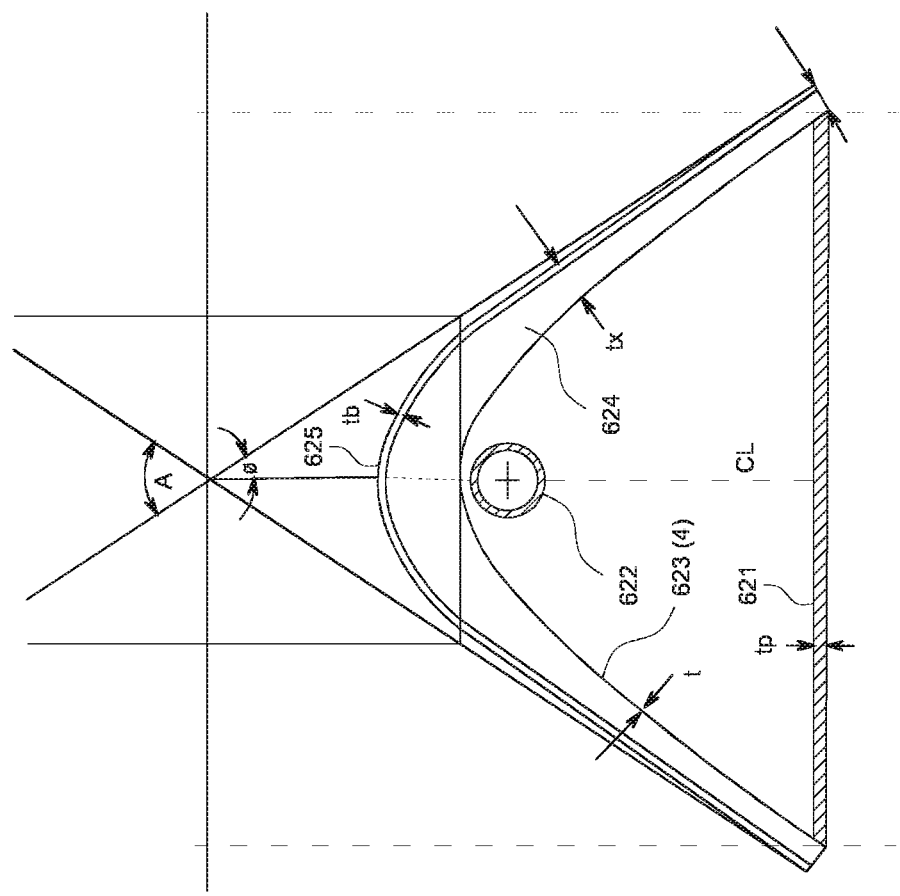

FIG. 6B is a conceptual illustration in cross-section of said Hyperbolic-Cylinder-2ndary concentrator with an expanded-insulation-device affixed to the back-side, and extending full-length of the secondary-mirror-concentrator assembly, for mitigating losses of thermal energy through the secondary-mirror-glass and reinforcing back-shell, respectively.

FIG. 6B Hyperbolic-Cylinder Secondary Concentrator: Major Components

Hyperbolic-Cylinder Secondary Concentrator (HYPOCYL):

| Item | Ref. | System/Function | Description |
|------|------|-----------------|-------------|
| 621 | W2 | Glass Pane | Glass Pane of thickness (tp); mitigate thermal energy loss |
| 622 | F | Linear-Absorber-tube | Linear Absorber Tube position centered at focal plane: (+) |
| 623 | (4) | 2ndary Conc. Mirror | Reflective surface of thickness (t): Secondary Concentrator |
| 624 | ti | Insulation: Back-Shell | Var. thickness; mitigate thermal energy loss thru 2ndary Conc. |
| 625 | tb | Back-Shell Cover | Hard-shell composite of thickness: (tb); outer structure |

Figure 6C:
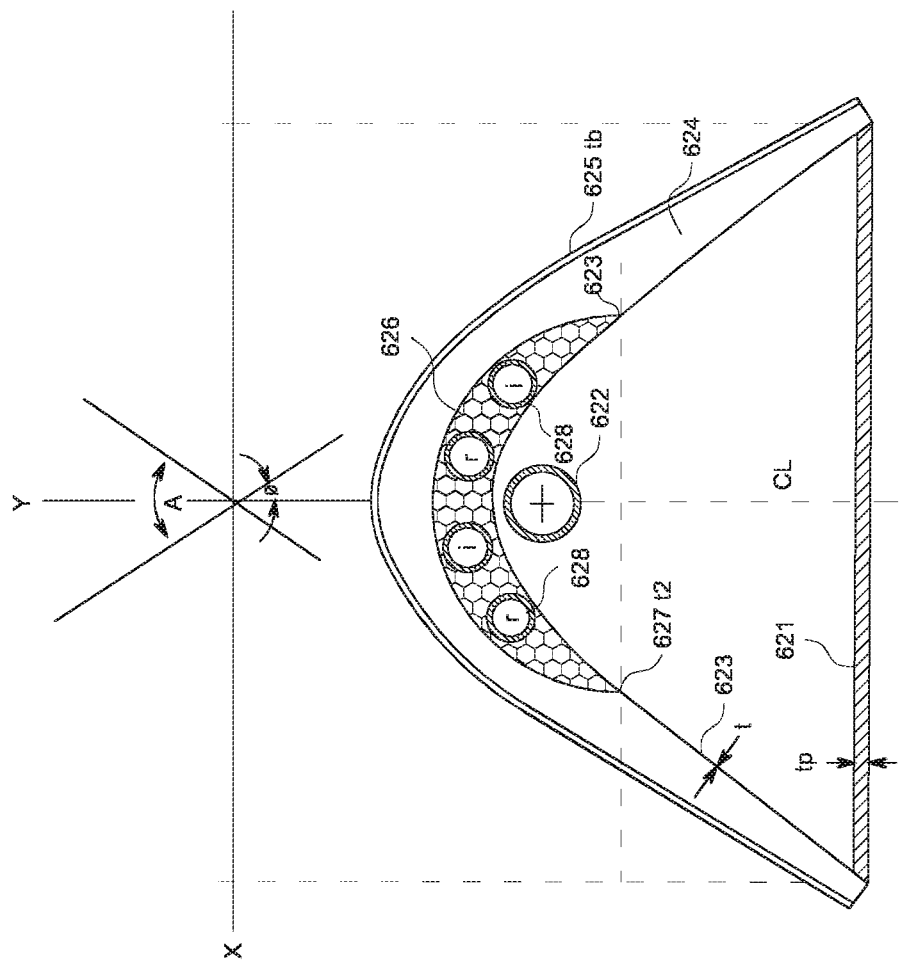

FIG. 6C is a conceptual cross-section illustration of same-design Hyperbolic-Cylinder-2ndary-reflector (concentrator) with an expanded insulation arrangement for transfer of thermal energy from waste-heat therein, through one or more subsidiary conduits containing an organic-working-fluid, for purpose of recovery of said waste-heat otherwise lost to space, and generate electric power by Organic Rankine Cycle (ORC).

FIG. 6C Hyperbolic-Cylinder Secondary Concentrator; Expanded to ORC

Secondary (HYPOCYL) with Conduits Thru Metallic-Foam for Heat-Transfer for ORC Power Plant

| Item | Ref. | System/Function | Description |
|------|------|-----------------|-------------|
| 621 | W2 | Glass Pane | Glass Pane of thickness (tp); mitigate thermal energy loss |
| 622 | F | Linear Absorber | Linear Absorber Tube position centered at focal point: (+) |
| 623 | (4) | 2ndary Conc. Mirror | Reflective surface of thickness (t): 2ndary hyperbolic cylinder |
| 624 | ti | Insulation: Back-Shell | Var. thickness; mitigate thermal energy loss thru 2ndary Conc. |
| 625 | tb | Back-Shell Cover | Hard-shell composite of thickness: (tb); outer structure |
| 626 | fm | Metallic Foam | Metal-alloy or ceramic-metal composite heat-transfer media |
| 627 | t2 | Inner back-shell cover | Spherical-cylinder I.R reflector-shell barrier to outer insulation |
| 628 | i, r | Conduits: organic media | Outflow (i) &/or return (r) pipes for organic fluid to ORC plant |

Figure 7:
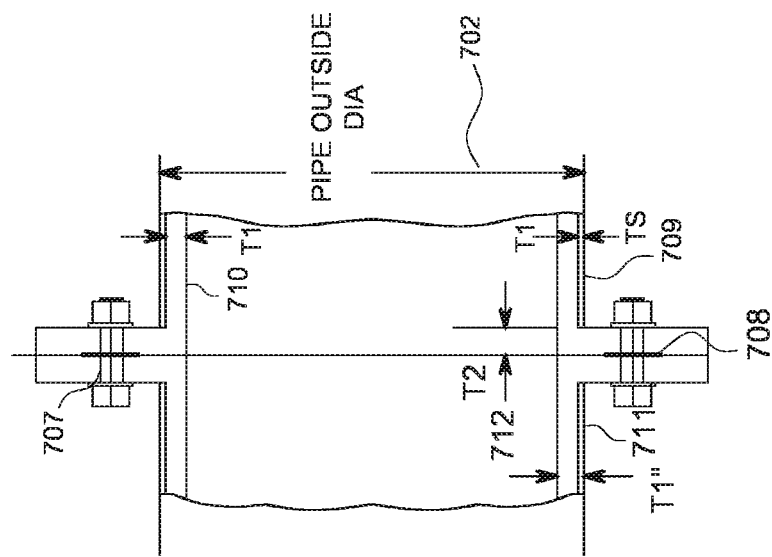
Figure 7:
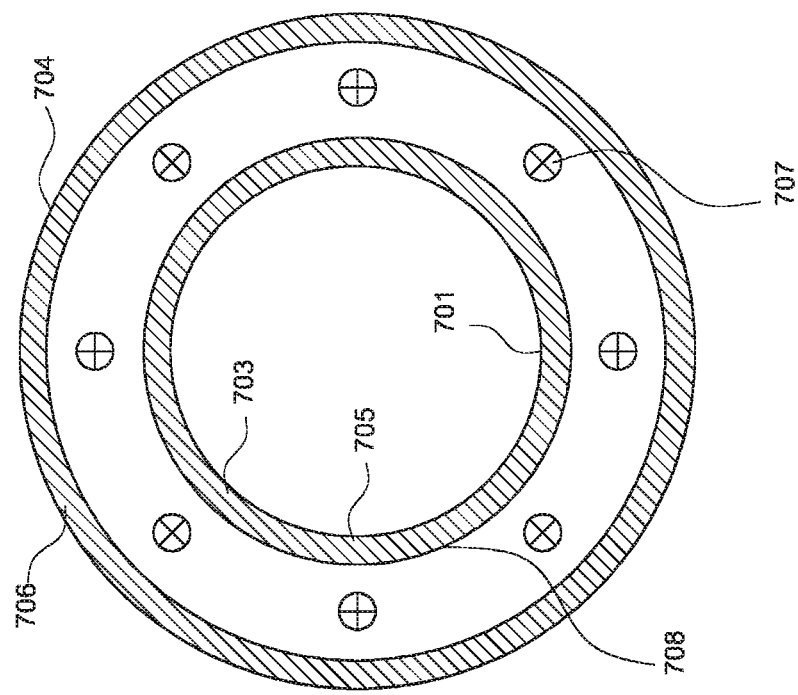

FIG. 7 is an illustration of a Flanged-Joint-Couple-External (FJCX)

FIG. 7: Flanged Joint Couple External (FJCX)

| Item | System/Function | Description |
|------|-----------------|-------------|
| 701 | Pipe inside diameter (DN) | Nominal ASME ID; example shown: schedule 60 |
| 702 | Pipe outside diameter (OD) | OD − DN = T1" pipe-wall thickness incl. selective absorber |
| 703 | Inside pipe-wall contact-face (F1) | Raised contact ring pipe wall = T1" pipe-wall thickness |
| 704 | Outer flange contact-face (F2) | Raised contact ring outer flange (F2 ∼ = F1) |
| 705 | Inner contact seal 5 μm < x < 1 mm | Gold or high-temp, corrosion resistant malleable compound |
| 706 | Outer contact seal 5 μm < x < 1 mm | Gold or high-temp resist. inert malleable compound |
| 707 | Bolt receiver bore-hole | Drilled holes for fastening flanged-coupled pipes |
| 708 | Inner gasket | WS2 or equivalent high-temperature leakage-barrier |
| 709 | Selective absorber (TS) | Outer multi-element compound: maximize I.R. absorptance |
| 710 | ASME pipe-wall thickness (T1) | Nominal pipe-wall thickness (less selective absorber TS) |
| 711 | Overall pipe-wall thickness (T") | Pipe wall thickness incl. selective absorber (T" = TS + T1) |
| 712 | Flange-plate thickness (T2) | Thickness of outer flange (ring) welded to pipe-ends |

List of Maps

MEECAPP 1

Figure 8A:
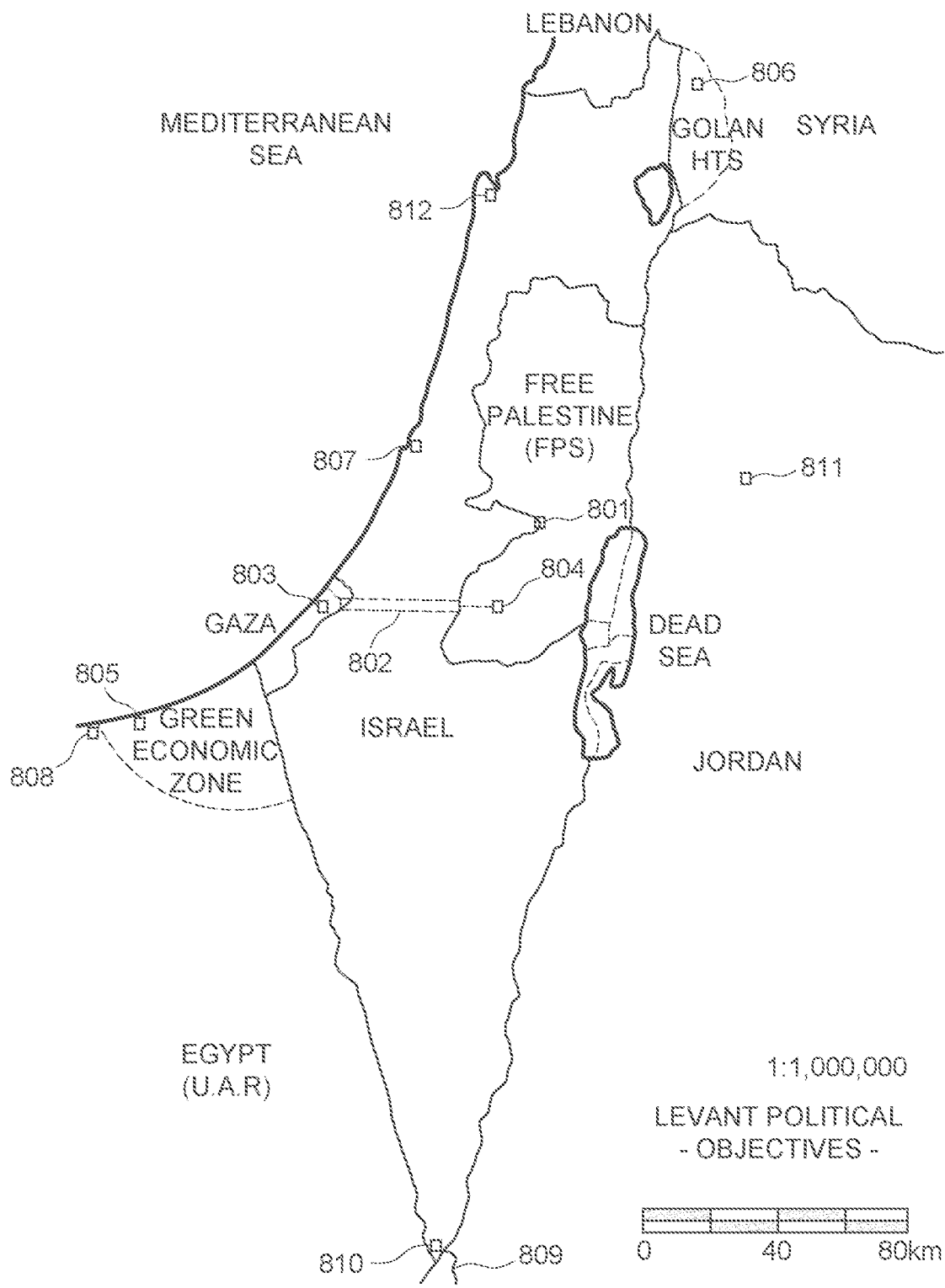

FIG. 8A Levant Political Objectives 1:1,000,000

FIG. 8A is plan showing a proposed political-solution for Eastern Mediterranean six-nation economic trading block

| Site | Economic Center | Description |
| --- | --- | --- |
| 801 | Jerusalem | Capital City: Israel (West) & Free Palestine State (East), governments |
| 802 | Gaza-West Bank Tunnels | Underground Railway corridor: FPS thru Gaza to Mediterranean Sea |
| 803 | Gaza City | Principle city & port access for FPS; terminus of West Bank railway line |
| 804 | Hebron | Principle southern city; trade center; origin: West Bank railway/tunnels |
| 805 | Green Economic Zone | Lease land from Egypt; intensive energy, Ag. Development: UAR & FPS |
| 806 | Golan Heights | Negotiate final Israel/Syria borders;: trade land, econ, cooperative, peace |
| 807 | Tel Aviv | Principle population center; Israel |
| 808 | El Arish | Principle city: Sinai Peninsula, Egypt |
| 809 | Aqaba | Jordanian Red Sea port |
| 810 | Eilat | Israeli Red Sea port |
| 811 | Amman | Capital and principle population center of Jordan |
| 812 | Haifa | Israeli principle port city |

Figure 8B:
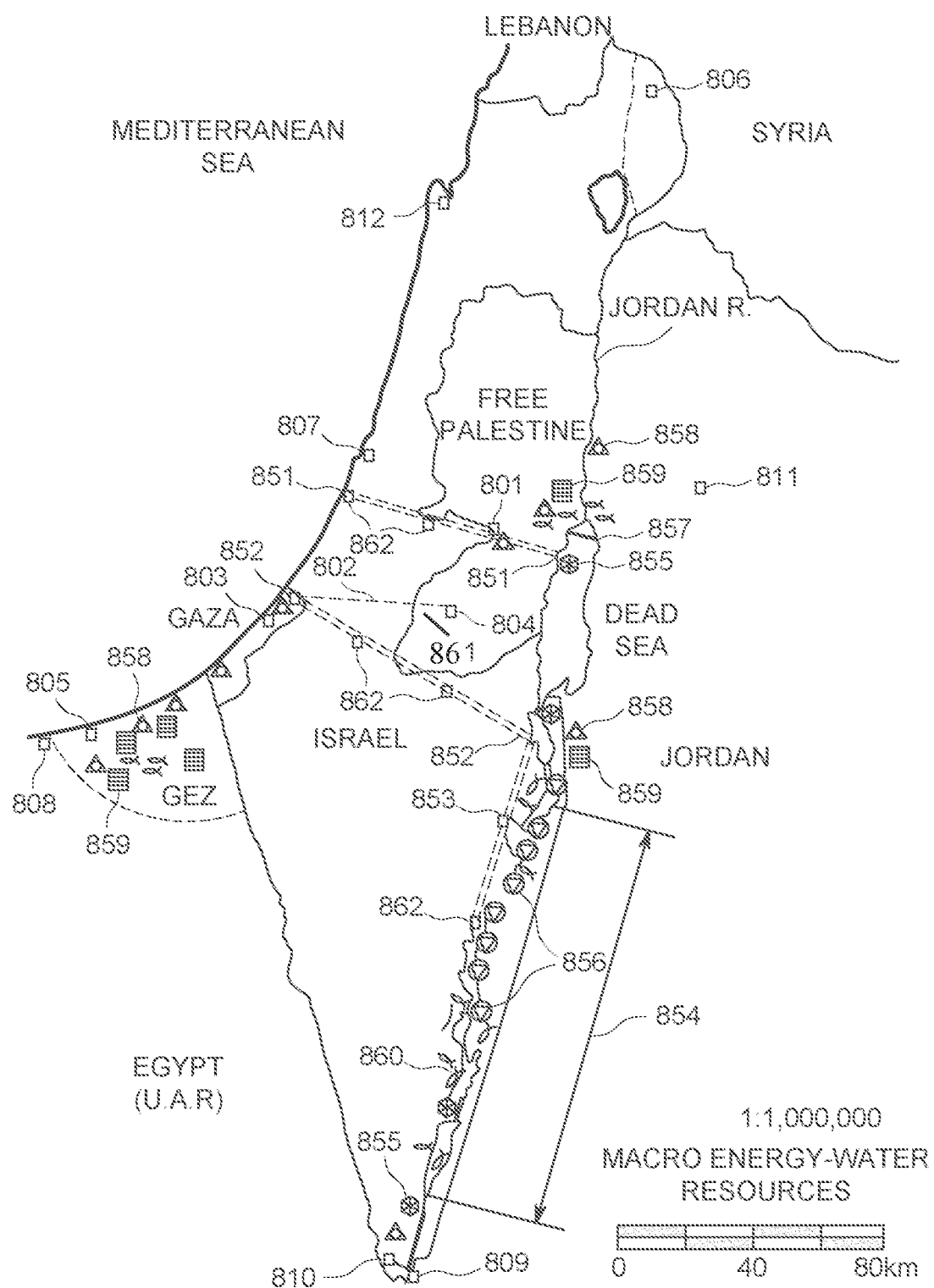

FIG. 8B Macro Energy—Water Resources 1:1,000,000

FIG. 8B is Middle-East (Levant) Integrated Macro-Energy & Water Resources Economic Development Plan

| Item | Function | Description |
| --- | --- | --- |
| 801-812 | Economic Ctr. | AS described Fig. 8A |
| 851 | GFH Tunnels N. Route (1) | Med. (Tel Aviv)-Dead Sea bored-tunnel-system; 2 ea. x. 9 m × 75 km'long |
| 852 | GFH Tunnels S. Route (2) | Med. (Gaza)-Dead Sea bored-tunnel-system; 2 ea. x. 9 m × 105 km length |
| 853 | GFH Tunnels Bypass Rt. (3) | Transfer by GFH to PSH Dam No. 5; 2 ea. × 9 m × 44 km-length |
| 854 | PSH Dams & Reservoir system | 10 earth/rock-fill dams, power-canals; reversible-reaction turbines |
| 855 | Reaction turbines | Francis or Kaplan power turbines; GFH tunnels or PSH dams; non reversible |
| 856 | Turbines, reversible reaction | Turbines-pumps, reversible; PSH dams/reservoirs |
| 857 | Lower Jordan River Dam | Wildlife/fisheries restoration; Free Palestine State, Jordan, Israel |
| 858 | MEDX Distillation Plant | Desalination: CSP/cogeneration-powered; liquid salts SITTES battery storage |
| 859 | PLFC solar fields | CSP Fresnel collectors with integrated agricultural infrastructures |
| 860 | Sustainable fisheries | Aquaculture/mariculture, multispecies; local region and exotics |
| 861 | Gaza-West Bank Railway | Underground economic corridor; FPS trade & passengers; to Mediterranean |
| 862 | Vertical Shaft or raise | (1) Seawater feed to tunnels; (2) ventilation for construction; maintenance |

MEECAPP 2

Figure 9:
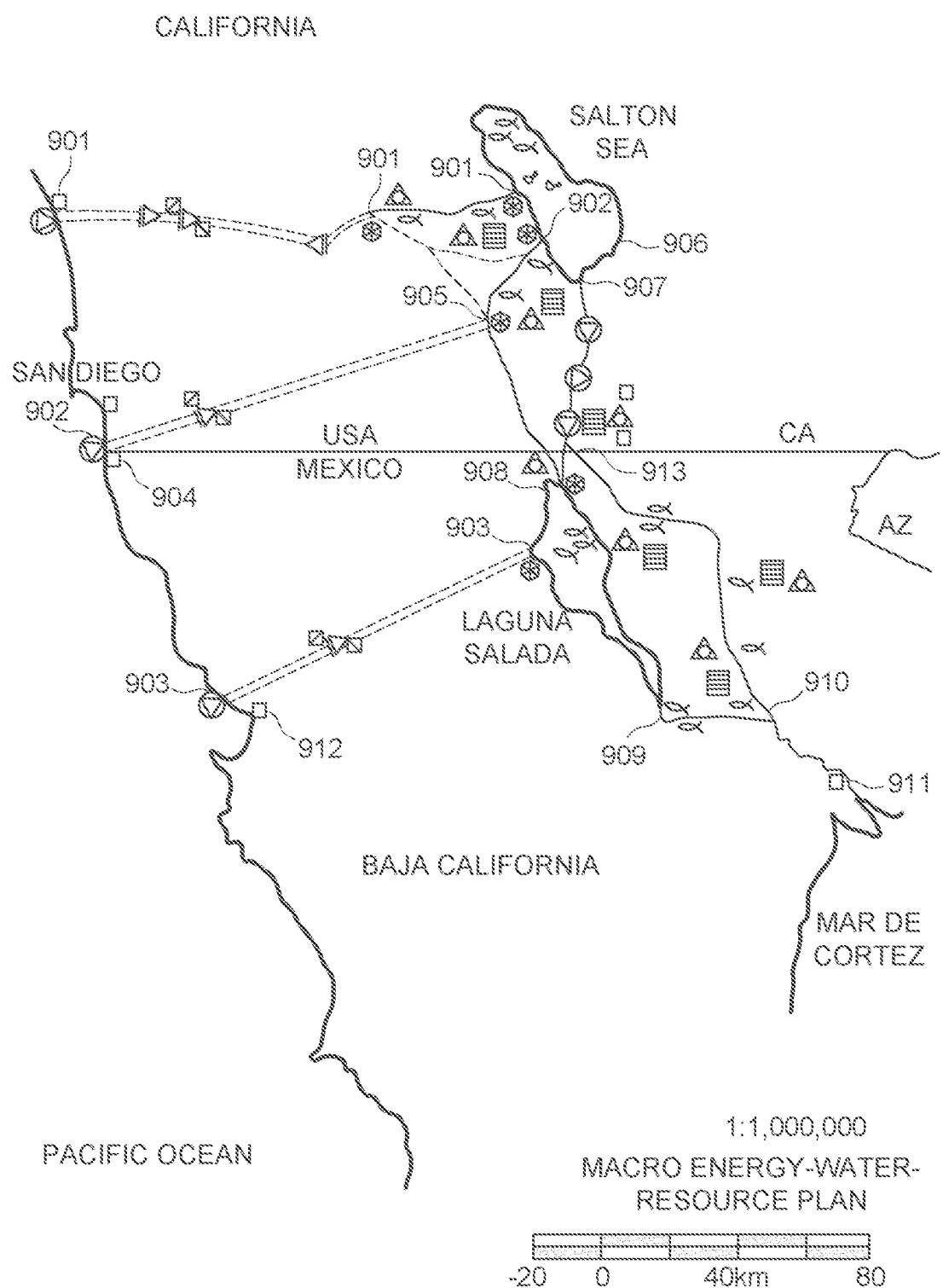

FIG. 9 Macro-Energy-Water Resources Scale: 1:1,000,000

| Item | Elevation | Location | Description |
| --- | --- | --- | --- |
| 901 | 0 m | Pacific Ocean: Carlsbad CA | Origin: N. PSH tunnels/power canals Alternative No.1 |
| | −71 m | Salton Sea; Salton City, CA | Discharge Pt: PSH tunnels/canals; Alternative No. 1 |
| 902 | 0 m | Chula Vista, CA/ Tijuana MEX | Origin: Ctr. PSH tunnels/power canals Alternative No. 2 |
| | −71 m | Salton Sea: (southern end) | Discharge Pt:. PSH tunnels/canals; Alternative No. 2 |
| 903 | 0 m | Ensenada, Baja Calif. Mexico | Origin: S. PSH Tunnel/ power canals Alternative No. 3 |
| | −5 m | Laguna Salada, Baja California | Discharge Pt:. PSH tunnels/canals; Alternative No. 3 |
| 904 | 0-10 m | Tijuana, Mexico | Border City opposite San Diego (See Item 2) |
| 905 | 10 m | Fish Creek Mt.; East SlopeTransition, open channels: Salton Sea/ Laguna Salada | |
| 906 | −71 m | Salton Sea (southern end) | Discharge: Power canals system from Fish Creek Mt. |
| 907 | −71 m | Salton Sea (south) | Power canal system; pump seawater south to El Centro |
| 913 | 0-5 m | Mexicali | Split channels: to Laguna Salada and/or Mar de Cortez |
| 908 | 0-5 m | Laguna Salada (north) | Open channel discharge and Kaplan turbine power block |
| 909 | −5 m-0 m | Laguna Salada (south) | Outflow by open channel to Mar de Cortez |
| 910 | <2 m | Rio Colorado | Confluence: Channels 8n and 9 to Colorado R. delta |
| 911 | 0 m | State Park: Mar de Cortez | Reserva de la Biosfera Alto Golfo |
| 912 | 0-20 m | Ensenada | Nearest population Ctr, to Tunnels System Alt. No. 3 |

DETAILED DESCRIPTION

The methods and systems described herein for producing electric power and desalinating seawater are ultimately designed to serve a population center of one-million persons. This is a base-model case only, so the reader understands the engineering-aspects of installing similar systems for his or her community. Accordingly, the size and scope of the solar-collection fields and desalination plants are reduced or increased proportionately to any specific demand, or as suitable land areas are made available. The basis for the PLFC system-design here is a polar array comprised of 12×2 m primary assembly with effective aperture of 24 m, sited at latitude 33.2° N, and elevation of 30 m MSL; a commonality of geography shared by nations of the Levant, and SW United States—Northern Mexico.

The Polar-Linear-Fresnel-Concentrator (PLFC)

The geometrical basis of the polar Fresnel linear concentrator is the isosceles triangle (FIG. 2A & FIG. 2G) which if divided in half though the centerline of the aperture assembly, the resultant cell positions on the rack-plane are mirror images for all such assemblies with an even-number of cells are exactly the same offset from centerline.

In the PLFC design, a wide range of cell element widths and number of rows per aperture assembly are considered. For direct comparisons of performance of various assemblages, the configuration selected for this model is a 12-part×2 m element aperture rack yielding a 24 m effective aperture.

Aperture assemblies of, but not limited to: 4, 6, 8, 10 . . . 24 rows are possible design alternatives for a 24 m effective aperture, but the 2 m primary×12-row solution is chosen based on 1: minimum mechanical linkages ordered in assembly of a linear array, and 2: design an array structure of maximum dimensions resulting in 2ndary concentrator assembly of <~30 m overall height.

Other designs incorporate larger or smaller width mirrors, but 2 m cells are an appropriate compromise as to aperture size/ease of manufacturing (only six-sizes in an optically-justified arrangement for an entire solar-collection field comprised of individual array-sets of twelve primary mirrors at specific site latitude), and array performance), and transportation (i.e. 2 m×12 m, or 2 m×16 m mirrors in individual rigid frames are easily transportable by standard sized 40' or 53' long, respectively, flat-bed semi-trailers in utilization of solar array-collectors comprised of larger, either optically flat, or spherical-cylinder primaries, thence necessitating, more massive secondary concentrators and taller towers and structural components, the net shadow factor cast by said concentrators and structural components over the primary array-sets, accordingly adversely affect the overall performance of the CSP system proportionally to area-dimensions of the secondary-concentrator/primary-array-width ratio.

In the design process of a PLFC plant, the author begins by selecting a "Site-Representative" Model Plant where commonalities exist between the Salton Sea/Laguna Salada and Dead Sea geography. Each location for example, has similar climate and latitude (Mediterranean to extreme desert; latitude: all between 30°N and 35° N), and, below-sea-level terminal lakes; having physical-geography common to both sites.

4.11 Applied PLFC Technology: Model Plant General Assumptions

Site Selection, General:

In this study the PLFC array-model is designed within a standard unit area (SUA) of 1 km^2. Typical latitudes/environments for which this system is applied ranges from, but not-limited-to: upper-Mediterranean vegetation zone to upper-tropical (40°-20°) deserts.

Solar data extremes: select time ranges on which basis, system-design for zero-mutual-shading by adjacent mirrors (Solar Time); by complimentary solar positions and altitude angles during winter/summer solstice. FIG. 2B (summer: TS=07:00 h) and FIG. 2C (winter: TS=08:00 h) illustrate effect of designing two corresponding PLFC: 8-row×3 m system (24 m effective-aperture), in the Levant (Arava-Great-Rift-Valley)) at $\varphi$=31.15° N. at these summer and winter solar-times, respectively. Wherein angle $\varphi$ is the site-latitude-based slope-angle of the solar collection array-system (aperture rack), it is also the equatorial-analogue of the CSP field of primary-cells therein. By equatorial analogue, (aside from cosine-effects due air-mass factors, and longer and shorter days, respectively-) said aperture-rack position at angle-$\varphi$ has effect of capturing beam-irradiance by primary-cells, as if the solar collection field was geometrically equivalent to equatorial site, irrespective of summer or winter solstice altitude angles, during equal-daily economic-solar-collection-cycle. In examples (FIG. 2B and FIG. 2C) only a one-hour difference, (TS=07:00 to TS=08:00) has, on ultimate dimension in a PLFC structure, wherein selection of minimum time-ranges for which basis of PLFC structure is based, causes considerable increase in size of the PLFC structure; (~8 m) in the horizontal dimension alone. For this reason, selected daily solar collection-cycles-in-common are:

Winter Solstice, 22 Dec. 2015: {TS=08:00-16:00 h}
Summer Solstice, 21 Jun. 2015: (TS=08:00-16:00 h)

Actual time-ranges in practice are dependent on economic-trade-offs of PLFC-structure-size, vs air-mass-effects of solar-altitude-angles, and site elevation above/below sea-level.

Ambient temperature: summer: 30° C.; winter: 20° C., The winter ambient here for delivery of seawater to the solar-collection field is maintained at 30° C., thence providing a consistent "cold" seawater input flow at same temperature simply by using waste heat from the power block or other sources to regulate the winter "cold-media" input temperature, accordingly. Otherwise, nominal seawater temperatures entering in to system from outside (Pacific Ocean and Mediterranean Sea) are: 15° C. and 20° C., respectively; these are applied to estimating viscosities of seawater from both sources for fluid-mechanics problems.

Location: Salton Sea basin, in proximity of PSH facility.
Location: 33.2° N, 119° W; elev. 30 m MSL. Solar field site on graded level ground; a playa or dry terminal lake bed may suffice due to less earthwork. Model elevation change: nearest PSH reservoir to PLFC plant: ($\Delta$h)=100 m.

Area of site: 1 km^2 SUA (array structures and ag-zone buffers); expandable by "n"-whole SUA units as needed. Areas of infrastructure (expanders, condensers, generators and substations, powerlines, roads, pipelines, etc.): not specific, but assumed at 20% additional area of an SUA/SUA under solar collector-field.

Effective aperture/array assembly (AE): 12 ea. mirror (cell) rows×2.0 m-wide cells: 24.0 m.

No. of array assembles (aperture rack)/SUA: as allowed, planning zero mutual shading/blocking of Solar flux between cells and zero-shadow cast by the linear receiver tower of ("Array n") over the lowest cells of the next assembly ("Array n+1") north; thence array assembly offsets are tower-ht.-based. The modeled plan described allows for a 'fit' of 9.4 solar concentration assemblies per SUA.

4.12 Methodology: Design of the Primary & Secondary Optical Elements 4.121 Primary Cell Mirror Type: Spherical Cylinder (Radius of Curvature ~128 m, Focal Length ~64 m).

Trial cell width for 12-element assy.: W1=2.0 m; AE=24.0 m.

Astronomy: determine site-specific data for sun's position & intensity by hour: summer & winter Solstices. Summer Solstice Solar constant=1367 W/m^2, at Earth-Sun semi major axis (1 AU).

Direct beam irradiance at 100,000 m MSL (edge of space) is 1321 W/m^2 on Jun. 22, 2015. At 0 m MSL, this value is reduced to 851 W/m^2 as result of losses of ~36% due to: absorption by aerosols, scattered to space & earth (diffuse).

Declination of sun (summer solstice): $\delta$=23.45°

Maximum solar altitude angle at site latitude of 33.20°: $\delta$=23.45° $\alpha$=80.25°: (90.00−$\varphi$+$\delta$=$\alpha$)

By cosine-effect air mass factor and altitude adjustment, this reduces to a site-specific solar resource of 842 W/m^2, and a corresponding maximum COLLECTORS field potential of 194 MW/SUA at 12:00 noon.

Winter Solstice Solar constant=1367 W/m^2, at Earth-sun semi major axis (1 AU).

Direct beam irradiance at 100,000 m MSL is 1413 W/m^2 on Dec. 21, 2015. At 0 m MSL, this value is reduced to 910 W/m^2 as result of losses of ~36% due to absorption by aerosols, scattered to space & earth (diffuse).

Declination of sun (winter solstice): $\delta=-23.45°$

Maximum solar altitude angle at site latitude of 33.20°: $\delta=-23.45°$ $\alpha=33.35°$: (90.00−φ+δ=α).

By cosine-effect air mass factor and altitude adjustment, this reduces to a site-specific solar resource of 503 W/m^2, and a corresponding maximum COLLECTORS field potential of 126 MW/SUA at 12:00 noon.

4.122 Secondary Cell (FIG. 6A);

Determine dimensions of the secondary concentrator above the linear absorber tube. This is critical early on, as the ultimate profile of the secondary mirror, contributing to the amount of shading caused by it and structural components are detrimental to the net solar flux received by the absorber tube. The 2ndary cell design parameters are determined according to dimensions of the total primary array, which is effectively, a 24 m spherical mirror.

On basis of the 2.0 m×12-cell element aperture rack the following dimensions define the elements of a combined summer-winter-compatible assembly:

Primary Cell Array Physical Data

| | |
|---|---|
| Effective Aperture: | AE = 24.00 m |
| Aperture Rack overall length (final optimized cell offsets): | RA4 = 30.776 m |
| Tangent Normal (plane of aperture rack to linear Rcv. Tube): | Hn = 23.515 m |
| Length from cell-extremities (Sides 'B' & 'C') to CL Rcv. Tube: | B, C = 28.102 m |
| Aperture Rack ht. (less ground clearance min.) OP = sin φ (RA4) | OP = 16.852 m |
| Tower height + min clearance lowest cell: T" = B + Hy | T" = 28.618 m |
| Tower ht. + base clearance + ht.(2ndary insulation) + (cap structure): | Tmax = 30.2429 m |

Offset distance (N-S) between arrays: Y"=Tmax/tan ⊖ y (@08:00 WINTER); use Y-vector solar incidence-angle at 08:00 as a design limit to set offsets Y"=106.18 m Determine likely solar position data as 'template' for design parameters of the hyperbolic-form secondary concentrator. We select spring (fall) equinox, when sun rises/sets due east & west, and there are 12 hours of daylight At TS=07:00 h (17:00 h), solar altitude is about 12° 30' (air mass ~4.6); apply this time as design limiting factor for primary cell radius of curvature.

Primary Cell Optical Properties: 2.00 m Cell Width

| Equinox Solar Time (3/22/15) TS = 07:00 (17:00) | |
|---|---|
| Receiver tube C.L. dist. to outside cells = Tower ht. less adjustments: | T = B = 28.102 m |
| Shadow length (X vector), from absorber tube C.L. point 'T' (Xv) | Xv = −125.339 m |
| Xv = T (sin (A − 180))/tan (α), where: | |
| A = sol. azimuth at 07:00 at spring equinox (decimal deg.) | A = 98.3468° |
| α = sol. Altitude angle | α = 12.5077° |
| Radius of curvature (outer cells): | Rc = 128.451 m |
| Rc = (T^2 + Xv^2) ^0.5 | |
| Mirror-cell focus: f = Rc/2 | f = 64.225 m |
| F/Ratio, outer 2m cells: | f/32.1 |
| f/− = focal length/width of primary cell (f/W1) | |

Primary Cell Concentrator Errors

Determine expected magnitude of errors associated with the Fresnel array assembly: this includes optical and mechanical; will ultimately decide dimensions of the secondary concentrator mirror. Noting: σ (magnitude=1 std. deviation); σ^2=variance.

One Dimensional Errors (Mechanical):

Those errors that cause beam spreading in the plane of curvature from the primary cells to the receiver tube (values in mrad).

| ISSUE | MAGNITUDE (σ) | VARIANCE (σ^2) |
|---|---|---|
| Structure | 5.00 | 25.00 |
| Tracking | 2.00 | 4.00 |
| Sensor | 2.00 | 4.00 |
| Drive Uniformity | 2.00 | 4.00 |
| Alignment | 2.00 | 4.00 |
| Subtotal: | 6.40 | 41.00 |

Two Dimensional Errors (Optical): σ2D

Those errors caused by flaws in mirror surfaces (Stine & Geyer). Data sourced from optical modeling data compiled by authors (Power from the Sun).

| | | |
|---|---|---|
| Mirror Specular Reflectance | 0.50 | 0.25 |
| Sun's Width | 2.80 | 7.84 |
| Subtotal: | 2.84 | 8.09 |

Total Cumulative Error: σ Total=$(\Sigma\sigma(1D)^2+\Sigma\sigma(2D))^{0.5}$=7.0064 mrad Or, in decimal degrees: σ Total=360/2π*7.0064/1000=0.4014 degrees Calculate Secondary Cell Width:

| | |
|---|---|
| Beam spread intercepted at receiver: No. std. deviations (n) | n = 5 |
| Sigma total * (n) (decimal degrees) n * (σ tot.)= | 2.0072° |
| 2ndary Cell width @ radius of curvature (Rc = 128.45 m): W2 = Rc * (tan (5*σ tot./2)) | W2 = 2.2502 m |

2ndary Cell: Recalc./Check Values (Cassegrain Analogue)

Calculate Beam Spread Width at Aperture Normal to Receiver Tube C.L. (TS=12:00)

| GIVEN: | |
|---|---|
| Width Primary cell element: | W1 = 2.00 m |
| Width Secondary cell element: | W2 = 2.2502 m |
| Delta Width, Primary − Secondary elements (W1 − W2): | W1 − W2 = −0.2502 m |
| Tangent Normal, plane of aperture rack to parallel plane at recv. tube C.L.: | Hn = 23.5150 m |
| Focal length of Primary Cell: | f = 64.2254 m |

Find:

Beam Spread at aperture normal at receiv. tube distance at TS=12:00 noon: (W2″) By proportional distances: (W2″) =W1−(Δ(W1−W2)*Hn/f) (W2″)=2.0916 m Calculate Equivalent Cassegrain Solution at Aperture Normal to RCV Tube (TS=12:00)

| GIVEN: | |
|---|---|
| Width Primary cell element: | W1 = 2.00 m |
| Focal length, Primary cell: | f = 64.2254 m |
| Tangent Normal, plane of aperture rack to receiver tube C.L.: | Hn = 23.5150 m |
| Center-line distance (Cell "Cn" ctr.) to Focal point: a = f − Hn | a = 40.7104 m |
| Minimum diameter, 2ndary cell: d = a * W1/f | d = 1.2677 m |
| FIND: | |
| Width of 2ndary mirror to fully illuminate field at focal plane at distance of 2ndary cell: W2c = a * (( W1/f) + (d * (f − a)/(Hn * f))) | W2c W2c = 2.0713 m |

CASSEGRAIN RESULT IS ACCEPTABLE CHECK: % error=((W2″)−W2c)/(W2″)*100: error=0.97%

Select largest (more conservative) of the two values (W2″). (W2″)=2.0916 m

**Secondary Cell Dimensions and Expected Avg Shading

| GIVEN: | |
|---|---|
| Width, Primary cell | W1 = 2.0 m |
| Width, 2ndary cell (5σ result) | W2 = 2.2502 m |
| Aperture Rack slope length (merged summer/winter) | RA4 = 30.7756 m |
| External Shade factor (towers, trusses, outer shells to rcv. assy.) 20% (W2): | Tx = 0.4500 m |
| Average Shadow cast on aperture rack by 2ndary and structural: | ST = 2.7002 m |
| Shadow avg. as % of nom. aperture rack slope length: | Shx = (ST/RA4)*100 Shx = 8.77% |

**Structural shading varies greatly over a production cycle; at early am and late pm hours, shadow factor is, or near zero; variance of shadows cast is high at any given time, as they fall partially or fully over the unequal offsets between the primary cells. In any case structural design drawings of the aperture assembly are beyond the scope of this report; so we will assume a mean shade factor of 8.77%, from various graphical representations.

4.123 Design of the Hyperbolic-Cylinder Secondary Concentrator (FIG. 6A)

The argument for selecting a hyperbolic cylinder as a secondary concentrator over other geometric forms, such as trapezoidal, or spherical, is that the rays from the sun can be concentrated more effectively to the linear receiver tube with minimal "leakage" due to ray-scatter. The variable foci of each of the primary mirror cells in a given assembly: 6-cell-surface-figures/12-element array (or 6-cell-sizes to build a SUA field) ensures that each of the spherical mirrors concentrates the solar radiation in a linear axis running through the center of the receiver tube. Of course, the nature of errors in the optical elements precludes much of the solar flux from hitting the receiver tube precisely, but most of the rays missing the receiver tube directly are absorbed as they reflect off the sides and back of the secondary reflector. Moreover, the glass pane which covers the secondary concentrator along its entire length, traps much of the infrared radiation which is otherwise lost, or reflected to space.

The hyperbolic cylinder form described is based on the width of the secondary receiver glass pane determined above, or: W2=d=2.2502 m.

It follows that the equation of the hyperbola: $Y^2/b^2 - X^2/a^2 = 1$, or reduced to:

$$Y = (b^2 * (X^2/a^2 + 1))^{0.5}$$

Calculate Dimensions of the Hyperbolic Secondary Concentrator (see FIG. 6A)

| GIVEN: 1$^{ST}$ QUADRANT VALUES | |
|---|---|
| Outer 2ndary-cell width dimension (Glass Pane): | W2 = 2.2502 m |
| Aperture Rack overall length (RA4): | RA4 = 30.7756 m |
| Tangent Normal: plane of aperture rack to center point linear absorber | Hn = 23.5150 m |
| Acceptance angle of concentrated solar rays at linear-receiver tube: | <"A" = 66.40° |
| <"A" = 180° − 2(tan^−1 (Hn/½*RA4) | ½ ("<A") = φ; φ = 33.20° |

FIND:
  Chord-normal to vertex in "X" direction; Slope-line M to Y axis (b): b=arbitrary; b=0.500 m
  Vertices of the hyperbola (V=a, from origin h, k (0, 0)): a=+/−b/tan (φ) a=(0, 0.7641 m)
  Slope of the function (asymptotes): M=α/b M=1.528
  Foci of the hyperbola: F=c; c=SQRT (a^2+b^2) F=0.9131 m
  Eccentricity of hyperbola: e=c/a e=1.195
  Values plotted for (X, Y); 2 m primary cells: Y=SQRT (b^2*(X^2/a^2+1))
  "SAG" of the 2ndary mirror cell, Vertex to CL of glass pane: $H*2^{nd}$=Y″−b; $H*2^{nd}$=1.1174 m
  (LA2): Arc-length by Graphical (sum of chord-rep curve-points solution)
  Arc-Length hyperbolic cylinder (By sum of SQRT (Σ of Δ(x^2+y^2) curve points (table 3.19): =½(LA2)
  ½(LA2)=Σ(SQRT ((X1−X2)^2+(Y1−Y2)^2)+(SQRT ((X2−X3)/2+(Y2−Y3)^2)+ . . . +(SQRT ((Xn−X(n+1)^2+(Yn−Y(n+1)^2)

Arc-Length ½ hyperbolic cylinder, where at ½ width of glass pane: {−1.1251<=x<=0} ½(LA2)=1.5820 m Arc-Length hyperbolic cylinder, @∩glass-pane: from {−1.1251<=x<=1.1251} LA2=3.1640 m Resultant 2ndary cell area/m^2 (LA2); applied to heat-loss calculations thru 2ndary concentrator: LA2=3.164 m By comparing result: (LA2) by equivalent PARABOLIC-CYLINDER analogue:

Arc length of the secondary cell: LA2=∫((1+(f'(x))^2)^0.5 dx or: f(x)=a*sin h^2(x/a)

By identity: LA2=∫cosh(x/a)dx=>LA2=a sin h(x/a)

Since a=V and x=W2/2: LA2=V(sin h(W2/2/V)−(sin h(−W2/2/V)) LA2=3.1562 m

Check answer/identity (natural log function 'e'): LA2=a ((e^x/a−e^−x/a)/2)*2  LA2=3.1562 m {−1.1251<=x<=1.1251} or approximate to catenary of same sag for a 2 m-wide primary cell (Δ=0.0078 m); use graphical form above Result here being, the parabolic-cylinder form which dimensions are nearly equivalent to corresponding hyperbolic-cylinder may be less-costly in production using "sagged-treatment" system; thereby achieving similar optical solution by applying a similar catenary form.

4.124 OPTICAL MODELING: PRIMARY CELL ARRAY Astronomy: Site-Specific Data for Sun's Position & Intensity by Hour: Summer Solstice (Nearest Min.).

| GIVEN: | | Sun's Position Data for Summer Solstice: Latitude 33.20 N; pm values in ( ) |
|---|---|---|
| Date/day of Year: Jun. 22, 2015 | DOY = J | J = 172 |
| Solar time: | TS = 08:00 h | (TS = 16:00 h) |
| Sun's declination: | δ = sin^−1((sin 23.45) * sin (360/365*(J − 81))) | δ = 23.45° |
| Hour angle: | ω = 15°/h *(TS − 12) | ω = −60° (ω = 60°) |
| Solar altitude angle: | α = sin^−1((sin φ*sin δ) + (cos δ*cos ω*cos φ)) | α = 36.9937° |
| Zenith angle: | θz = 90° − α | θz = 53.01° |
| Air mass (cos-effect): | AM = 1/(cos θz) | AM = 1.6619 |

Air mass (Kasten-Young): K=1/((cos ⊖z)+(0.50572*(96.07995−⊖z)^−1.6364) K=1.6589

Air density factor: ρ=(101.325 kPa*((293−0.0065*z)/293)^5.26)/101.325 kPa ρ=0.9965 where: 101.325 kPa, =1 std. atmosphere; z=30 m MSL

Air mass, altitude-adjusted: K*(ρ) K*(ρ)=1.653

Kasten-Young formula applied: (1/cos ⊖z doesn't correct for Earth's curvature)

Sun's azimuth, untested: A'=sin^−1((−cos δ*sin ω)/cos α) A'=84.1205

(A'=−84.1205)

Sun's azimuth, actual (am-noon): A=IF cos ω>=tan δ/tan φ: A=180−A'; not true. . . .

A=0+A'

At TS=08:00 h A=84.12050

Sun's azimuth, actual (noon-pm): A=IF cos ω>=tan δ/tan φ: A=180−A'; not true . . . A=360+A' At TS=16:00 h (A=275.8795°)

Optical Modeling: Primary Cell Assy., First Iteration:

STEP 1: At this Point, Select Minimum Cell Offsets: 'Trial 1' to Set Dimensions for Basic Aperture Assembly:

| No rows/aperture rack assy: | Cx = 12; W1 = 2.0 m |
|---|---|
| 'Trial 1' Cell offsets: | Spx = 0.2500 m |
| Offset distances: top of aperture rack, and at tower base: | Spxmin = 0.2500 m |

Trial 1 overall aperture rack slope length: RA1=Cx(W1)+(Cx−1)*Spx+(Spmin*2) RA1=27.2500 m Trial 1' First Iteration Dim. And Shade Values for RA1=27.2500 m, at Min/Max Design TS:

Minimum height aperture assembly: OP=sin φ(RA1) OP=14.9211 m

Shadow azimuth cast/structure of ht. 'OP' at TS=08.00: As=180+A As=264.1205°

TS=16.00: As=(A−180) As=95.8795°

Shadow coordinate (N-S): Ys Ys=OP cos(A−180)/tan α Ys=−2.0288 m

Shadow coordinate (E-W): Xs Xs=OP sin(A−180)/tan α Xs=−19.7013 m

These data applied above, with the exception that we 'reduce' the aperture rack to its equatorial site orientation such that the solar positioning throughout the year is the same with respect to the plane of the aperture rack as if site was at the equator. For example, if we set design limits of: (08:00 h=TS; 16:00 h=TS), from which to base the final cell locations on the aperture rack, the resultant summer and winter solstice "Y-Vector" angles (⊖y), on the N-S axis, −82.26° and 15.86° respectively, form equal and opposite angles with respect to same aperture-rack plane (FIG. 2G):

Summer Solstice, TS=08:00 (⊖y=−82.26°): ⊖y+φ=−49.06°

Winter Solstice, TS=08:00 (⊖y=) 15.86°: ⊖y+φ=49.06°

Results of this and the following steps applied to set cell-row positions on the aperture slope plane will be a 'summer-winter' based design where the locations of the each of the cells from centerline of the aperture rack will be exactly the same on each side of centerline. This allows us to construct an array and field, that for even no. of cells (12/primary collector in this model), only six (6) sizes are needed to build entire solar field at given latitude.

STEP 2: Reduce Aperture Rack to Equatorial Analogue: (FIG. 2A, FIG. 2B))

'Y' component angle of shadow-vector (TS=08:00): ρy=tan^−1(OP/Ys) ρy=−82.2570°

'X' component angle of shadow-vector (TS=08:00): ρx=tan^−1(OP/Xs) ρx=−37.13910

Shadow vector (ρy) reduced ('Artificial Horizon') by φ: ρy'=φ+ρy ρy'=−49.0570°

Angle of 'Chord-Normal' of ρy' to aperture-rack: ρy'C=90+ρy' ρy'C=40.9430°

4.125 Find: Dimensions of PLFC Array: Basis is Summer Solstice; (FIG. 2G) TS=08:00 Given:

The PLFC solar array is based on isosceles triangle geometry, where the following definitions exist:

Side A=overall length of the aperture rack plane, at inclination angle=latitude (φ) to the south. Φ=33.20°

Angles (b and C) from opposite end-points of Side A to center of absorber tube at vertex angle a: (b=c)=180−φ−90 b=c=56.80°

Vertex <(a)=convergence angle of aperture-normal reflected solar rays to linear absorber at TS=12:00:

$a=180-2b$ $a=66.40°$

Determine:
  Optimum dimensions of entire aperture assembly in three iterations.
Solution: Step 1
  From 'Trial 1', an aperture-rack slope length of RA1=27.25 m is initial assumption. There are 12 cell-rows at 2 m width/cell+end-offsets of 0.25 m each. Cells 1-12 are labelled accordingly from top to base. 'Cell-0' and 'Cell-13' are 'zero' dimensional end-points. Find:
    Sides B & C of triangle to center point linear absorber tube: B=C=RA1(sin b/sin a) B=24.8830 m
    Center-center slope distance, "Cell n–Cell n+1" SCn: Cell 0=0 m; Cell 1=W1/2+Spx; Cell 2=W1+Spx; etc.
    Slope distance apert. rack ref pt. 'Cell 0' to ctr. of rotation 'Cell n': Qn=(Qn−1)+W1+Spx; (Trial 1 Spx=0.25 m)
    Offset distance of 'Cell Q' north or south of aperture rack C.L: Qcx1=RA1/2−Qn
    Tangent Normal: plane of aperture rack to parallel (imaginary) plane at Rcv.tube: Hn1=sin b (B); Hn1=20.8212 m
Step 2 ('CELL-3' Values Illustrated): Note: Negative (−) Tilt Angles Indicate Counterclockwise Cell Rotation
  Calculate cell positions on aperture rack plane such that mutual shading/blocking by adjacent cells=0.
    Rcv. tube dist. from CL of 'nth-Cell': Hx=(Qn^2+B^2−(2 Qn B cos b))^0.5 (ie. Cell 3): Hx=22.2607 m
    Find: tan ^−1(Qn/Hn), off CL to set tilt <'Cell n' at TS=08:00: φ=tan ^−1(QCx1/Hn1); (C-3) φ=20.7177°
    Tilt Angle 'Cell n' from plane of aperture rack: ⊖n=(φ−ρy'C)/2 (C-3) ⊖n=−10.1127° (⊖n+1)=tilt<adj. cell (C-4) ⊖n+1=−12.9125°
    Aperture Width of incoming sol. Rays at ½ W1: A2=−(sin(ρy'+⊖n)*½W1) A2=0.8587 m
    ½ Width Cell (n+1) not obstructed by shade: S2=sin(180−(ρy'+(⊖n+1))*(W1/2/sin ρy')
    For (C-3) S2=1.1686 m
    Shade zone (width) over apert. rack by 'Cell n'/Cell 'n+1': S1=sin(180−(⊖n+ρy'))*(W1/2/sin ρy')
    (C-3) S2=1.1368 m
    Cell Spacing for minimum shade by Cell 'n+1': (S1+S2) =S2 (Cell n−1)+S1 (Cell n−1)
    (C-3) S1+S2=2.2415 m
    Cell position adjusted from TOP of aperture rack: Qn=Qn (Cell n−1)+(S1+S2) (Cell n)
    (C-3) Qn=5.6696 m
    Aperture rack Slope Length $2^{ND}$ Iteration: RA2=ΣQn+ W1/2+Spxmin RA2=29.4288 m
  By drafting results, we find RA2 length slightly more than required to eliminate mutual shading at given time.
  We can accept this to allow for earlier/later times to plan design limits, or we can run 3rd iteration.
Step 3: Run Third Iteration
  Continue by running the data results from the second iteration for a Third Trial. By running additional trial we 'shrink' the dimensions of the aperture assembly: simply run the values from Trial 2 using the same formulae described above.
    The resultant aperture rack linear dimension RA3 then becomes: RA3=29.3212 m
    RA3=29.3212 m from which the remaining dimensions are shown based on site-specific latitude
  Further iterations at this point are insignificant; this result we call acceptable.
4.126 Merge Summer & Winter Solstice Data: Optimize Dimensions of PLFC Array (FIG. 2G)
  By combining solar positional data from the summer and winter solstices, where the sun's azimuth at early am/late pm hours is at the maximum possible northern/southern extents, respectively, we simply merge the data from half of the summer values and half of the winter values to build an aperture assembly that is compatible with the two seasonal extremes and all days in between; that is, zero (0) mutual shading/blocking by adjacent cells 365 d/y. From this we build a 'merged' aperture assembly which basic parameters are shown Tangent Normal: Plane of Aperture Rack to Linear Receiver Tube:
  Hn=23.5150 m
Aperture Rack Merged: Summer & Winter Solstices:
  RA4=30.7756 m
Minimum Tower Height to CP Linear Absorber Tube ('=Hx at Cell 0, Cell 13):
  Hx=28.1023 m
4.127 Dim. Limits: PLFC Arrays Selected Cell Widths: (1.20 m<=W1<=2.50 m);
  If the primary cell sizes are changed, the solar plant dimensions will increase or decrease proportionately; the number of cells per array (n=12) being constant. In this design, the 2 m cell is selected in order to maximize plant aperture area, within limits of tower height constraint of <=30 m to center point of the linear absorber. For those applications where a smaller or larger plant-size is more cost-effective/feasible, the summaries are tabulated.

| Model PLFC Plant: Final design data for 2 m × 12-Cell assembly (AE = 24 m); (FIG. 2A, FIG. 2G): | |
|---|---|
| Aperture Rack slope length: | RA4 = 30.7756 m |
| Tangent Normal: | Hn = 23.5150 m |
| Minimum Tower height (zero-clearance, base C-12): | B, C = T = 28.1023 m |
| Tower ht. adjust.: 360° rotation, C-12 + 20 cm ground clearance: | Hy = W1/2 − sin φ (W1/2 + Spxmin) + 0.2 |
| Add ht. (Hy) so that lowest cell in array rotates 360°, with 20 cm min. ground clearance: | Hy = 0.5155 m |

| Model PLFC Plant: Final design data for 2 m × 12-Cell assembly (AE = 24 m), con't: | |
|---|---|
| Tower height adjusted: to center, linear absorber tube | T" = T + Hy T" = 28.6179 m |
| Tower height overall + insulation over 2ndary mirror assy. (W2/2) | W2/2 = 1.125 m Tn = 29.7429 m |
| Shade-value equiv. of 2ndary cell structure above lin. absorber assy | h2 = 0.25(W1) h2 = 0.500 m |
| Maximum assumed Receiver-tower profile height: | Tmax= T"+ W2/2 + h2 Tmax = 30.2429 |
| Horizontal width: @ base level of aperture assembly | WX = cos φ (RA4) WX = 25.7519 m |

4.128 Array-Set-Spacing: Tower to Tower Offsets (Centers)
  Tower (thence array) offsets in the north-south direction are based on shadows cast at 08:00 WINTER solstice, which we determine using the above table format. In this model, tower-tower centers are the preferred standard to base separation distances of adjacent aperture assemblies, because: (1) optimum noon beam irradiance during winter being much lower than at summer (503 W/m^2 vs. 842 W/m^2, respectively) makes it undesirable to add structural shading that further degrades the winter collection efficiency over the shorter, 8-h effective solar cycle, (2) the agricultural zones between the arrays (and within the array structures) are a principal basis behind the PLFC concept.

Given:
Θy='Y'-vector solar incidence<at TS=08:00 h, 21 Dec. 2015:
Θy=15.8590°
Maximum Tower/Trusses Profile Height:
Tmax=30.2429 m
Nominal separation dist. (offsets) between arrays in the solar field: Y"=Tmax/tan Θy Y"=106.46 m
Number of array sets/km^2: AS/SUA=1000 m/Y" AS=9.39 arrays 4.129 The End-of-Array Reflector: a Recovery Concept for End-Field Losses (FIG. 2A, FIG. 2B, FIG. 2H)

In the CLFR design of Mills & Morrison (University of Sydney), the authors' paper describes a stationary reflector installed as a wall running the total length of their array assembly on the south-side (southern hemisphere-justified) of their aperture rack, to recover low-angle beam irradiance which would otherwise be lost (FIG. 1). This structure intercepts these rays and reflect them to the nearest of the secondary concentrators which are spatially set at optimum centers, normal to, and along the entire length of the primary mirror assembly.

Due to the E-W alignment of the primary and secondary elements of the PLFC design, a different approach to this problem is necessary. At each array end-extremity (E, W) A single large reflector is attached to the aperture rack frame-end structure by hinges, and is designed to rotate 90° in range, from horizontal (stowed) position to vertical & locked (deployed), depending on which half of the day it is (FIG. 2A). This will reflect the low incident rays, otherwise lost, to the secondary concentrator. Example:
IF: Sunrise<TS<12:00 h, the cast-end-mirror is lain horizontally; the west-end-mirror deployed vertically.
IF: 12:00 h<TS<Sunset, the east end-mirror is deployed vertically; the west-end mirror is lain down horizontally.

**Method of operation: The end reflectors are raised/lowered using conventional hydraulic cylinders (FIG. 2A), or electric motors and cables. Alternatively, near GFH or PSH plants, the mirrors are operated using a small amount of the seawater bypassed through pipes from cold-water feed loop, which is already under pressure of several bar. In this embodiment, Cylinders, pistons and seals are comprised of corrosion-resistant alloys and latex rubber, or equivalent synthetic materials.

**It should be noted here that these end-of-array structures, along with strategically-placed high or low frequency acoustic devices and strobe lights, are also intended to prevent birds from flying into the solar field. Likewise, eliminating obvious hazards to civil aviation are duly noted.

4.X: Summary: Field Dimensions of Modeled PLFC Plant

At this point the summer field-energy potential and dimensions of the PLFC plant in an SUA can be summarized:
Net beam irradiance (Ia, b) range at aperture (TS=06:00-12:00): 190 W/m^2<(Ia, b) <842 W/m^2
Array total land area/SUA: 1 SUA=1 km^2: 10^6 m^2
Array-set offsets, tower-ctrs (Tmax=30.2429 m): Θy (08:00 winter=) 15.8590°; Y"=Tmax/tan Θy Y"=106.4577 m
Array-sets, No./SUA: nA=1000 m/Y" nA=9.39
Σ (ALL SETS) of aperture elements (mirror area)/SUA: AEtot=AE (1000 m)*nA AEtot=225,442 m^2
Land use factor: LUF=10^6 m^2/AEtot LUF=4.44
Energy received, range (Field potential TS=06:00-12:00): Ep=Ia, b*AEtot/10^6 43 MW<Ep<190 MW 4.13 The Linear Receiver Tube: Physical Data and Size Selection The selection of a single large-diameter linear absorber tube, oriented E-W in a PLFC array is made with the following design considerations:
Flow rates: low head-loss due to friction at any temperature, particularly as there are but four 90° elbows in array
Seawater media: Once-through flow of media filtered to <0.5 mm; or to acceptable particle size enabling extended periods of low-maintenance operation by the rotary expanders.
No "in-line" expansion joints: the absorber tube components are assembled using a unique flanged coupling (FJCX) (FIG. 7); resultant linear absorber is a virtually seamless >1000 m-long receiver assembly of individual 40'-long, butt-connected pipes.
**Alloy/composition: T317SS and multi-layer selective surface absorber, for optimum absorptance/emittance ratio. This is selected as a guide (template) for input in tables.
**In actual practice we select a lighter, higher-strength alloy with high titanium content to reduce the mass of the tube, or ceramic/ceramic-metal composite; with appropriate corrosion resistance the objective is to design an absorber tube with the thinnest wall possible, to reduce corresponding mass-load on towers and associated structural elements. This aspect not yet studied in detail.

4.131 Linear Tube Size: Select Diameter, for Given Concentration Ratio, Geometric (CRg)

A Fresnel plant design typically operates in medium temperature ranges; there are no heat exchangers involved, such as oils used in concentrating parabolic reflectors, only the fluid input media (seawater). A CRg of about 30 is typical in Fresnel collectors. The PLFC model plant is based on same, CRg being circumference-based, of the linear absorber tube.
Given:
PLFC Concentration Ratio design objective: CRg=30
(Effective Aperture)–(Estimated Avg. Shadow obstruction): (24 m-1.7 m) AE–Shx=22.3 m
DETERMINE: Nominal Pipe diameter (OD), and PLFC concentration ratio:
Solution:
IF CRg=30, find circumference of absorber tube (CP): CP=(AE–Shx)/Crg. CP=0.743 m
Rcv. Tube Diameter: OD=CP/T; OD=. 237 m (236.6 mm) nearest nominal ASA Std. size: OD=219.1 mm
Receiver tube is coated with selective absorber: absorptance a=0.91; emissivity ε=0.07; α/ε=13.0
Selective Absorber layer (assume ts"~4 mm); absorber tube adjusted OD (OD"): OD"=227.1 mm
Adjusted Concentration Ratio: CRg=(AE–Shx)/π*(OD"/1000); {0<Shx<1.7 m} 31.3<CRg<33.7

4.132 Linear Receiver Tube Physical Data:
Pipe alloy selected: T317 stainless steel.
Coefficient of thermal expansion (use mean values since T varies from Tamb=30° C. entrance, to Trcv=>550° C. at expander)
GIVEN: μ=17.21×10^-6 m/K: Ambient temperature: Tamb=303K; Mean working temperature along receiver tube Trcv.=603 K; ΔT=300 K
if ΔT=300 K, over entire length of linear absorber, receiver tube can expand ~5.2 m/1000 m. Following selection of the ASA standard size equivalent (for 8-in, OD=219.1 mm) we select the pipe alloy. The stainless steel conduit material was selected based on corrosion-resistance and properties calculated in the tables are meant to be used as a guide.

In ASME Tables (pipes) physical data for 6-in and 8-in nominal bore respectively, are shown.

Data Summary for 8" (DN 200 mm) Nominal Bore; S31700 Stainless Steel

Given
  Normal operating temperature range of media (seawater); degrees Celsius: $133°<T<200°$
  Design operating temperature limits: $Tx=1.5$ T: $200°<Tx<300°$
  Saturation pressure of steam Mpa(g): 1.55 MPa<Psat<8.49 MPa
  Operating Pressure (bar): Po=Psat*(1000 kPa/MPa)/101.325 kPa/std atm. 15 bar <Po<84 bar
  Maximum design temp. at receiver tube: Tr=CRo*Tamb, (CRo=optical conc. ratio: CRo=nopt/100*CRg); from Table 3.12: CRo=83.03%/100*CRg; CRo=28.98 if Tamb=30° C. Max design temp=869° C.
  Ultimate tensile strength of alloy T317 at maximum design temperature: S=148 MPa
  Factor of safety: f/s=1.5
  Corrosion allowance: tc=1.6
  DETERMINE: Pipe wall thickness calculated, and reduced to ASME standard pipe-size
  Tp=((Psat*OD*f/s)+(2*S*tc))/(2*S+(2*Psat*f/s)); For T=300° C.
  Tp=10.1 mm
  For nearest ASME standard pipe (Sch. 60), where OD=219.1 mm Tp=10.3 mm
  *The pipe wall thickness selected is 10.3 mm; inside diameter is ID=198.5 mm

*Additionally the linear absorber tube requires a selective absorber surface coating to maximize the solar absorptance ($\alpha$) and minimize thermal emittance ($\varepsilon$); in this model case, a ratio of 13:1. From section 4.31 above, we assume a selective absorber to be used has a thickness of:
  ts"=4.0 mm
  The adjusted receiver tube outside diameter thence is: OD"=227.1 mm
  Composition of the multi-layer absorber (Valleti et al. 2014): TiAlCrN/TiAlN/AlSiN 4.14 Optical Properties of Primary and Secondary Concentrators 4.141 Optical Efficiency:

Reflectance (herein called "albedo"—for ease in spreadsheets) primary and secondary concentrator surfaces are applied based on data from the Solarmundo facility in Spain (Haberle et al).

Given:
  Albedo, Primary Cell Elements: ab1=0.92
  Albedo, Secondary Concentrator: ab2=0.95
  Transmissivity, Glass Pane tr1=0.95
  OPTICAL EFFICIENCY: ηopt=ab1*ab2*tr1*100 ηopt=83.03%
  Energy received (Field potential) after optical losses: Efo=(Ep−LsNET)*ηopt In the model plan, energy received at TS=12:00 was 178 MW, after shade obstructions+20% structure; at 83.03% optical efficiency the energy received is further reduced:
  Efo=148 MW The concentration ratio is: CRg=31.6
The optical concentration ratio is: CRo=26.2

4.142 Absorber Tube Physical
  Absorptance Factor: $\alpha$=0.91
  Emissivity: $\varepsilon$=0.07

4.15 Energy Modeling:

The heat loss through the secondary concentrator assembly is non-linear, and increases exponentially with temperature-rise. By iteration we can arrive at a typical operating temperature for a PLFC plant. Example: At a temperature of 150° C. (423K), saturation pressure of steam is 2.45 MPa, well within the limits typical of operating pressures in rotary expanders. In addition to the absorber tube physical the following parameters are applied:
  Ambient temperature (summer: Tamb=) 30° Tamb=303 K
  Stefan-Boltzmann Constant σ=5.67*10^−08 W/m^2 K^4

4.151 Determine Maximum (Theoretical) Temperature at Receiver Tube
  Trcv=(Tamb^4+ηopt/100*(a/E)*(CRg/o)*Ib, a)^0.25 At TS=12:00,
  Trcv(max)=1507 K 4.152 Energy Balance at Receiver Tube at Maximum Trcv (Max) Temperature (Kelvin)
  Q"loss=ε*σ*(Trcv)^4; at TS=12:00, Trcv=1507 K, q*loss=20485 W/m^2, at which point
  Where Ct=circumference of linear absorber tube: Ct=0.7009 m
  Q*use=Ct((α*CRo*Ib, a)−(ε*σ*(Trcv^4−Ta^4)) Useful energy extracted=0 W/m^2

4.153 Select Plant Operating Scenario: Trial 1
  Trcv=150° C. (423 K)
  Useful energy extracted (TS=12:00): Quse=14268 W/m^2
  Energy extracted/unit length absorber tube: ep=Quse*Ct ep=10001 W; or, per 1000 m-long array, Ep=10 MW.
  Per SUA, useful energy extracted=9.93 array sets/km^2*10 MW/set Ep/SUA=93.9 MW 4.154 Determine System Efficiency: Trial 1 (Values*100):
GIVEN:
  Trcv=150° C. (423 K)
  Collector efficiency (TS=12:00): ηsol=ηopt*α−(&*σ*(Tr^4−Ta^4)/CRg*Ib) ηsol=75.21%
  Carnot (power) efficiency: Θrcv=1−Ta/Tr Θrcv=28.37%
  System efficiency: nsys=(ηsol)(Θrcv) nsys=21.34%

4.16 Energy Recovered by Linear Receiver Tube & Rotary EXPANDERS: 4.161 System Losses In this trial we select a nominal working temperature at the linear receiver of 150° C. Both the temperature and system operating pressure of 2.45 MPa are easily attained throughout the 10-hr summer-time production cycle (07:00-17:00); winter production is reduced to 8-hr as shown forthwith.

Given:
  Adjusted circumference of linear rcv. tube plus multi-element absorber: Ctx=0.7135 m
  Average shade blockage over primary cell elements: Snet=1.4779 m
  Adjusted concentration ratio range: CRg=(AE−Snet)/Ctx 31.6<CRg<33.6
  Net beam irradiance at TS=12:00 Ib, a Ib, a=842 W/m^2
  Design incident flux (June solstice): Ir=CRg*DNI; at TS=12:00 Ir=26.6 kW/m^2
  Absorptance factor (3-layer tube coating: TiAlCrN/TiAlN/AlSiN) α=0.91
  Emissivity: ε=0.07
  Stefan-Boltzmann constant: 5.67E-08 W/m^2·K^4
  Maximum temperature at receiver tube (reduced @ TS=12:00) Tmax=550° C. (823 K)
  $\dot{Q}$ use=Ct*((α*Cro*Ib, a)−(ε*σ*(Trcv^4−Ta^4))
  Reduced temperatures at receiver tube, by hour: by proportion apply design incident flux data: (Ir (@TS)/Irmax)*Trmax; where Trmax=550° C. 233°<Tr<550°

DETERMINE: energy recovered by expanders at nominal average working temperature.

STEP 1: Find Reduced Temperature of the Linear Absorber Tube Throughout the Production Cycle.

Reduction factor in DNI, cosine effect (Kasten-Young); TS=06:00-12:00 0.23<f(t)<1.00

At these hours the receiver temperature varies from 30°-550° C.; no recovery at hours of 06:00 or 18:00, when the sun's rays are parallel to the plane of the primary mirrors. At 07:00 and 17:00 h, the receiver temperature is at 233° C.; thus a working temperature assumption of 150° C. is acceptable.

Collector efficiency at determined DNI=851 W/m^2, at 0 m MSL (value check) is about 75.5%; result is acceptable: Likewise is the geometric concentration ratio:

CRg=-($\epsilon*\sigma$*(Trcv^4-Tamb^4)/(($\eta$sol-($\alpha$*$\eta$opt))*Ib)); 31.6<CRg<33.6 is in desired range.

STEP 2: Find System Efficiencies in this Model

Collector efficiency: $\eta$sol=$\eta$opt*$\alpha$-($\Delta$T$\epsilon$*$\sigma$*(Tr^4-Ta^4)/CRg*Ib) At TS=12:00 $\eta$sol=75.5%

Carnot efficiency: $\eta$car($\ominus$rcv)=1-Ta/Trcv $\ominus$rcv=63.2%

System efficiency: $\eta$sys=($\eta$sol)($\ominus$rcv) $\eta$sys=47.7%

STEP 3.1: Determine Heat Losses, Empirical Solution at Selected Working Temperature, T=150° C.

Delta-T from working temperature to ambient: =423 K-303 K $\Delta$T=120 K

Heat loss coefficient per unit aperture area: $\mu$=3.8*10^-4*($\Delta$Tnom)*(Ib, a) $\mu$=38

Unit areas of glass pane+2ndary mirror per linear-m: (Ap+Ah)=5.406 m^2/m

Heat losses, back-shell insulation: Unit area (Ai) behind 2ndary mirror (Ai=Ah); Ai=3.1562 m^2

Heat conductivity, insulation (Solarmundo): Hc3=0.05 W/m^2·K

Heat loss coefficient, insulation: Hi=Hc3*$\Delta$T Hci=6 W/m^2

Heat loss/unit area, (insulation+20% edges): $\mu$3=1.2 (3.8*10^-4*$\Delta$T*Hi); $\mu$ 3=1.04 W, say, 1W Heat loss factor at Delta-T nominal (120K),/linear-m (2ndary concentrator+insulation) $\mu$"=39 W/m^2

At unit-area of 5.4063 m^2/m, for 2ndary concentrator: total heat loss is: $\mu$tot=213 W/installed m.

STEP 3.2: Heat Losses, "Solarmundo"-Solution; Selected Working Temp., T=150° C. (Table 3.15 5/9-6/9)

Given:

Unit areas, glass pane (Ap) and secondary mirror surface (ah) (Ap+Ah) At=5.4064 m^2

Heat transfer coefficient, Ap, Ah: Hc1=10 W/m^2; Hc2=10 W/m^2,

Heat loss coefficients (Hn): (Hn)=$\Delta$T*(Hcn); Hn=1200 W/m^2

Heat loss/unit aperture area, glass pane & 2ndary conc.: ($\mu$1+$\mu$2)=3.8*10^-4*$\Delta$T*(Hn)*At ($\mu$1+$\mu$2)=296 W/lin·m Back-shell insulation: from 3.1 above, with 20% 'over-size': $\mu$3=1 W/m^2

Total Heat Losses by Secondary Concentrator is: $\Sigma\mu$=297 W/Installed m.

The Solarmundo model is based on actual array materials, conditions, and other data. In this model, select the more conservative result; thence total heat losses in the PLFC array is:

$\Sigma\mu$=297 W/installed m

In a 1 km-wide array, cumulative heat loss is: $\Delta$hT=$\Sigma\mu$ (W)*1000 m/10^6 W/MW $\Delta$hT=0.30 MW In a SUA field, (9.39 array-sets packed-density) the field heat loss becomes: $\Delta$hT (field)=2.79 MW 4.162 PLFC Power Production In our model, the "Trial 1" operating temperature for steam generation at the expanders is 150° C. Nonetheless, the actual applied temperature concentrated at the receiver is 550° C. at noon, in order that the seawater temperature be elevated to saturation temperatures and pressures in minimum time (flow rates vary considerably in accordance to both solar time and weather modifiers of net beam irradiance. At aperture-normal to the linear receiver tube (TS=12:00) the useful summer energy potential at both temperatures per SUA is 95.62 MW and 87.52 MW, respectively. Proceeding to the next step we select the lower of the two values (87.52 MW) for the following reasons:

Astigmatism: No corrections for divergence of reflected solar radiation from an ideal point are quantified in detail (though we assume a 50 standard deviation error factor in modeling, for this reason, and the following).

Caustic effects: At solar incidence/reflectance angles other than normal to the receiver, the concentrated rays form a caustic (spread-out pattern), rather than an ideal line (spherical mirrors) let alone point (parabolic cells) focus.

Unquantified: issues not addressed; dirty optical surfaces, miscellaneous external shadows from structural components: trusses and wires, etc.

4.1621 Net Useful Energy (Epnet):

Given:

Useful summer-solstice energy potential per SUA Ep=87.52 MW

Field-total heat losses by the 9.39 array-sets/SUA @ Tnom=150° $\Delta$hT (field)=2.79 MW Net useful energy produced/field at aperture normal: Epnet=Ep/SUA-$\Delta$hT=Epnet 84.73 MW It follows that the useful energy range/field during a 10-hr summer cycle is: 32.1 MW<Epnet <84.5 MW.

At a full 10-h production cycle, the SUA-field will average 62.8 MW, or 628 MWH/d.

4.1622 Land Use and Agricultural Resource:

Given:

Offset distance, tower, array-set "n"—base "n+1": Os=106.46 m

Effective aperture/array set (AE), where RA4=30.7756 m: AE=24 m

Land-Use-Factor (LUF): LUF=Os/AE LUF=4.44

Agricultural zone potential between array-sets: AG1=Os-cos $\varphi$ (RA4) AG1=80.71 m Ag-zone usable/array-set: AGu=AG1*nset*1000 m/(100 m)^2/ha AGu=75.81 ha Or: in acres, at 43,560 ft^2/acre, AGu=19.94 acres Vertical Farming:

The agricultural zone is expanded by emplacement of vertical farming structures or shelves under a major portion of the aperture assembly (FIG. 2B); high intensity hydroponic vegetables and partial-shade-loving plants (about 20 m width, allowing for minimum overhead clearance from the lower primary-cell rows).

Irrigation:

Irrigation of the agricultural zones between the CSP array-sets, and within the vertical farming structures is through appropriate diversion of distillate recovered through the MED plant; using sprinklers and/or drip-tube methods.

To clean the primary cell elements, distilled water is sprayed on the inverted primary cells at night to maintain optimum reflectance of the mirror surfaces. To this end, permanent tube lines and sprinklers are installed underneath the mirror rows. This method of cleaning results in recycling of the cleaning media directly to the irrigation of vegetables within the vertical farming apparatus.

4.1623 Energy Recovery by the Rotary Expanders:

Rotary expanders are selected over conventional turbines because of their robust design (two principle moving parts) ability to operate in ranges of low-moderate pressures, variable velocities, and lastly, operable in both dry or wet steam media, which otherwise are destructive to conventional turbines.

Given:

Net energy produced by SUA field to power block (Epnet): 32.1 MW<Epnet <84.5 MW

System Projected Efficiencies

| Screw Expanders (Isentropic) | $\eta i$ = 75% |
|---|---|
| Generators: | $\eta g$ = 95% |
| Mechanical: | $\eta m$ = 95% |
| Total: | $\eta tot$ = 67.7% |

Energy to Power Grid, Summer Solstice:

Ptot=Epnet*$\eta$tot/100  21.7 MW<Ptot<57.4 MW

Mean energy production/SUA, per 10-h cycle: $\overline{P}$=42.5 MW

In a high density field (61 m offsets) the corresponding production increases to:

Mean energy production/SUA, per 10-h cycle: $\overline{P}$=66.6 MW A gain of nearly 57%.

4.2 Desalination: a PLFC—Med Cogeneration Plan

From the aforementioned plans we develop a conceptual PLFC plant of 57 MW installed (summer-potential) per SUA. The next problem is to determine the amount of distillate production through an MED plant; relying in part on low-temperature waste heat from the PLFC plant, and as stored energy from the liquid-salts battery. Multi-effect distillation is a natural choice of cogeneration off of any Fresnel CSP plan. In fact there are ample sources of energy available to drive a MED, in which preferred maximum operating temperature to avoid scale buildup in pipes is only 72.5° C.; thereby being, with the exception of RO, the least thermal-energy-intensive means of desalination.

Potential Energy Drivers in a Med Plant (FIG. 3A "Overview")

| Direct Energy Sources | Description |
|---|---|
| PLFC low-temp Bypass | Route low-temp seawater media (70° C. < T < 80°) from PLFC to MED first stage |
| PLFC-Expanders | Waste heat from power-block: raise SW media temp to nom. MED 1st stage |
| Stored Energy | |

Molten Salt TES Liquid salt tanks (SITTES: ~450° C.); resistance-coils heat generated/local power grid.

Hydropower (PSH, GFH) Discharge seawater from storage capacity dams, off-hours cycles; power to MED External Energy Sources Geothermal Low-medium thermal resource (50°<T<) 80° to ORC plant and/or MED plant Alternate CSP 'Power-tower' CSP molten salts tanks: configure part to MED $1^{st}$ stage plumbing Nuclear Reactor coolant (molten salts tanks): route low-temp seawater to MED $1^{st}$ stage Solid Waste Incineration Environmentally approved combustion of biomass, municipal MED. waste; to ORC or Conventional (fossil-fuels) Obvious sources: coal, natural gas or fuel oil; not explained further at this point.

4.21 Desalination by Multi-Effect-Distillation (Med): Procedure

Determine cold-media flow rates into PLFC plant, using given feed pressures of seawater, and conduit sizes By iteration optimum velocity of SW media through linear absorber is 2.20 m/s.

This is determined by the ultimate balance of inflow pressure vs. back pressure when the receiver tube temperature is 150° C. at the far-end of the array.

4.211 Primary Losses in Plant, Cold-Water Feed, Head-Loss, Friction: hf

Given: Physical Data for the Model PLFC Field and Linear Absorber Tube (Type 317 Stainless Steel)

| | | |
|---|---|---|
| No. array sets/SUA | | ns = 9.39 |
| Nominal inside diameter: linear absorber tube | (Sched. 60) | ID = 0.1985 m |
| Cross-section internal area, linear absorber tube: | $Ai = \pi (ID^2)/4$ | Ai = 0.0309 m^2 |
| Fluid velocity, guess range for later iterations: | V | 0.10 m/s < V < 3.8 m/s |
| System fluid velocity, selected trial: | V* | V* = 2.20 m/s |
| Flow rate range in tables: | Q = Ai*V | 0.003 < Q < 0.118 m^3/s |
| | Q (trial V*) | Qv* = 0.068 m^3/s |

Maximum flow rate/absorber, before losses,/10-hour-day production cycle: Qd(m^3/d)=Q*3600*10

Qd Qd=2451 m^3/10 h

QT (24 h) QT=5882 m^3/d

Composition, receiver tube: Type 317 stainless steel (Schedule #60)

Gravitational acceleration (mid latitude, elevation, and local gravity anomalies): g=9.80 m/s^2

Static head, net: assumed typical A-h after losses, reservoir above PSH/CSP: h=100 m Losses, Head and Pipeline Lengths From ground elev. to absorber tube: hl1=28.62 m Gross static head to receiver tube centerline: hs=h−hl1 hs=71.38 m Pipeline length at nom. OD (ID=. 1985 m): assume L=1000 m+4 (hl1 equiv.) L=1114 m Seawater Physical Properties (Origin: Carlsbad, CA)

*Ambient temperature of seawater averages about 15 degrees Celsius in most of these plans. Assume 30° C. (summer-elevated) as a constant throughout year, as waste heat from various sources described below are used to maintain elevated system feed line temperature to CSP-field.

| | |
|---|---|
| Temperature, plant inlet (tamb), summer (tamb winter = *15° C.) | *tamb = 30° C. to CSP feed |
| Salinity: | Sa = 35.165 ppt |
| Density: | $\rho$ = 1021.77 kg/m^3 |
| Viscosity (absolute): | $\mu$ = 0.000861 Pa·s |
| Viscosity (kinematic): | $\nu = \mu/\rho$   $\nu$ = 8.43 *10^−7 m^2/s |
| Specific weight, seawater (35.17 ppt NaCl) | $\gamma = \rho*g$   $\gamma$ = 10,013 N/m^3 |
| N/m^3 | |

N/m^3

Receiver Tube Data: Fluid Flowing Full Through Conduit (Before Phase Changes Develop at Elevated Temps)

| | |
|---|---|
| Absolute pipe-roughness coefficient (T317SS): | ε = 0.045 mm ("commercial steel") ε = 0.000045 m |
| Inside diameter: | D = 0.1985 m |
| Relative roughness: | ε/D = 0.0002267 |
| Reynold's Number (flow is turbulent if NRe >~4000) | NRe = V*D/v; If V = 2.2 m/s NRe = 518,242 |

Friction factor (graphical: use Moody diagram): at 2.20 m/s, measure:
f=0.0155
Friction factor (empirical), Swamee-Jain formula: f=0.25/ (log(ε/(3.7D)+(5.47/NRe^0.9)))^2
Swamee-Jain formula: At 2.20 m/s result is:
f=0.0156
'f' (S.J.) is acceptable, and is used in all flow problems here; circular pipes, turbulent regime.
Head loss, friction, Darcy-Weisbach equation: hf=f*L/D (V^2/2 g); at 2.20 m/s: hf=21.69 m
Available head to power block prior to minor losses: h1=hs−hf; at 2.20 m/s: h1=49.69 m 4.212 Minor Head Losses Minor losses due to entrance/exit geometry, valves, pipe-bends, and other fittings take the form: hn=K(V^2/2 g), where each fitting has its own "K-value, based on commonly accepted values, or empirical (latter based on maximum friction value (f) determined @ V=0.10 m/s; therefore f = 0.0251). In our model, at the flow velocity of 2.20 m/s we determine:

| MINOR LOSSES | | hn = K (V^2 /2 g) *where V = 2.20 m/s appliedhn = K (V^2/2 g) | | | |
|---|---|---|---|---|---|
| Description Head-loss (adjust * 'n') | (Qty.) | K-Value (no. fittings) | Fiction factor (f) | 'n'-factor | K-value (multiplier) |
| Entrance tee (he): 0.372 m | (1) | — | 0.0251 | 60 | 1.505 |
| 90° bend, R/D = 2 0.168 m | (4) | 0.170 | — | 1 | 0.170 |
| Exit, power block 0.247 m | (1) | 1.000 | — | 1 | 1.00 |
| ¼- turn ball-valve 0.031 m | (1) | — | 0.0251 | 5 | 0.125 |
| Back-flow (check) 0.929 m | (1) | — | 0.0251 | 150 | 3.763 |
| Total Minor Losses | | | | Σ hn = 1.75 m | |
| Total Losses, Friction & Minor | | Σ hX = hf + Σ hn | | Σ hX = 23.44 m | |
| NET HEAD: COLD-WATER TO EXPANDERS: | | Recalling, net head before losses (h) h = 71.38 m ht = h − Σ hX | | ht = 47.94 m | |
| Net static head (bar): | | Ht (bar) = ht/10 m/std. atm. | | Ht = 4.79 bar | |
| System cold static pressure: | | Ps = ρ g h | | Ps = 480,075 N/m^2 | |
| System pressure at trial velocity (V = 2.2 m/s): | | P** = ρ gV h | | P** = 1,056166 N/m^2 | |

4.213 Media Flow-Through Absorber Tube at Steam Saturation Pressure
Given:
At Far-End of Linear Absorber Tube: (Use International Steam Tables)
  *Delta-h(m): to expanders unknown due to inlet geometry, plumbing: (assume 0 m) h2=0 m
  Work-temperature in model plan at entrance to expanders (far-end of absorber tube): Tr2=150° C.
  Saturation pressure in receiver tube at model temperature (TLV tables): Psat2=476,101 N/m^2
  Trial flow-velocity: seawater through linear absorber tube: V=2.20 m/s
  Absolute pressure If Psat=0.4761 MPa (a), P2 at expanders is 0.4761*10^6: P2=476,101 N/m^2
  **Density of seawater (sal.=35,165 ppm) at Tr=150° C. from CSG Network.com: ρ2=975.12 kg/m^3
  *There is a phase-change (1-g) at far-end of absorber into expanders; dynamics here beyond scope of this report
  **Assumed density of seawater in liquid state just before point of phase-change
At Entrance to Absorber Tube:
  Net head after losses (m); PSH dam to C.L. linear absorber tube: h1=47.94 m
  Ambient temperature of seawater media into PLFC absorber tube: Tamb=30° C.
  Density of seawater media (cold) at Tamb: ρ1=1021.77 kg/m^3
  IF: trial flow-velocity: seawater at entrance linear absorber tube: V1=2.20 m/s
  System cold pressure (net) at trial velocity (10.39 bar): P=ρg(V1) h P**=1,056,166 N/m^2
Find:
Velocity Limit Based on ΔP of Media Through Absorber Tube, where Temp at Far End of Linear Absorber=150° C.
By Bernoulli Equation:
  Psat(T=150C)=476,101 N/m^2; Static pressure at linear absorber entrance Ps=480,075 N/m^2
  (V2)^2/2+P2/ρ2+gh2=(V1)^2/2+P1/ρ2+gh1
  Reduces to: P2/ρ2=(V1)^2/2+P1/ρ1

Solve for V1, where ρ1 must=ρ2; (system back pressure to lowest energy level at Tamb=30° C.; =1021.77 kg/m^3)
(V1)^2/2=(480,075 N/m^2/1021.77 kg/m^3)−(476,101 N/m^2/1021.77 kg/m^3)
V1=2.79 m/s
At V1=2.79 m/s, maximum flow rate (no work) through a linear absorber (where I.D.=0.1985 m; Ai=0.03095 m^2):

$Q1=Ai*V1$ $Q1=0.0863$ m^3/s

At selected model trial velocity (V=2.20 m/s): $Q*=0.0681$ m^3/s

Above values are prior to work by the power block.

At T=150° C., at V=2.20 m/s, net pressure is: $Pnet=P**-Psat=(1,056,166$ Pa$-476,101$ Pa$)/10^5$ Pa/bar=5.80

Net system pressure (Cold SW feed media) at rotary expanders: $Ps1=5.80$ bar

At 150° C., there are 5.80 bar, or 84.1 psi net water pressure available by gravity flow to feed the expander machines at the power block end, for a plant which base elevation is 100 m equivalent below the nearest storage capacity reservoir. But with the system back-pressure of 4.76 bar reduces the velocity of seawater media accordingly:

$V=Ps1/p$ g h $V=(5.80$ bar$*10^5$ N/bar$)/(1021.77$ kg/m^3) (9.80 m/s^2) (47.94 m)

V=1.21 m/s

To maintain a media velocity of 2.2 m/s: add external energy to this effect: Pw=476,101 N/m^2

Or: Pw=69 psi 4.214 Parameters for Multi-Effect Desalination

Steam properties: over temperature ranges in PLFC & MED plants, determine absolute pressure, specific volume, and specific enthalpies (phase change from ambient temperature of liquid to boiling temperature in each effect). The data produced are from the International Steam Tables (TLV Co. Ltd.); cross referenced with Saturated Steam Table: Lalonde Systhermique. The author also uses simplified empirical solutions to the above as determined by M. Affandi et al: Simplified Equations for Saturated Steam Properties for Simulation Purpose. These solutions are within acceptable errors for most purposes; applied accordingly, to look-up said data instantly at any temperature without having to dig through the steam tables.

Absolute Pressure

In the PLFC plant the temperatures ranging from 50° C. to 300° C. are highlighted. Absolute pressures at boiling point are what are expected in a closed system at given temperature, for estimating material properties of pipelines and vessels. The expected maximum working temperature of 300° C. and ~8.6 MPa is the assumed upper limit (in this model) for plants using rotary screw expanders for power generation (re: OPCON).

Specific Volume

Specific volumes ranges are highlighted, from which the densities of the media, ρs (kg/m^3) are determined at any temperature and pressure. From this we can find the flow rate of steam through the linear absorber tube, in a schedule #60, 8-in nominal pipe (ID=19.85 cm, or 7.81"). The velocity limit of saturated steam through the pipe is:

$Vmax=P(a)/(\rho s*g)$

In the first stage of the MED plant: T=72.5° C., P(a) 34.718 kPa

Vmax=16.15 m/s

Mass Flow Rate In following assume 1 m^3 media=~1 metric ton $m=3600*(V/Vg)*(\pi*D^2/4)/1000$ kg/t at first MED stage at 72.5° C.: ṁ=0.394 t/h At 16.00 m/s ṁ=0.3911 t/h; at 18.00 m/s ṁ=0.4399 t/h. By interpolation, at 16.15 m/s m =0.394 t/h 4.215 Model for Med Desalination: a 12-Stage Plant FIG. 4A MED as an Energy-Efficient Desalination Alternative The MED process works by pumping heated seawater (hot-media) as a steam or *liquid (*FIG. 4A) into the first of series of 12, or "n" consecutive stages or "cells" (effects) maintained at lower levels of temperature and pressure, from the first stage (hot) to the last stage (cold). Each stage is a pressure-vessel of consecutively reduced atmospheres, containing a horizontal copper-tube-bundle, over which cold seawater is sprayed; the seawater flowing by gravity through the intra-spatial gaps amongst the tightly-arranged tube coils. Heated seawater (our model) is piped into the first-stage tube-bundles from an external source at a fixed temperature of, but not limited to T=72.5° C., above which temperature-related scale deposition rates in the cell-plumbing may (or may not be) acceptable. The tubes are cooled externally using sprinkler heads positioned above the tube-bundles, by the cold makeup (ambient temperature) seawater (say, 15° C.<T<20° C.) which rate is set by the "seawater-in" from outside source; passed though the heat exchanger core in a condenser at the tail-end of the MED plant and sprayed evenly over the copper-bundles in the first through $12^{th}$ effects where it flows by gravity towards the bottom of each effect.

In each effect, the sprayed seawater heats up and partly evaporates by recovering the heat of condensation (latent-heat) as it flows down through/around the higher temperature copper tubing. This vapor produced is at a lower temperature than the heating media within the tubes but still high enough that said vapor is used as heating media for the next stage, where the process repeats at a lower pressure. The energy produced by the steam media in the first cell is passed on to second, and supplies the energy for this and latter stages, where the pressures and corresponding boiling points are lowered to the design limits set for each effect.

Fresh Water Recovery

From the first effect, vapor is drawn into the second stage through a conduit passing through the "cell-wall", into a similar copper bundle, where it is used as heating media for the next effect where the process is repeated, but in the, $2^{nd}$ through $12^{th}$, or nth stages, and condenser, desalinated media at the "cold" end of each tube bundle is condensed and recovered as distilled water, which flows though separate pipelines to a collection reservoir for domestic/agricultural consumption. By reducing the atmospheric pressure in each stage using exhaust (vacuum) fans, the boiling-point temperatures in each effect is correspondingly lowered, setting the stage for the seawater media to flash to steam, which then passes on to the next stage, where at a saturation temperature and pressure conducive to the lowered boiling point in the corresponding effect, the process continues, where the distillate condensed on the cold side of the tube bundles in each stage, recovered as illustrated (FIG. 4A).

In the MED first stage the heated seawater, hot-media, is continuously recycled through a SITTES eutectic-salts battery, or supplemented from the low-end temperature loop from the PLFC CSP plant, from which the desired inlet temperature (T=72.5° C.) is maintained continuously. Other than at this first cell, there is no further demand for external thermal energy-input in the entire MED process.

Brine Separation

The media not evaporated in the 1st through $12^{th}$ (or nth) stages concentrates slightly, producing a brine which collects at the bottom of the tank-stage or cell, where it is externally collected though separate plumbing, to be returned to the ocean source, made economic uses of through evaporation pans, or otherwise dispensed (i.e. geothermal injection wells). Further energy recovery from this end-function is made possible by method of MEDX described herein:

4.216-1 MEDX: a MED-Extended System Utilizing a Free-Flow-Through Process for Thermal-Energy Transfer. (FIG. 4B)

A system for increasing the efficiency of the MED plant without expending further external-forces and heat into system other than that input energy into the first stage is shown in FIG. 4B, illustrating the modified MED or MEDX concept, which makes use of the residual heat in the (brine) collection-baths at the base of each MED-effect. As said brine-temperatures prior to discharge to return to ocean or other source are equivalent to that of their respective effects (FIG. 4A), thermal energy (or waste-heat) is lost from return-cycle of brine as the plumbing returns said brine to outside environment.

FIG. 4B illustrates a simplest-case MED-extended recycle loop system wherein plumbing, of one or plurality of conduits of (but not limited to) same, internal diameter is connected to outflow conduit(s) from the MED first stage, and passed through the water-tight walls of remaining effects in the MED system, thence at final stage, the plumbing is looped back 180 degrees and returned, fully immersed in said brine-collection baths, before it is reconnected by second tee to the seawater recycle loop just afore of the first-effect (FIG. 4B). As the first stage input-media is seawater (1), and not gas-phase as in other MED systems, the heat-loss through the exchanger core at first effect is low by design; by passing this thermal-energy on, by gravity-flow, (and nominal extant water-pressure from said first-effect) through the remainder of the effects in the MED plant, heat is transferred from the outbound and return-portions of said plumbing, through the brine-solution "rain" and baths, respectively, in each stage. This resultant temperatures in each brine-bath are raised several-degrees-Celsius; in accordance to $\Delta T$ (input-temp.-ambient-temp. in each effect) and flow-quantities of seawater media through recycle-loop therein. Resultant heat-transfer produces additional water vapor pressure in each effect, from which we add of one or more stages to the MED plant system, thence increased output of distillate from said MEDX-system, accordingly.

One embodiment of the MEDX system is: utilization of one or plurality of short-loop-return-conduits (FIG. 4B) emplaced within all-stages past first-effect, connected by tee-connections and corresponding gate or ¼-turn valves, wherein purpose is to evenly or differentially distribute, regulate, and adjust flow-quantities to remaining selected, or totality of, consecutive-stages, of the recycled seawater media; causing the internal temperatures and respective vapor pressures to be raised further in said stages, and thereby causing the internal temperatures and respective vapor pressures to be raised further, and utilizing only the extant latent-heat of the brine-reject media for energy, thereby extending the MED system by one or more stages, and producing more distillate, therein (FIG. 4B)

A further embodiment of said MED-extended recycle-loop is to submerge both the out-bound and return-plumbing fully within the brine-solution baths in each stage; and is compatible to functioning in conjunction with the above-described-system and embodiment thereof (FIG. 4B), simply by raising the level of the brine-solution baths in each effect such that the out and return-flow plumbing is submerged in entirety.

At terminus of either the basic MED facility or MEDX system-plant, a final cell ($12^{th}$ stage; or nth stage), is a condenser-tube-bundle positioned within a large vessel, which is in place to accept the steam produced from the last effect of MED or MEDX system; this is recovered as distillate by simply pumping the cold seawater feed-media of typical-range being, but not limited to, 15°-20° Celsius, into the MED plant through this condenser vessel, wherein said condenser-bundle is submerged, after which the fresh-water condensate is plumbed to the same collection facility as the distillate produced in the earlier stages. (FIG. 4A) & FIG. 4B)

The plan described herein uses 12 cells for illustration. In this final analysis of modeled plan we use 20 effects.

In system schematic illustration herein (FIG. 4A), beginning in the first effect at 72.5° C. depressed boiling point, the absolute pressure is only 34.73 kPa. In each stage as the boiling point decreases corresponding to the reduced pressure in each cell, until, by the 12th effect (T=46.5°) it is only 10.36 kPa (a); in contrast to the standard 1-atm benchmark of 101.325 kPa.

Specific Enthalpy at MED Phases

*Note: by applying the Affandi empirical solutions shown in the EXCEL spreadsheets section, we can use with confidence the corresponding values for absolute pressure, and specific volume for specific conditions in the MED plant.

Specific enthalpy, or heat required to raise 1 kg of seawater media to steam at boiling point is defined as 'hs', where:

hs=hl+he; where, in our model hl=t ambient hl=specific enthalpy of a media (liquid) from 0° C. to 30° C., and he=specific enthalpy of evaporation from 30° C. to saturation point of 72.5°. Because the ambient temperature of the seawater feed media throughout the year is maintained at this level due to natural summer-time heating, and recycling of waste heat from the PLFC-MED plants or the alternate energy sources described, in our model:

hl=0 kJ/kg; therefore, specific enthalpy of steam at 72.5° C. is: hs=2327 kJ/kg.

Distillate production: MED thermal energy (Pt) to produce 1 m^3 distillate at the first stage is:

Pt=hs/3600

Or: since 1 W=1 Joule/s, Pt=hs*(1 kW·s/kg/(3600 s/h)

Pt=0.646 kW·h/kg

A check calculation using data tables in Handbook of Engineering Fundamentals ($3^{rd}$ Edition); (Eshbach) converting from English units (BTU) arrives at a slightly different value, which is an acceptable industry standard, where:

hs=2326 kJ/kg. We continue on using this value, where Pt also is

Pt=0.646 kWh/kg

From which it takes in the model-plan MED first effect:

Pt=646 kWh/m^3

4.216 Desalination Power Losses: Single-Stage Thermal Plant

In a conventional thermal distillation 'still' the amount of energy required to desalinate large volumes of seawater is shown. For daily production of only 10,000 m^3/d, (~417 m^3/h), it takes 269 MW of power:

EP1=(0.646 MWh/m^3*10,000 m^3/d)/(24 h/d)

EP1=269 MW

This shows that using heat energy alone for desalination is an inefficient process.

4.217 MED Desalination: Advantages to the Multi-Effect Thermal PLANT

Advantages of MED distillation are illustrated, in which the range of effects in the MED plant ranges from 10 to 25 stages. The more stages in a plant generally provides a more efficient process, keeping in mind that there is a trade-off point where the costs of construction of excessive effects and associated infrastructure outweighs the potential advantages of MED plant power consumption. This topic is beyond the scope of this report, therefore, the author assumes a model plant of 20-effects; similar to several operating desalination facilities in the Persian Gulf.

Description of Process

Production limitations of a MED plant are defined by Performance Ratio (PR), and Gained Output Ratio (GOR).

PR=kg distillate/2326 kJ heat consumed, where hs: (2326 kJ/kg), is the specific enthalpy at saturation pressure and temperature (T=) 72.5° in the first effect:

$$PR = kg\ distillate/hs$$

In the conceptual plan, the results of MED production based on PR ranges from 1 to 20 are shown. Based on these, the production rates of distillate in kg/h is:

FW=PR*hs from which in our PR ratio of 16, our objective production rate is: FW=37,216 kg/h The actual number of stages (n) in a MED plant is determined by GOR, which is generically factored by 0.80 to 0.85 in industry applications (select 0.80 in model).

n=GOR/0.8 our model plant having:

n=20 effects

Thermal Energy Consumption (Et):

Since no external heat is added to the process after the first stage, the energy consumption decreases per unit volume FW produced, the power in subsequent stages being used in evacuating the air to the nominal saturation pressures to their respective temperatures in each vessel, and for pumping seawater to be sprayed over the heat exchangers within the corresponding vessels (FIG. 4A), (FIG. 4B).

Where PR=16: Et=(hs*1000 kg/m^3/16)/(1000 kJ/MJ) our MED plant consumes: Et =145 MJ/m^3 FW If the power plant efficiency=(η %), the MED work equivalent (W1) in kWh/m^3=: W1=(ET(MJ/m^3))/3600 s/h)*(η %/100)*1000 kW/MW If η=30%: W1=12.11 kWh/m^3 in a 20-stage MED plant Parasitic Losses (Pumps, Decompressors, Misc. Power, Etc.) (W2):

Industry standards range from 1.5 to 2.5 kWh/m^3. Even though in our model, the assumed pressure of the SW feed media is augmented by gravity-flow. In any case, we assume the adverse scenario: W2=2.50 Wh/m^3

It follows: total equivalent work equivalent to desalinate 1 m^3 seawater is WT:

WT=W1+W2 The 20-stage model plant consumption rate is: WT=14.61 kWh/m^3

4.3 Summary: Med Desalination Plant Objectives

Initially, a standard unit production volume of 100,000 m^3/d distillate production is planned. Ultimately, a resource is provided by a 16-SUA solar energy park to meet the needs of 1-million persons.

Given:

A 20-effect MED plant

Total work equivalent per cubic m. distillate:

WT=14.61 kWh/m^3

Power required to produce 100,000 m^3 distillate per day:

Pa=(WT/1000 MW/kW)*10^5 m^3

Pa=1461 MWh/10^5 m^3/d

The installed capacity required/10^5 m^3 fresh water is accordingly: PMED=Pa/24 h/d PMED=~61 MW; or equivalently, lost power potential/1000 m^3 distillate produced: PE=0.61 MW/1000 m^3.

Mean CSP power delivered per SUA during EQUINOX mean solar flux, at 33.2° N site latitude:

PEQ=32.70 MW.

Determine:

Minimum area for the CSP plant applied to distillation of 10^5 m^3 seawater is:

$$A^* = PMED/PEQ$$

Thus it takes ~1.9 km^2 of solar energy collection area (including offsets between the PLFC arrays)/100,000 m^3 distillate produced. Put another way, if our SEP is in an intermediate-phase of construction, say, 9 SUAs, the MED share of power from this field is only 21%, thereby enabling most power from the PLFC plants to be distributed to other community requirements.

4.31: Desalination Objectives

From USGS 2016 data and other sources the per capita water consumption rate of five leading industrial nations averages about 439 l/d. This is non-weighted; data shown is skewed heavily to US demand, reflecting that requirements of this resource in communities in desert and Mediterranean-vegetation zones are more significant than those populations in temperate climates. Based on this 439 l/d consumption rate, a community of about 228,000 persons is adequately provided for with fresh water.

By expanding our population base to 1-million people, the production volume of distillate becomes 439,000 cubic meters during a typical equinox-equivalent calendar-day, keeping in mind the necessity of battery-storage and alternative energies described for night-time and inclement weather cycles. About 8.18 SUAs are dedicated to distillate production (round up to 9 SUAs); thereby in our ultimate 16 SUA SEP, more energy can be applied to fresh water production for a larger population base (1.8 million people maximum), or diverted to electricity for the power grid. In the model objective of providing water for a million people, the MED plant share of installed capacity, of total power is 267 MW.

4.4 PLFC and MED Share of the Solar Energy Park Power-Plan: Summary

During a typical Equinox day, at latitude 33° N In the Salton Basin, California, beam solar irradiance is determined to deliver 32.7 MW of power to grid per km^2, by CSP, specifically, ~9.4 inclined arrays×1000 m-long Polar Linear Fresnel Concentrators (PLFC), each of 24 m effective aperture. Objective of the entire plan is to provide both electric power to the grid, and fresh water for the needs of a million persons.

An ultimate energy field of 16 km^2 (16 SUA) under PLFC array-sets plus a nominal width for intense agricultural fields (~80 m between sets), is planned for the multi-use SEP. An additional 20% land area at strategically-placed intervals in the collection fields, dedicated to power blocks, liquid-salt battery storage, power and pipeline-infrastructure, and desalination plants, results in a gross SEP area of 19.2 km^2, under solar power, as shown. Through cogeneration using pumped-storage hydropower (PSH), geothermal, and other conventional or non-conventional heat sources, including Organic Rankine Cycle plants (ORC), dedicated to energy recovery from low grade heat, the total output of our SEP is summarily increased, depending on the number of said cogeneration sources.

Given:

Equinox mean delivered power/SUA (PEQ)=32.7 MW

Ultimate installed capacity (16-SUA SEP)=523 MW'

Per capita energy share: 10,500 kWh/pc/y; from Basque Ctr. for Climate Change, Bilbao, Spain (4500<pc<10,500). Select highest value in anticipation of higher consumption rates in arid regions.

Determine:
Size of community served by the Modeled PLFC power plant and the MED infrastructure planned therein.
Average electricity use: Watts per person: Wpc=(10,500 kWh/pc/y)*1000 W/kW/(365.25 d/y*24 h/d)
Average electricity use: Watts per person: Wpc=~1198 W per person Community Size Served by CSP:
Per 1 km^2 SUA: px=(32.7 MW/SUA*10^6 W/MW)/Wpc
Px=27,300 persons; or,
Per 16 km^2 September: PX=population of ~437,000 people MED power share to desalinate 439,000 m^3 seawater daily, to provide for 1 million people. From, we found that it takes about 8.18 SUA under CSP dedicated to MED, of thermal energy and parasitic losses to provide water needs for a million inhabitants. This could be achieved in an intermediate-sized SEP of 9 km^2, using about 91% of the field for this purpose; keeping in mind that after a normal mechanical availability of specific components of the SEP park is figured in, 100% (or more) of this field will be required for this function. By ultimately expanding the SEP to 16 km^2 under arrays, 51% of the total collector area is used for MED, noting that with the larger SEP-field size, power from adjacent PLFC assemblies can be 'borrowed' to offset the losses incurred due to planned/unplanned maintenance issues.

Summary PLFC Direct Power Generation and Med Water Production (PR=16; 20-Stage Plant)

| Equinox Power-Share Per SEP /pc/y W/person | Ultimate SEP Per Capita Mean Deliv. Nearest (32.7 MW) PEQ | Installed cap. SEP Power (523 MW) PSEP | Continuous Energy Share /SUA | No. Persons Served Power use PSEP = 16SUA 9 SUA 16 SUA Epc Wpc | Per SUA | MED kWh |
|---|---|---|---|---|---|---|
| Px* Psn/SUA | f1 Psn/SEP | FT MW % | MW % | | kWh/pc/y W | px |
| 32.7 51 | 523 | 10,500 | 1198 | 27,300 | 436,797 | 91 |

Notes:
The 16-km^2 September produces 523 MW of power to 437,000 people, of which 51% of this amount is allocated to desalination, to meet the requirements for a population objective of 1-million people. To meet the electrical demands (power, lighting, HVAC) for the balance of the 563,000 persons the renewable sources tapped to this objective and discussed above, which are not quantified here, are more than enough to accomplish the 1-million population objective (by up to an order of magnitude or more). Reiterating they are:

Gravity & Pumped Storage Hydropower: from the nearest sea or gulf (Mediterranean-Dead Sea-Gulf of Aqaba); 5000 MW. (Re: MEECAPP PART 1).

Pumped Storage Hydropower: from nearest ocean (Pacific-staged reservoirs-Salton Sea-Laguna Salada-Sea of Cortez); 4000 MW (Re: MEECAPP PART 2)

Geothermal: Coastal resources available: Texas Gulf Coast, California Imperial Valley to Mexico's Sea of Cortez. Inland geothermal resources: USA Great Basin (NV, UT) and Northwest (OR, ID, MT, WY), and Southwest (AZ, NM, CO); where high, medium, and low-temperature brackish water media (substitute for seawater) from the geothermal field produces the energy driver, and the resultant potable water supply through MED desalination.

Waste Heat: Organic Rankine Cycle; low-temperature ranges (50° C.<T<100 C°, in general). Recover waste heat from oil fields in S. California (Re: Screw Expander Applications in Geothermal Power . . . China; YU, Yue-feng, et. al.). Other potential industries or utilities, include biomass from wood-waste and other natural fuels, solid waste incineration near large population centers, and metals-fabrication plants.

Nuclear, coastal sites: Eliminate waste-heat stream from the power block/cooling plant into the nearby ocean or river, by diverting said stream to an ORC plant attached to the nuclear facility, or integrate MED desalination infrastructure into said facility.

Eutectic liquid-salt batteries: SITTES liquid-salts storage (m.p.<=~400° C.); using nitrates (xNO3), chloride-salts (MgCl2, LiCl, NaCl), and other high-temp. phase change compounds, as investigated by University of Wisconsin, INEL, and NREL for both CSP and NGNP reactor coolant applications, in order that such eutectic salts attain, and remain in liquid phase at temperatures much lower than the singular equivalent metallic compound (i.e. MgCl2: m.p. =714° C.). Such liquid-salts TES batteries are built using high-temperature CSP ("power-tower") tank-storage, any number of conventional power sources (heat produced using electric-resistance coils in the TES), or from reactor-coolant in said nuclear power plant.

4.5 Disposition of Distillate During Periods of Excessive Precipitation Cycles

Given that the key objectives of CSP power are met and with co-generation from other sources, and the potable water needs of at least a million persons are satisfied, the inevitable question arises: do we simply idle the MED plant during times when regional precipitation events provide an overabundance of rainfall?

No. We do store all of this fresh water in anticipation of future extreme drought cycles, everywhere:

Fresh Water Storage Solutions 4.51 Surface-Storage

Agricultural ponds and lakes: divert available excessive resources to intense sustainable freshwater aquaculture facilities (fish-farms).

Natural drainages and wildlife habitat: recharge streams and natural sinks to restore habitat degraded as a result of human population pressures; prior over-consumption of resource.

4.52 Underground Storage

Underground water storage provides an advantage over surface capture and storage of water in to reservoirs: there are no evaporation losses.

Underground Banks: underground banking, by drilling injection wells (or repurposing existing well sites) into depleted aquifers, and pumping large quantities of water surcharge from nearby reservoirs into the strata therein during flood events is a process which should have been implemented in the central and south-western United States in the first-half of the 20$^{th}$ century, as large regional underground basins, such as the US Midwest's Ogallala Aquifer, and beneath California's Imperial Valley, have suffered severe depletion due to excessive pumping rates from the agricultural and urban sectors; in some regions the water table has been depressed at rates of >100 meters per century. Water injection wells provide a long-term solution to restore these and other agricultural regions. Desalination of both seawater and brackish water (from inland sources) by MED is the most environmentally acceptable way to this end.

Unlike RO (300 ppm<TDS<500 ppm, nominal), the MED technologies for seawater/brackish water desalination is a superior technology to this objective, since as explained in text, the total dissolved salts in the final product is a low as 10 ppm; mitigating the possibilities of further concentrating salts into aquifers already having high TDS content. Furthermore, whereas direct capture and injection of water from surface reservoirs may require settling ponds and filtration to remove organic matter and other suspended solids prior to pumping the product back into the water bank, The MED surplus product is stored underground with zero processing costs beforehand.

5. Discussion: Description of Process (FIG. 3A; FIG. 3B)

The PLFC and MED processes, and related technologies described, are shown as a flow-path schematic is illustrated in FIG. 3A. FIG. 3B is a block-diagram, where aspects of the processes are tagged and numbered, and described accordingly, and includes a MED Extended-Liquid-Media-Recycle-Loop (MEDX), which features are more explicitly shown in FIG. 4B. Energy-system flow-path: Pacific Ocean-Salton Sea-Laguna Salada-Sea of Cortez.

5.1 Cogeneration and the Polar-Linear-Fresnel-Concentrator: —Background

Our planet faces a continuing crises of water shortages, from mid-latitude Mediterranean to tropical-desert vegetation zones, in both the northern and southern hemispheres, and affecting large segments of the World's population, in First, Second, and Third-World economies. In numerous countries, the lack of readily available safe fresh water for both direct human consumption and the agricultural sectors has reached critical levels, at which point civil unrest and armed conflicts between competing nations become an unacceptable norm; the continuing strife in the Middle East, and amongst populations in Saharan and Sub-Saharan Africa being notable manifestations of these outcomes.

One way to address these crises near coastal population centers with significant, mountainous topography above sea level in proximity to these cities (where many of these economies are situated) is to construct pumped-storage-hydropower (PSH) facilities which, during off-demand cycles (i.e. night time) reversible reaction (typically, Francis) turbines are used to pump massive volumes of seawater through underground tunnels, (or aqueducts) to large, fully-lined, using appropriate earthen-materials, concrete and/or high-density-polyethylene (HDPE) or like, synthetic liners, to reservoirs up to 100 m to several-hundred meters above sea level, in one or several stages, to store this seawater. During daytime peak demand, when air conditioning and industrial activities are a large part of the energy consumption profile, a major portion of the stored seawater behind the dams is released through these aqueducts, where, after bifurcating into smaller diameter penstocks and ultimately through manifolds, it drives the turbines, generating power through generators in an underground power facility, thereafter connected by power cables to transformers and powerline infrastructure above ground, to serve the local population.

In the design of the PSH reservoirs enough excess capacity is planned so that during daytime drawdown cycle, for optimum performance the head available to drive the Francis turbines never falls below 60% of nominal; ideally, reservoirs are of large enough capacity (say, 80% or even 90% at minimum drawdown), such that functions in addition to power generation be served: (1) plan designs which allow for sustainable seafood fish-farming (mariculture) to serve the local populations (2) divert a calculated amount of seawater through one or more large diameter; (typically D=2 m), fiberglass-reinforced-polymer (FRP) pipelines to a solar energy park (SEP) comprised of from four (4) to sixteen (16) 1 km^2 collection fields applying Polar-Linear-Fresnel-Concentrators (PLFC), for a Triad function of: generating solar-thermal electrical power, desalinating seawater, and developing an agricultural/mariculture infrastructure within (and outside) the SEP.

The principle two functions of the Polar-Linear-Fresnel-Concentrator (PLFC) solar-thermal plant are to (1) produce energy though direct wet or dry (gas-phase) steam generation (DWSG), using screw-type rotary expanders, and (2) desalinate seawater using multi-effect-distillation (MED); one of the most time-proven and least energy intensive desalination methods in the Persian-Gulf nations, today.

5.11 The Rotary Expander (DWSG) Dry/Wet-Steam Screw-Expander Generator

The twin-screw rotary expander is an assemblage of two components, male and female intermeshing helical parts composed of corrosion-resistant alloy, carbon-composite, or ceramic (physical-design is not addressed here), similar in operating-principle to rotary screw air compressors used in blast hole drills in the mining industry (Ingersol-Rand, Gardner-Denver, and others). The compressor operation basically operates thus: two interlocking helical assemblies, one 'male'-component comprised of typically four lobes, and one 'female' component comprised of typically six flutes are mated just precisely enough to each other, and within a partially oil-flooded casing, which powered by a diesel engine, are rotated at sufficient speed allowing air to be drawn into the machine. As the air is drawn in, flowing towards a compressed air tank reservoir the volume of air decreases rapidly as the twin 'screws' rotation causes the volume to drop to near zero at a discharge. The resultant air pressure increase at the compressor's discharge point provides the work to operate the drilling machine, using the air-driven potential-energy stored. This function in drilling equipment is to both apply power to a reciprocating down-the-hole hammer tool, thereby enabling a 'button-bit'-tungsten-carbide embedded steel bit-head to penetrate through hard-rock strata, breaking a column of rock beneath the bit into small chips (cuttings), and which, using a volume of air under high pressure (typically 900 cfm @ 300 psi) delivered by said rotary compressor, down through the outer annulus of a double-wall drill pipe, through orifices in the bit-head assembly, thence providing the energy to lift said rock-cuttings through the center of said double-wall pipe, from which cuttings are deposited in a pile around the blast-hole collar at ground level. Typically, in such systems, the air pressure delivered to both drive the drill hammer and clear the blast-hole/blow the cuttings to the surface exceed exceeds 20 bar (2026 kPa).

The Rotary Expander: Synopsis

Operating principal of the rotary expander herein described is similar to design by Richard Langson, as described in Langson Energy's STEAM MACHINE™ concept; Publication number US20140284930 A1, Application number U.S. Ser. No. 14/086,796, Filing Date Sep. 25, 2014. The energy profile of the rotary expander is a reverse process of the mechanics of the rotary air compressor, in that the screw expander enables saturated dry steam or wet, two-phase media (gas and water droplets) energy at variable temperatures (72.5° C.<T<) 300° and pressures (38 kPa<P (a)<8587 kPa) to flow through the rotary machine; losing energy as it does so, the expanding air cools, and the water vapor flashes to steam, turning the two intermeshed helical screws, which in turn are coupled to a drive shaft which turns one or more rotary generators.

each of the two elements, bearings, and housing are very fine, the two interlocking helical parts are subjected to partial liquid-flooded cooling, whereas similar to the design of the oil-cooled air compressors in the blast-hole drills, a portion of the expander assembly is immersed in the seawater/saline media, to provide the protection from friction of the parts therein; ATF or other petroleum based liquids are precluded here, as such lubricants necessarily do cause contamination of the desired distilled water end-product.

5.12 Description of Concept (See FIG. 1, FIG. 2A)

The description of the PLFC concept is described in detail above, under Section 4:

Procedure

TABLE 5.11

GENERAL COMPARISIONS OF 3 CSP TECHNOLOGIES

| ITEM | PLFC | CLFR ™ | PARABOLIC TROUGH |
|---|---|---|---|
| Type: single axis | Polar: N-S rotation | Polar: E-W rotation | Planar: N-S or E-W |
| *Concentration Ratio (CRg) | $30 < CRg < 60$ | $30 < CRg < 60$ | $30 < CRg < 100$ |
| Temp.—range at receiver | $50° < T < 550°$ | $50° < T < 500°$ | $100° < T < 600°$ |
| Working temp., media | $100° < T < 350°$ | $150° < T < 350°$ | $100° < T < 600°$ |
| Media Type | seawater, brackish water | freshwater | oil (SAE 20)/fresh water |
| Media flow stream | once-through | recycled | recycled (heat exchanger) |
| Heat Exchanger(s) required? | N, Y (ORC) | N, Y (ORC) | Y |
| ORC compatible? | Y | Y | Y |
| Supplemental energy | PSH, geothermal, salts (1) | coal, natural gas | natural gas |
| Primary engine | rotary expander | turbine | turbine |
| Alternating cell tracking? | N | Y | N/A |
| Secondary concentrator | hyperbolic cylinder | trapezoidal | N/A, trough is concentrator |
| absorber tube position | stationary | stationary | tracking, w/ trough assy. |
| Linear absorber tube | single: horizontal | multi: vert. & horiz. | Single: horizontal |
| Supplemental reflector | 2 rotatable E &W-end (field) | 1 stationary N. side | N/A |
| MED compatible | Y | Y | Y |
| *Range: primary – 2ndary | $hx(C-0) < hx < \cos \varphi(hx)$ | see FIG. 1 (50-m CLFR ™) | N/A |
| Range (model design) | $23.5\ m < hx < 28.1\ m$ | $10.1\ m < hx < 37.8\ m$ | N/A |

*where hx = center line distance from nth primary cell to receiver tube center point Furthermore, the expanders can be run at variable temperatures under wet (two-phase) steam conditions, below saturation conditions; the water droplets in the steam media not adversely affecting the performance of the machine, which are typically run at speeds of 3200 rpm or less. The rotary expanders/generators are set in both parallel and series arrangement, so that the recovered steam from an expander operating at initial conditions: (150° C.<T<300° C.) and absolute pressures (476 kPa<P (a)<8588 kPa) generated at, or in the hours around, noon solar flux are used to run a set of secondary expanders/generators at a lower energy level, using the wet-steam media recovered from the initial gas-to-steam flash phase.

The fluid nature of the single or two phase seawater (media) properties produced under wide temperature and pressure ranges developed in a PLFC field precludes the application of using conventional turbines which typically are run under high rotation velocities (i.e. >12,000 rpm) high pressures and temperatures and dry saturated steam conditions only. The advantage of rotary expanders over conventional turbines is the ability to operate in two-phase media (gas-liquid); the robust nature of the helical assemblies typically rotating at 4500 rpm being able to withstand the impact of liquid droplets in the steam, which otherwise damages the vanes in the mechanically more-elaborate conventional turbine machine.

Lubrication of the assemblies in an expander plant is achieved by using the fluid media (or non-toxic water-soluble salt solution in concentrations compatible with same fluid media) as the lubricant. As the machined tolerances of Other Items of Note Specific to the Comparable CSP Designs:

PLFC Linear absorber tube: large internal diameter facilitates periodic cleaning of scale deposits inside pipe using a semi-autonomous 'universal-pig' (PIGU).

Alloy: Simple design, using T317 stainless-steel with selective absorber; resultant ratio of absorptance/emissivity is 13:1, which is sufficient in comparable CSP plants. This material is selected only as a starting-point for calculations of tube-wall thickness, based on expected pressures and temperature ranges, during a typical summer day production cycle. Other alloys with higher strength to weight ratio, are preferable, such as various titanium-based materials; where a specific alloy is estimated to be superior to this CSP application, one only need enter the critical input data in to the spread sheet tables drafted by this author, to determine an optimum pipe-wall thickness. Obviously the objective here is to design a linear absorber tube with sufficient corrosion resistance to high-temperature one-or-two phase seawater media and strength to subjected maximum internal pressures at 300° C. of:

(8.6 MPa*1.5 f/s)=12.9 MPa.

The resultant pipe thickness in the model design (T317) is Schedule No. 60, based on our normal operating range of (75°<T<) 200°. We select this wall thickness (10.3 mm+4 mm selective absorber), in anticipation that a superior titanium alloy, though much more expensive, is selected as the absorber tube; net reductions in weight per linear m and associated savings in structural components, make the selection of said superior alloy, a preferred alternative.

Plumbing: No evacuated tubes, bellows or sharp angles in plumbing, other than two (2) 90-degree wide-radius elbows (r>=2D) at entrance to the array set/absorber tube, and two more at the high-temperature media exit from absorber tube assembly to the expanders/power block.

CLFR™: Stationary reflector on N. side of array causes blockage of variable amounts of incident solar flux during summer solar cycles (FIG. 1), at early am/late pm hours.

Alternating mirror directions (FIG. 1) over middle-third of the aperture rack set-width, mechanically more elaborate than the single-direction primaries and isosceles geometry of the PLFC. Tight packing of cells in the remainder of the array causes some issues by mutual shading/blocking of adjacent mirrors at low solar incidence angles.

The vertical and horizontal 'Dewar™' evacuated receiver tube assembly in the Polar CLFR™ linear absorber is an elaborate design, where primary function of seawater distillation, is incompatible in said Polar CLFR™, noting that inevitable scale buildup in this system-plumbing, using seawater working-media is a difficult proposition at best, though not claimed as a desalination innovation by the authors.

Parabolic Trough: The use of a heat exchangers adds another 'loop' into the process, which is better suited to those facilities where virtually all the water used is recycled (good in inland deserts lacking nearby geothermal or seawater sources). On the other hand, the PLFC plant is specifically a 'once-through' process, where as much seawater or brackish media as conditions allow, is gravity-fed with pump-assist to the power-block/MED plant.

In one respect, mirror size (width)/absorber tube diameter ratio in parabolic troughs is an excellent design feature of this CSP technology, resulting in concentration ratios of up to or >100:1 and associated higher temperatures delivered to the plant through oil-water heat exchangers. This is fine for oils of design viscosity in this plan; scale deposits in the plumbing are not an issue here. If in power generation/desalination applying direct solar heating of seawater/brackish water media in the relatively small diameter absorber tubes, would tend to eliminate this CSP method for processing the large quantities of water required (i.e. $10^{\wedge}6$ m^3 distillate daily, in the large-urban planning scenario). Mechanical assemblage of the parabolic primary and flexible plumbing to the linear absorber tube through which the oil media is pumped is of concern; numerous "widget-arms", linkages, and the flexible tubing connectors through which the oil media flows itself, may be weak points in the system, a failure of such may pose some environmental issues.

Cogeneration: Advantages of a PLFC/MED Solar-Thermal Desalination Plant

The PLFC plant produces solar-thermal energy under a-wide range of conditions which make it amenable to a combined solar-thermal-power/MED desalination plant. The supplies concentrated solar energy directly through solar-heated seawater ('media') to a Dry, saturated, or Wet Steam, gas and/or liquid-phase Generating (DWSG) plant in that it accepts seawater media at near-constant temperature (T ambient=30° C.) and by direct solar concentration to a linear absorber tube raises the temperature of the working fluid or saturated steam to a nominal working range of 100° C.<T<350° C., whereupon entering through appropriate conduits and orifices, the rotary expander machine, using a decompression cycle to turn the rotary screws, thereby turning generators for electric power. At such temperatures insufficient to be raised to nominal, i.e. adverse weather conditions, dust storms, early am or late pm hours (50° C.<T<80° C.), or simply, night-time low-temperature media available from either the molten-salt storage tank 'battery', the resistance-coil heated thermal-storage tanks from a nearby PSH plant, or from a nearby low-temperature, geothermal field, said low-temperature water is diverted by appropriate valve(s) and conduits to one or two alternative processes, the Multi-Effect-Distillation (MED) plant, or to a secondary power plant using an Organic Rankine Cycle (ORC). The ORC in itself is an obvious choice for supplemental power produced by a subsidiary expander plant in a low-thermal-energy, closed-loop system. Subject of the preferred working fluid in an ORC plant-design is not addressed here but a number of volatile compounds are applicable: ammonia, cyclopropane, and SO2 being among those with high thermal efficiency and Net-Work-Out properties (J. Nouman). Since the principle objective of cogeneration is to desalinate seawater in conjunction with CSP, the benefits of ORC are not further detailed here, though the flow-sheet overview-plan shown (FIG. 3A) illustrates how such low-end heat sources are integrated into a greater SEP plan.

In the MED systems described (Section 4.215) and (FIG. 4A, FIG. 4B), seawater liquid media, which temperature is raised to a nominal T=72.5° C., is pumped into a copper-tube bundle in the first of twenty stages (effects) each effect containing a similar tube-bundle being sprayed upon by externally-supplied seawater passing through the MED final-stage condenser (i.e. T~15 to 20° C.), causing the seawater initial stage to flash to steam at saturation pressure (psat=34.73 kPa), reduced accordingly by exhaust (vacuum) fans, the heat from the first effect flows through the tube bundle in the second, third, to nth effect, each effect at corresponding lower temperatures and saturation pressures, at depressed boiling-points of media, whereby the distillate recovered as condensate in vapor boxes attached to each effect, flows through separate plumbing until, at the final stage, T=46.5° C., Psat=10.36 kPa, thereby providing a plant function of high-volume, low-energy desalination, even at times when the solar plant is not directly producing electrical power. Typical water purities, Total Dissolved Solids (TDS) resulting from product of an MED plant range thus: 10 ppm<TDS<30 ppm; and parasitic energy losses are as low as 2 kWh/m^3 of final product.

Attributes of several competitive desalination technologies are shown below (WORD-doc-Table 5.12). Of note is the distillate quality in a PLFC/MED plant vs that of a conventional reverse osmosis (RO) design.

Why Select a Med Plant Over RO?

Intuitively, reverse osmosis appears to be a superior method of desalination, given the low power requirements per unit volume distillate produced (WORD-doc.-Table 5.12). There are several concerns with RO, the first being that of the fine filter-mesh required (<50 µm) vs 3 mm for either the MSF or MED plants. A second issue is environmental, and relates to the large quantities of plastics utilized as membranes in the RO process (are these non-toxic and recyclable?). The third is the quality of distillate produced: 30 ppm (or less) for MED vs 200-500 ppm total dissolved solids for RO.

In MED plants the final distillate quality may be of concern because of lack of trace elements in the final product beneficial to both human and agricultural uses. This is alleviated by selectively adding trace amounts of chloride-salts (KCl, MgCl2, CaCl etc.), sulfates, or other compounds as required, in the outflow-stream, to achieve the desired trace-elemental composition in the fresh water outflow-stream.

In RO, a range of TDS (200 ppm<TDS<500 ppm) is of concern principally in the MENA nations, such as Tunisia, which often already have elevated background levels of chloride-salts in the soils. These are in part attributed to water qualities pumped over the centuries from wells, from increasingly depleted aquifers, to practices in ancient times, where, when empires rose and fell, a sometime-used procedure (i.e. Roman Empire vs. Carthage) was for the victors, after sacking the cities, sowed the farmlands of the vanquished with large quantities of salt, rendering the lands useless. By irrigating MENA lands with water qualities produced through RO, it may simply add to the extant problem that various empires started, particularly, in regions where the agricultural lands are in a 'sink' or basin where minimal precipitation at best, further concentrates the salts leached out of the local geologic strata.

In the deserts of California and Mexico, the issues of ground water depletion, and associated elevation of salinities in the aquifers are the same as faced by the MENA nations and desert regions elsewhere. As it is shown in the afore-mentioned nations, the MED process is seen as a preferential desalination option.

In various tropical, even temperate regions, where the land has been leached of critical trace elements, as in a rain forest soil-base of laterites ($SiO_2/Al_2O_3/Fe_2O_3/CO_2$) and not much else, RO is a suitable option, especially in areas where farmers or ranchers (this author included) actively add small quantities of sea-salt (i.e. SEA90™) each season to a natural-based fertilizer (in our case, hydrolyzed fish protein from seafood processing facilities) sprayed by tractor, to improve their lands to the benefit of annual and perennial grass species, and grazing, respectively.

conditions begins at about 100° C. Net electric power to run pumps and exhaust fans in the MED loop are assumed parasitic losses (conservatively) of 2.5 kWh/m^3 distillate produced. If our objective is to produce in one or two SUA, 100,000 m^3 distillate per 10-h solar-cycle day, (where 1 metric ton=roughly 1 m^3 at T ambient=25° C.):

Given: Power consumption (net thermal+parasitic losses)=
14.6 kWh/m^3
Unit-distillate demand/24 h period:
100,000 m^3
Per-capita (pc) daily water consumption, top five nations: 439 l/d (pc)
Population served/10^5 m^3 distillate: 10^5 m^3/0.439 m^3/d pc 227,800 persons
Production-period, MED plant including night-time heat storage: 24 h/d Determine:
Power losses/MED plant: (14.6 kWh/m^3) (100,000 m^3/d)/(1000 kW/MW)/24-h/d=60.9 MW
Therefore, on average: 60.9 MW of power to produce 100,000 m^3 of distillate per SUA during a 24 hour production cycle. For ultimate objective of producing enough fresh water for 1 million people (439,000 m^3/d), 267.4 MW thermal & electric energy are needed.
If equinox avg. power/SUA, Pnet/SUA=32.7 MW, CSP area for PLFC arrays (prior to 20% buffer): To desalinate 100,000 m^3 seawater, area=60.9 MW/32.7 MW=1.86 (say, 1.9) SUA. To desalinate 439,000 m^3/million people: 4.39*1.86=8.17 (say, 8.2 SUA)

For an intermediary SEP of 9 SUAs in area (10.8 km^2 with 20% inter-zones for power and MED plants, lines, and agricultural uses), this represents: 1.9/9, or about 21% of the power share generated by the PLFC assemblies. Expanding

TABLE 5.12

GENERAL COMPARISIONS OF 3 DESALINATION METHODS*

| ITEM | MED | MSF | RO |
|---|---|---|---|
| Process | Multi-Effect-Distillation | Multi-Stage-Flash | Reverse-Osmosis |
| ITEM | MED | MSF | RO |
| Process | Multi-Effect-Distillation | Multi-Stage-Flash | Reverse-Osmosis |
| Application | commercial | commercial | commercial |
| Reliability | very high | very high | good |
| Thermal energy (kWh/m^3) | 12.1 @ 72.5° C. | 60-100 @ 120°C | — |
| Parasitic, pumps (kWh/m^3) | 1.5-2.5 | 3-4 | 3-6 |
| Total thermal/parasitic | 14.6 kWh/m^3 | 63-104 kWh/m^3 | 3-6 kWh/m^3 |
| Raw water quality | not critical | not critical | specific treatment |
| Filter mesh | 3 mm | 3 mm | <50 µm |
| Distillate quality ppm (TDS) | <10 | <10 | 200-500 |
| Max. brine temperature ° C. | 55-73 | 90-120 | 45 |
| Freshwater/seawater rate | 23-33% | 10-25% | 20-50% |
| Plant cost/cap. ($/m^3/d) | 900-1700 | 1500-2000 | 900-1500 |
| Production unit cap. m^3/d | <36000 | <76000 | <20000 |

In the PLFC-driven MED plant, the heat consumption per m^3 of product produced under solar power (Word-doc.-Table 5.12) is mostly 'charged' against the operation of the expanders in the power cycle. The mean power delivered per SUA during a 10-h equinox solar cycle is 32.7 MW; close to the average of corresponding summer-winter solstice values (32.4 MW). The net waste-heat flow in the wet-steam media exiting the power block and injected into the first effect of the MED plant at Tmax=72.5° C. is partially 'free', during the early am/late pm solar cycle, as in our model, the expander plant nominal operating temperature under most to 10^6 inhabitants (439,000 m^3 distillate), an area of 8.2 SUA is dedicated to thermal energy to heat SW media to ~72.5° C. for the MED plant, and to drive the pumps and vacuum fans therein. This represents ~51% of the energy produced in an ultimate SEP of 16 SUAs+200 m avg.-buffer-zones: (19.2 km^2).

5.111 The PLFC Primary and Secondary Elements:
Description of the inventions are summarized here
PLFC PRIMARY ARRAY: Assemblage of the Polar Linear Fresnel Concentrator is described in detail in Section 4 above. In summary, the PLFC is an array of (but not limited to) from 8 to 24 rows of (ultimate number dependent on the selected short-dimension width and required solar concentration ratio) slightly curved, in spherical-cylinder form, rectangular-cut highly reflective glass panes 'mirrors' or 'Cells' set upon an inclined aperture assembly (rack) at site latitude (also referred to as polar-axis plane), facing due south such that the long axis of each cell, and the entire array, is precisely oriented in an east-west direction. Each cell row is set apart from one another as close as possible, based on adverse solar positions at a designated local morning and afternoon solar time during the winter and summer solstices. In the array model described herein (section 4) the critical chosen times are: TS=08:00 h and 16:00 h, respectively, based on a physical limit, that during winter, at a site latitude of about 33° north, the air-mass-factor was over five-times the noon-value of an equatorial site; thence the corresponding solar flux was accordingly weaker. However, during winter, it is important to note that energy recovery begin as early as possible since during winter, there are only about 8 hours of useful energy in a productive solar cycle. The positioning of the PLFC primary cells on said 'aperture-rack' is reduced to the minimum possible offset from one another such that over the course of a year there is no mutual shading/blocking of the sun's rays by adjacent cells. During a solar production cycle, the solar rays are reflected by each of the cells and directed precisely to a linear axis which runs through the center-line of a secondary linear absorber tube through which the seawater (media) is pumped, originating from four (4) possible sources: (1) is pumped directly from the sea (by centrifugal pumps from a nearby coastal plant), and/or, (2) gravity-fed from a PSH facility supplied by (1), (3) gravity-fed directly from sea by tunnels to a below-sea-level CSP, and/or (4) pressure-fed (from a well site(s) in a nearby geothermal production field). In the latter case the geothermal well(s) provide the fluid (media) in the form of saline or 'brackish' water directly to the PLFC, directly to the MED distillation plant, or if natural well-head pressures being sufficiently high, the energy to pump said externally-sourced 'seawater' or 'brackish', media through to the plumbing of the linear absorber tube and rotary-expander. The tracking of the sun's position by each of the cell rows is singular-axis (one-axis); whereby each row of cells on the aperture rack must precisely follow the sun's position by rotating in a southerly to northerly direction, from sunrise to noon zenith, during northern-hemisphere winter; returning in an opposite motion from noon to sunset. Likewise, during N. hemisphere summer, the sun's position must be tracked whereby the cells rotate from a northerly to southerly direction from sunrise to noon zenith; reversing in direction from noon to sunset. Since solar positions change significantly from day to day throughout the year, and over the course of the four-year 'leap-year' cycle (not to mention the effects over extended time due to earth's precession in her orbit), software solutions which accurately track the sun in this S-N, N-S single-axis arrangement, and thence interfaced to the PLFC-mechanical, are beyond the scope of this report.

FLAT MIRRORS: Description of the PLFC primary array assemblies has, thus far been limited to primary cells which are slightly curved for the various reasons described. Another aspect of the invention is to use optically-flat primary cells which final surface figuring is less than one-half standard deviation of error. Such cells reflect incident solar rays precisely to a secondary concentrator which is much smaller in width relative to the primaries, thereby facilitating construction of the secondary concentrator apparatus (towers, receiver tubes, mirrors, support cables, etc.) of much less total mass and cost. A near-perfect design using flat mirrors in the PLFC, eliminates much of the caustic effects inherent of reflected solar rays when the sun's altitude-angles are low.

SECONDARY CONCENTRATOR FIG. 6A: Design of the secondary concentrator is based in part on the convex hyperbolic secondary element in a Cassegrain-telescope optical arrangement (Section 4.122); the difference here being that the secondary reflector in a PLFC is a simple concave hyperbolic cylinder, in order that the reflected rays from the overall-width of the aperture-rack arriving at the secondary at an acceptance angle of 66.4° (at this site) from the symmetrical positions of the primary mirrors be reduced in focal length to such degree that said rays not impinging directly on the linear receiver tube are absorbed by reflectance from the sides and back of the secondary mirror surface. The minimum beam-spread ($\Delta r$) of the reflected solar image (winter-sun diameter=33') at determined primary cell focal length (f=64.2 m), is 0.62 m, which would be the case in a perfect optical system:

$$\Delta r=2(f)\tan(\varepsilon sol/2); \varepsilon sol=0.55° \text{ (use maximum solar diameter)}$$

Then, $\Delta r$=0.62 m in the model, but since the optical surfaces are inherently flawed, Stine and Geyer recommend the width of the optical surface in parabolic-trough systems allow for errors of five standard deviations (n=50) for >85% confidence that the infrared rays will be "captured" by 2ndary mirror (absorber-tube in parabolic systems), thence reflected to and absorbed by the linear absorber tube. Since the subject here is a Fresnel spherical-cylinder system, we are assuming similar errors. Based on the expected one and two dimensional errors in alignment, tracking, optics, etc., we arrive at a total cumulative error of: $\sigma$ total=0.4014°. At 5$\sigma$, the total applied error becomes 2.0072°. This defines the outer width of the secondary mirror (W2): W2=2f(tan(n($\sigma$ tot/2)), from which W2=2.2502 m. At aperture-normal to the receiver tube at TS =12:00 noon (Hn=23.515 m), by proportional reduction the 2ndary cell diameter would be 2.0916 m which fits within the afore-determined 2.2502 m-wide plane at the receiver-tube-assembly aperture.

The optical performance of the PLFC is improved by selecting a smaller width primary mirror: say 1.0 m. We assume here that manufacturing capabilities allow for much higher precision for narrow-width primary cell surfaces (not unreasonable), than for those of the wider dimension. Further data compiled for this text illustrates the corresponding reduction in 2ndary cell width if the total applied error in the PLFC optical system ($\sigma$ tot) is reduced by factor: n=5 to n=2.5; simply that W2 is reduced in half. The effect here is both that the secondary receiver structure is constructed at much less cost in materials; accordingly the shadows cast by the receiver towers and span-elements on the aperture rack are correspondingly lower. Unfortunately, the number of primary cells required to assemble an equivalent effective aperture of 24 m also doubles, with a resultant increase of mechanical linkages and tracking devices; the economic trade-offs are not addressed here.

Additional Elements within the PLFC System
Conventional Connections

Standard length: In the accompanying literature, the standard length of all the conduit-sections described for linear absorber tube assemblies is 20 or, ideally, 40 feet (12.19 m); sections of latter-dimension are easily transported on standard 53'-long flat-bed semi-trailers.

LINEAR ABSORBER TUBE, FLANGED COUPLES: Flanged couplings of various designs are acceptable, as they facilitate tearing apart the linear absorber tube without providing thrust on the linear absorber axis, or rotation torque in order to separate the 40' pipe lengths ("steel") from one another. The flange coupling design shown is a virtually seamless butt-end-connection, with design feature of a high-temperature ring-gasket of WS2, MoS2, or graphite-composite (to prevent leakage of steam under high pressures), and joined together by circular plates (collars) welded precisely to the outer circumference of each pipe-end, through which "n" holes are drilled (according to design pressure rating) enabling appropriate bolts, washers and nuts to be used in securing each of the "steel" members of the linear absorber. An alternative design of utilizing an inert gold-plating (Au m.p.=1064° C.), or equivalent corrosion-resistant malleable material, annealed upon the butt-end-faces of the absorber tubes, in thickness of, but not-limited to, tens-or-hundreds of microns, ensuring a virtually seamless seal of the entire linear absorber under the expected temperature ranges. At time of replacement of one or more pipe-sections, gold plate is simply recycled for same/other use. By this arrangement, pipe-steel is simply disconnected and "dropped" out from the absorber tube assembly/structure by crane, and replaced with a new section, accordingly. The author's preferred design here (FJCX) is described in more detail, in (See FIG. 7). Two other design possibilities are addressed below; the reasons for discarding each are shown.

LINEAR ABSORBER TUBE: THREADED CONNECTIONS: Thick-walled pipes (T>=Sch. No. 60) single-wall design; threaded pipe-end connections allow thermal expansion >5 m/1000 m. Virtually seamless connections eliminate concerns of head loss to friction or resultant issues from bellows or other elaborate fittings which would otherwise add additional 'K'-values, and provide localized uneven surfaces for scale deposits to form. These type of couples present significant challenges when tearing-apart assembly for inspection or replacement, since significant applied uni-axial-direction forces (on the E-W axis) is required to offset the male/female end-components, as is rotational torque applied normally to absorber-tube axis, to displace each pipe-element enough to facilitate screwing/unscrewing each 40-ft section, even when lubrication of threaded joints using graphite, or molybdenum disulfide (MoS2), or like high-temperature/corrosion resistance lubricant is assumed. Threaded connections are not an option studied further in this analysis.

LINEAR ABSORBER TUBE: WELDED ASSEMBLY: Welding the entire linear absorber tube assembly together into a single pipe-length is a seemingly-attractive arrangement that results in a virtually seamless receiver tube along the entire E-W length of the CSP array; since (as is in the case of threaded-couplings above) the thermal expansion of a 1000 m-long (>=5 m), is compensated for, or taken up, through single-axis-slip, ring-type fasteners to each tower (and 2ndary-mechanical) structures located on even centers down the length of the CSP array, and through appropriate thrust-blocks and flexible plumbing arrangements on each end of said array. A problem with this design is, that once installed, the secondary tube cannot be torn apart for replacement in small increments (individual 40' lengths) due to non-linear rates of corrosion along the length of the absorber tube without subjecting the entire array assembly to significant down-time. The principal issue here is differential scale-buildup inside the absorber tube. As the seawater media flows from the inlet of the array (where T-amb=30° C.) through the pipeline towards the power-block-end (72° C.<T<350° C.), with corresponding higher saturation pressures towards the far-end of the line, corrosion rates within the absorber tube accordingly become progressively higher towards the far-end. Furthermore, dismantling and reassembling a linear absorber of welded joints is not practical, given that the secondary mirror assembly, and structural (towers, wires, and other span elements) are interdependent in assembly procedure. In other words, one cannot remove the linear absorber tube from the PLFC 2ndary towers without tearing apart the entire structure. Welded pipe connections are therefore not a preferred design feature of the PLFC linear absorber, 5.2 Synopsis: Applications in Real-World Situations A prime motivation for designing the CSP systems herein, as applied to both generating electric power and desalinating seawater is that of conflict-resolution. For this reason, the author examines two widely-separated regions of the world with similar attributes: physical geography common to both regions, as are the climate zones (Mediterranean to desert) and latitudes (N 30°-N 35°) are nearly equivalent, share major coastlines in proximity to the energy fields (Israel-Jordan: Mediterranean Sea-Gulf of Aqaba; USA-Mexico: Pacific Ocean-Sea of Cortez) along with the fact that both share sizeable basins below sea level, the Dead Sea, and Salton Sea-Laguna Salada, respectively. Accordingly, the renewable energy-based power grids, water-resources, agricultural, industrial infrastructures, and urban-rural demographics in each region share problems and solutions strikingly similar to each other, half a world apart. The maps and illustrations here show the scope, and magnitude such engineering programs have in these two regions; more importantly, similar ideas to these are applicable to scores of nations on earth facing their own challenges in the water and energy sectors.

5.21 MEECAPP Part 1: Middle-East-Economic-Cooperative-Action-Plan-for-Peace 1 (Levant Nations)

FIG. 8A Political Objectives/Resources Plan Scale: 1:1,000,000

Israel/Free Palestinian State (FPS): Final disposition of lands of the two nations on basis of the pre-1967 Six-Day-War boundaries, wherein mutually agreed changes made for security-concerns. Jerusalem is accepted capitol of both parties, where executive, parliamentary and judicial institutions are situated outside the walls of West Jerusalem and East Jerusalem for the Israel and Palestinian (FPS) governments, respectively.

Gaza-Strip: This land remains under authority of the FPS, as an economic link to trade with other Mediterranean Sea countries and beyond.

FPS-Gaza Economic Corridor: An underground railway system comprised of two 8-m-class-diameter, tunnels bored from the NW corner of the Gaza Strip, extending 37 km eastward to the West Bank; terminating near the Palestinian city of Hebron, is an economic link from the major part of the FPS to the Mediterranean Sea. This action effectively enabling the FPS to being a seafaring nation.

FPS/UAR Economic Green-Zone: A "quarter-circle" area of approximately 1200 km^2 of sparsely populated land extending 40 km southwest from the western common Gaza/Egypt boundary to El Arish on the Sinai Mediterranean coast; comprised by rotating of an imaginary curved arc 40 km south and east to a like distance of 40 km along Israel's Negev border with Egypt, is purchased/or leased by a consortium of nations from Egypt for expressed purpose of agriculture- and economic development by Gaza residents, and extant Egyptian communities within said Green Zone. Political status of said "Green-Zone" is local (Egyptian & Gaza residents' localized political-infrastructure in a state-like entity), and demilitarized.

Golan Heights: Final boundaries of Israel-occupied land determined in accordance with Israel/Syria security issues in common, and to Syria's participation in the MEECAPP 1 plan and integration of that nation's power grids and pipelines with those of her neighbors.

FIG. 8B Macro-Energy-Water-Resources Plan Scale: 1:1,000,000

The MEECAPP 1 energy-plan, as described in studies parallel to this one, has an ultimate objective of delivering in excess of 6000 MW installed capacity, by means of utilizing both direct gravity-fed-hydropower (GFH), and pumped-storage hydropower (PSH). This is in addition to concentrated-solar-power (PLFC) plants that, as described in MEECAPP 3, deliver >500 MW power at a typical equinox-solar-day production cycle, per 16-SUA-sized collection field, wherein said plan there are four (4) or more such collection fields of described size in Israel, Jordan, the Free-Palestinian State, and FPS/UAR Economic "Green-Zone" (FIG. 8A & FIG. 8B), and whereby MED desalination plants, in conjunction of said PSH & CSP facilities, supply potable water to meet the needs of >5 million inhabitants in the southern-half of the (Israel-FPS-UAR- and Jordan Economic-Zone), alone.

Gravity-Flow (GFH) Hydropower Plants (FIG. 8B): Using tunnel-boring-machines (TBM), paired 9 m-class-diameter gravity-flow power-tunnels are constructed from Mediterranean Sea to Dead Sea (A el:-400 m) at two sites: (1) North-Tunnels: Tel-Aviv-South, 75 km to north-west shore of Dead Sea; (2) South-Tunnels: Gaza-City, 105 km to Dead Sea (southern basin); and (3) Bypass-Tunnels (D=9 m), 49 km from manifold-connection just above discharge point of South-Tunnels, by static head, delivers seawater continuously to nearest reservoir at −50 m MSL; augmenting PSH system in Arava which ultimately extends, by system of ten reservoirs interconnected by open-channels, ultimately discharging near the Israeli and Jordanian Red Sea ports of Eilat and Aqaba, respectively.

Pumped-Storage (PSH) Hydropower Plants/Power-Canals FIG. 8B: off-peak-demand daily cycles provide power-source to transfer seawater in stages through ten dams and reservoirs, each interconnected by means of open-channel "power-canals", beginning at the Dead-Sea GFH power-plants, and ending at Red Sea; this is necessitated by providing outflow of seawater at sufficient rates to preclude inundation of Dead-Sea coastal villages and industrial-minerals/evaporation pans facilities, by inflow of seawater media from Mediterranean in excess of the region's evaporation rate. Additionally, storage-capacity-dams promote construction of inland marine fisheries (mariculture) facilities suitable to raise on commercial-scale, Mediterranean, Red Sea, and exotic species of fish, mollusks and crustaceans by communities of the FPS, Jordan, and Israel (FIG. 8B).

Lower Jordan-River Dam (FIG. 8B): earthen construction of dike nearly 8 km in length across Jordan River delta on Dead Sea serves as a natural water-treatment filter and wildlife restoration project, to mitigate and reverse effects of polluted waters flowing therein. Additionally, several large areas on east and west sides of lower Jordan River are allocated for division into large ponds suitable to raise native and exotic species of fish suitable to commercial enterprises from both the FPS and Kingdom of Jordan.

5.22 MEECAPP Part 2: Macro-Energy (and)-Economic-Cooperative-Action-Plan-for-Peace 2 (USA-Mexico)

MEECAPP 2: Salton Sea-Laguna Salada Restoration Project Objectives:

Restore the Salton Sea & Laguna Salada waters to salinities acceptable to sea-life using Pacific Ocean water.

Provide Energy using PSH and CSP to Southern California, Arizona, and Baja California, Mexico.

Offset Parasitic Power Losses from PSH and local cogeneration: nuclear, CSP, geothermal, biomass, wind.

Desalinate Seawater using MED (described in MEECAPP 3); potable water for agricultural use/human consumption.

Expand Agriculture base in both US and Mexico by sustainable fresh/saltwater fish farming (MEECAPP 3).

Wildlife Habitat Restoration: avian and aquatic species in affected regions to Pre-Columbus, Native-American-historical-era levels.

Next Generation Nuclear Power cogeneration, molten salt storage; expand desalination/power capabilities.

Improved Economic Base communities of El Centro, CA, Mexicali, Baja California and elsewhere in region.

(FIG. 9) Macro-Energy-Water-Resources/Resources Plan Scale: 1:1,000,000

The MEECAPP 2 energy-plan, like its Middle-East counterpart, is a system providing both electric power by both PSH and CSP, utilizing a PLFC system for the latter, and potable water by MED systems to both Southern California and Baja California, Mexico, by similar tunnel-bored methods, as described in MEECAPP 1, but relying more on integration of key clean power technology of next-generation nuclear power. More importantly, the key benefits of utilizing PSH on the outflow, "once-through" power loops on the eastern slopes of both the USA and Mexico programs is the restoration of entire ecosystems of both the Salton Sea in California, and Laguna Salada in Mexico, as both systems revert from terminal (dead) lakes to open, wildlife-rich natural habitat; thereby eliminating and reversing the effects of concentrating salts in both these inland seas: Seawater pumped into both basins at up to 2× volume of their corresponding annual evaporation rates, and not utilized in the CSP-MED process along the way, is drained into both basins, and ultimately, the Sea of Cortez, utilizing power-tunnels, and/or power-canals, wherein on the "downhill"-(outflow)-side of each energy-stream, electric power in said systems is recovered by utilizing once-through high-head/high-volume Francis-turbines and low-head/high volume Kaplan-turbines, respectively.

Pumped-Storage (PSH) Hydropower Plants/Power-Canals (FIG. 9): The elevation-change from the Pacific Ocean to the Salton Sea and Laguna Salada being only −71 m and −5 m MSL, respectively, does not lend for an economically feasible GFH plan, outright. Instead it is necessary to continually pump, using reversible-reaction-turbines, and large-diameter (10 m) tunnels, quantities of seawater up to twice the annual evaporation rate (typically 1 e.r.=350 m^3/s) about 30 km inland (in several examples) to one or more storage capacity reservoirs, which elevations are typically about 400 m MSL, and which suitable topography is shown at a number of locations on the western-slope of the Pacific Coastal Range of both S. California and Baja California, Mexico. Next-generation-nuclear-power (NGNP), utilizing liquid eutectic-salts as the reactor coolant, is selected as one of few reliable power-sources which produce electric power at continuous-demand, 24/7, as opposed to wind or solar energy systems which output at best is limited by seasonal/daily wind patterns and extended periods of cloudy weather.

Southern California-Salton Sea: Two locations, (1) beginning at Carlsbad,) (FIG. 9: Route 1), and (2) north of the Mexico border at Tijuana (FIG. 9: Route 2) are naturally suited, for PSH design by the ubiquitous "bowl-shaped" features of much of the mountainous terrain and drainage systems, of the Pacific Coastal Range for engineering and constructing large-capacity PSH reservoirs, utilizing earth/rock-filled dams, wherein relatively small quantities of excavated rock and earth are moved in the process. By the example-plan originating near Tijuana or Chula Vista, CA using NGNP power-source of about 2000 MW, seawater is pumped by reversible-turbines, 30 km to 40 km inland from the Pacific Ocean through a paired system of 10 m-diameter tunnel-bore-machines (TBM) s, (in accordance with one study) near-horizontal tunnels, then lifted by a common 14.1 m diameter shaft 400 m in elevation to a pumped-storage-reservoir (PSH) designed to capacity of at least one-day production cycle at full-drawdown rate. Reversible nature of pump-turbines allow seawater to be back-flowed to point of origin, generating about 3000 MW of power on a limited (say 8-h) peak-demand-cycle. On normal operation cycle, seawater stored is gravity-fed eastward towards the Salton Sea, 120 km to the northeast, via a second singular 14.1 m-dia. vertical shaft to a like pair of 10 m-diameter tunnels, where at discharge pool it turns a minimum of four, once-through, Francis reaction turbines; but caveat here being tunnel-discharge elevation at 0 m MSL is on eastern-base of Fish Creek Mountains, still 30 km short of the Salton Sea, which surface elevation is-70 m MSL. From discharge pool past turbine tail races, flow path of seawater enters into an open-channel system, following natural drainage course over the final 30 km distance to the Salton Sea, wherein at even stages dams (~15 m high) constructed for purpose of "power-pools" are utilized for power-generation using high-volume/low-head Kaplan turbines; thence capturing the energy over this final route. Power production on this route when including the below-sea-level aspects to this course exceed 3400 MW during an 8-hour peak demand cycle.

Baja California, Mexico-Laguna Salada (FIG. 9: Route 3) Similar power-tunnel/PSH profiles are found on the Mexico-side just north of Ensenada, with ultimate discharge in Laguna Salada (elev.-5 m MSL). Using (TBMs), paired 10 m-diameter power-tunnels are constructed from Ensenada to the first of two 14.1 m-dia. vertical shafts whereby seawater is pumped continuously by reversible-reaction-turbines at nominal flow rates into a PSH-Reservoir about 30 km inland and 400 m in elevation. Reversible nature of pump-turbines allow seawater to be back flowed to point of origin, generating ~3000 MW power on hours of peak demand. On normal operation cycle, seawater stored is gravity-fed eastward to Laguna Salada, 70 km to the northeast, via a second vertical shaft to a like pair of 10 m-diameter tunnels, whereupon said seawater is discharged into the Laguna Salada at 0 m MSL; turning in the process a minimum of four once-through, Francis reaction-turbines.

Economic Impact: All of the aforementioned PSH systems in the MEECAPP 2 plan lend themselves to transforming the agricultural base in the common Southern California-NW Mexico region. Sustainable inland mariculture and aquaculture fisheries, dedicated CSP plants for both electric power and desalination, and intensive agriculture programs integrated within the CSP infrastructure (FIG. 9) are all positive outcomes of this regional development plan. It follows that economic opportunities expand on both side of the border, as light and heavy industries are situated near the cities of El Centro and Mexicali on the US and Mexico-sides of the border, respectively; likely beginning with those related to agriculture machinery and irrigation systems.

Wildlife Restoration: (1) Restoration of avian migratory paths through both terminal lakes as salinities in Salton Sea and Laguna Salada are restored to levels approximate to the nearby Pacific Ocean; (2) both terminal lakes become open "once-through" flow-systems, thence rejuvenating marine life in both bodies of water, as seawater pumped-into both basins ultimately enters Mexico's Sea of Cortez, and becomes a major restorative process in the recovery of both the estuaries, and deeper marine life ecosystems of the entire Rio Colorado Delta. Net impact on both tourist and fishing industries in both Mexico and the United States cannot be overstated.

Conflict Resolution: Development of a sustainable power and water resources plan-engine as detailed in the MEECAPP-2 (-and proceeding MEECAPP-1 parallel objectives in the Middle-East), serves a greater purpose of creating a region-based economic power-block which beneficiaries are the inhabitants of both S. California, and Baja California, Mexico. A resultant outcome of all of this is an economic plan where immigrants from Central America, Middle-East North-Africa (MENA) nations, and elsewhere are educated in the building-trades and other industrial-arts, and universities, and otherwise assimilated into the North-American cultures on each side of the border as they begin new lives in the Western World after having been uprooted from their respective societies by civil strife and open warfare.

The technologies and plans described herein are achievable using today's technologies. If the United States and other governments are to implement programs such as described, based on urgencies similar to that faced by the US in the 1960's Apollo-Space Program, it is not unreasonable to expect at least half of the civil, and other engineering- and related agriculture, societal and economic-aspects of these projects, to be completed in <20-years. The return on investment of projects of this magnitude (equivalent or greater than that of the Suez Canal and English-Channel tunnel-systems, combined) certainly outweigh that of construction of "A Wall" on the USA-Mexico international boundary, or the continuance of the status quo in the Middle East, with no end in sight to military conflict in that part of the world.

(1) In the intention of, and spirit of these inventions, the afore-described claims include working-fluid (Media), which origins are: Seawater (oceans or seas), Saltwater (terminal lakes), Brackish water, Geothermally-recovered, or Contaminated water containing inorganic salts and/or other water soluble compounds, and suspended solids, are considered interchangeable, and equivalent; therefore are considered pertinent to all aspects of described innovations, and any omission in wording of all such terms in all of said claims is inconsequential.

All geographic and astronomical reference to solar-science-related theory in these inventions, described herein is northern-hemisphere justified. In the intention of, and spirit of these inventions, the aforementioned claims include all such reference to equivalent southern-hemisphere sites, where latitudes and corresponding orientation of devices and structures are in opposite direction from their counterparts north of the equator.

What is claimed is:

1. Thermal energy transfer and storage system comprising:
   a plurality of insulated tanks in proximity to one another, each of the plurality of tanks having a single removable heat exchanger core;
   molten salt media within each of the plurality of tanks, wherein the molten salt media is composed of molten eutectic salts maintained at a single specific operating temperature, said molten salt media being fluidly connected across said plurality of tanks, wherein said system is configured to maintain said molten salt media at said single specific operating temperature across said plurality of tanks;
   saltwater within the removeable heat exchanger cores, wherein the removeable heat exchanger cores transfer heat from the molten salt media to the saltwater;
   a plurality of conduits coupling the removeable heat exchanger cores;
   an intake coupled to the plurality of conduits and configured to selectively allow the saltwater to enter the plurality of conduits from the removeable heat exchanger cores; and
   an outlet coupled to the plurality of conduits and configured to allow the saltwater to leave the plurality of conduits when a temperature of the saltwater meets or exceeds a predefined temperature;
   wherein saltwater is elevated to the predetermined temperature via the transfer of heat from the molten salt to the saltwater, wherein the predetermined temperature for the saltwater at said outlet, wherein said system is configured to control a flow of said saltwater through said plurality of removable heat exchanger cores to said outlet to obtain said predetermined temperature.

2. The system of claim 1, wherein the removable heat exchanger core is tubing composed of one or more of: a metal alloy, a ceramic, and a corrosion-resistant composite.

3. The system of claim 1, wherein the molten salt media comprises one or more of: a binary composition, and a ternary composition.

4. The system of claim 1, wherein the plurality of conduits couples the plurality of tanks to one another in a parallel configuration.

5. The system of claim 4, wherein the plurality of conduits are configured to control the configuration of the plurality of tanks, during operation, between a series configuration, a parallel configuration, or a combination thereof to control the flow of the saltwater through said plurality of removable heat exchanger cores.

6. The system of claim 1, further comprising a second plurality of conduits coupling the plurality of tanks, the second plurality of conduits configured to transfer the molten salt media between tanks of the plurality of tanks.

7. The system of claim 1, further comprising a plurality of valves coupling the plurality of conduits, wherein the plurality of valves are configured to control the flow of the saltwater through the plurality of tanks.

8. The system of claim 1, further comprising a plurality of valves configured to adjust a flow rate of the molten salt media such that heat transfer between the molten salt media and the saltwater is sufficient to elevate the temperature of the saltwater to the predetermined temperature.

9. The system of claim 1, further comprising a storage reservoir coupled to the intake and configured to store the saltwater prior to it entering the intake.

10. The system of claim 1, wherein said outlet is connected to an electric power generator, wherein the electric power generator is configured to produce electric power via one or more of: an organic Rankine cycle (ORC), and a Rankine steam cycle (RSC) process.

11. A thermal energy transfer and storage apparatus comprising:
    a plurality of insulated tanks;
    a molten salt media composed of molten eutectic salts arranged within the plurality of insulated tanks, said system being configured to maintain said molten salt media at a single temperature, said plurality of tanks being configured in fluid connection for the fluid flow of said molten salt media between said series of tanks;
    a plurality of heat exchangers arranged within the plurality of insulated tanks such that each of a single heat exchanger is positioned in each of said insulated tanks, the plurality of heat exchangers coupled to one another to allow for the flow of a seawater between said heat exchangers and configured to transfer heat between the molten salt media and the seawater, wherein said heat exchangers are connected such that wherein said system is configured to regulate the flow of the seawater through said plurality of heat exchangers to obtain a predetermined temperature; and
    wherein said predetermined temperature is selected as one of a desalination temperature such that a first outlet configured to output a steam generated from the seawater, thereby providing desalination of the seawater, or an energy production temperature such that said first outlet is configured to output said steam to an electrical energy generator.

12. The apparatus of claim 11, further comprising a plurality of conduits coupled by a plurality of valves coupling the plurality of heat exchangers, wherein said valves are configured to adjust flow of seawater, during operation, so as to control the flow rate and heat transfer of the seawater.

13. The apparatus of claim 12, wherein the plurality of valves coupling the plurality of conduits is configured to empty one or more of the plurality of tanks on a predetermined schedule for maintenance.

14. The apparatus of claim 13, wherein the plurality of valves is configured to adjust the configuration of the heat exchangers, during operation, to a series configuration, a parallel configuration, or combination thereof.

15. The apparatus of claim 11, further comprising a common centrifugal pump to pump the seawater through the plurality of conduits.

16. The apparatus of claim 11, wherein each tank of the plurality of tanks includes an access cap to allow removal of the corresponding heat exchanger of the plurality of heat exchangers.

17. The apparatus of claim 11, wherein each tank of the plurality of tanks includes a base-plate structure having a heating coil configured to produce heat in response to an electric current, wherein the heat produced is sufficient to maintain the molten salt media at said single temperature, wherein said single temperature is above a melting point of said salt media.

18. The apparatus of claim 11, further comprising a second plurality of conduits coupling the plurality of tanks, the second plurality of conduits configured to transfer the molten salt media between tanks of the plurality of tanks.

19. The apparatus of claim 11, further comprising a thermal barrier structure positioned at a base of each tank of the plurality of tanks.

20. The apparatus of claim 19, wherein the thermal barrier structure comprises a silica (SiO2) sand with embedded conduits for supplemental heat transfer.

* * * * *